US012751210B2

(12) United States Patent
Olsson, III et al.

(10) Patent No.: US 12,751,210 B2
(45) Date of Patent: Sep. 29, 2026

(54) HIGH-Q FACTOR, MULTIFERROIC RESONANT MAGNETIC FIELD SENSORS AND LIMITS ON STRAIN MODULATED SENSING PERFORMANCE

(71) Applicants: The Trustees of the University of Pennsylvania, Philadelphia, PA (US); United States Government as represented by the Secretary of the Navy, Patuxent River, MD (US)

(72) Inventors: Roy H. Olsson, III, Philadelphia, PA (US); Michael J. D'Agati, Philadelphia, PA (US); Yujia Huo, Philadelphia, PA (US); Peter Finkel, Baltimore, MD (US); Konrad Bussmann, Asburn, VA (US); Sydney Sofronici, Philadelphia, PA (US)

(73) Assignees: The Trustees of the University of Pennsylvania, Philadelphia, PA (US); United States Government as represented by the Secretary of the Navy, Patuxent River, MD (US)

( * ) Notice: Subject to any disclaimer, the term of this patent is extended or adjusted under 35 U.S.C. 154(b) by 199 days.

(21) Appl. No.: 18/427,555

(22) Filed: Jan. 30, 2024

(65) Prior Publication Data

US 2024/0431213 A1 Dec. 26, 2024

Related U.S. Application Data

(60) Provisional application No. 63/482,225, filed on Jan. 30, 2023.

(51) Int. Cl.
*H10N 35/00* (2023.01)
*G01R 33/02* (2006.01)
(Continued)

(52) U.S. Cl.
CPC ........... *H10N 35/101* (2023.02); *G01R 33/02* (2013.01); *G01R 33/18* (2013.01); *H10N 35/85* (2023.02)

(58) Field of Classification Search
None
See application file for complete search history.

(56) References Cited

U.S. PATENT DOCUMENTS 8,674,689 B1 * 3/2014 Nielson .............. G01R 33/0286 324/244.1
2023/0057869 A1 * 2/2023 Alcheikh ........... G01R 33/0385

OTHER PUBLICATIONS

Meyer et al., "Thin-film-based SAW Magnetic Field Sensors", Sensors, 2021, vol. 21, No. 24, pp. 8.

(Continued)

*Primary Examiner* — Suman K Nath
(74) *Attorney, Agent, or Firm* — BakerHostetler

(57) ABSTRACT

A magnetic field sensor component, comprising: a piezoelectric portion; a plate portion comprising (i) a drive electrode superposed over the piezoelectric portion and in mechanical communication with the piezoelectric portion, the drive electrode comprising a magnetostrictive material and (ii) a sense electrode superposed over the piezoelectric portion and in mechanical communication with the piezoelectric portion, the sense electrode comprising a magnetostrictive material; and a tether portion extending from the plate portion, and the magnetostrictive drive electrode being configured to be electrically driven so as to effect a strain modulation of the magnetostrictive drive electrode that upconverts a received magnetic field to a resonance band of the magnetostrictive drive electrode. A method, comprising operating a magnetic field sensor component according to the present disclosure.

18 Claims, 55 Drawing Sheets

(51) Int. Cl.
*G01R 33/18* (2006.01)
*H10N 35/85* (2023.01)

(56) References Cited

OTHER PUBLICATIONS

Murzin et al., "Ultrasensitive magnetic field sensors for biomedical applications," Sensors, 2020, vol. 20, No. 6, 1569, pp. 32.
Olsson et al., "A Method for Attenuating the Spurious Responses of Aluminum Nitride Micromechanical Filters," in Journal of Microelectromechanical Systems, vol. 23, No. 5, pp. 1198-1207.
Olsson et al., "Band-tunable and multiplexed integrated circuits for simultaneous recording and stimulation with microelectrode arrays", IEEE Trans Biomed. Eng., 2005, vol. 52, No. 7, pp. 1303-1311.
Olsson et al., "Doping of aluminum nitride and the impact on this film piezoelectric and ferroelectric device performance", in 2020 IEEE Custom integrated circuits conference (CICC), Mar. 2020, pp. 1-6.
Pannetier-Lecoeur et al., "Magnetocardiography with sensors based on giant magnetoresistance," Appl phys lett., Apr. 2011, vol. 98, No. 15, 153705, pp. 3.
Piazza et al., "Single-chip multiple-frequency ALN MEMS filters based on contour-mode piezoelectric resonators," Journal of microelectromechanical systems, 2006, vol. 15, No. 6, pp. 319-328.
Platt et al., "Correlation of coercivity and microstructure of thin CoFe films," Journal of applied physics, 2000, vol. 88, No. 4, pp. 2058-2062.
PNI Corp., Retrieved from https://www.pnicorp.com/rm3100/, Retrieved on Mar. 15, 2024, pp. 12.
Popovic, "High resolution hall magnetic sensors", in the 29th international conference on microelectronics, Belgrade, Serbia, 2014, pp. 69-74.
QuSpin Inc., "Taking extreme field sensing from the lab to the real world.," Retrieved from http://www.quspin.com, Retrieved on Mar. 15, 2024, p. 1.
Razavi et al., "A 622 Mb/s 4.5 pA//spl radic/Hz CMOS transimpedance amplified [for optical receiver front-end]", in 2000 IEEE International Solid-State Circuits conference. Digest of Technical papers (Cat. No. 00CH37056), 2000, pp. 162-163.
Rosenstein et al., "Solid-state nanopores integrated with low-noise preamplifiers for high-bandwidth DNA analysis," 2011 IEEE/NIH life science systems and applications workshop (LiSSA), 2011, pp. 59-62.
Royo et al., "Programmable low-power low-noise capacitance to voltage converter for MEMS accelerometers", Sensors, 2016, vol. 17, pp. 10.
Salzer et al., "Tuning fork for noise suppression in magnetoelectric sensors," Sens. Actuators Phys., Jan. 2016, vol. 237, pp. 91-95.
Schaefer et al., "Magnetic field detection limits for ultraclean graphene hall sensors," Nature Communications, 2020, vol. 11, No. 1, pp. 8.
Segovia-Fernandez et al. "Thermal nonlinearities in contour mode AlN resonators," Journal of Microelectromechanical systems, 2013, vol. 22, No. 4, pp. 976-985.
Seran et al., "An optimized low-frequency three-axis search coil magnetometer for space research", Review of scientific instruments, 2005, vol. 76, Issue 044502, pp. 1-10.
Spetzler et al., "Influence of the piezoelectric material on the signal and noise of magnetoelectric magnetic field sensors based on the delta-E effect," Apl. Mater., Mar. 2021, vol. 9, No. 3, 031108, pp. 8.
Staruch et al., "Reversible strain control of magnetic anisotropy in magnetoelectric heterostructures at room temperature," Sci. Rep., Nov. 21, 2016, vol. 6, 37429, pp. 9.
Sternickel et al., "Biomagnetism using SQUIDs: status and perspectives," Supercond. sci. technol., Feb. 2006, vol. 19, No. 3, pp. S160-S171.
STMicroelectronics, "Low voltage 4 SPDT swtich", 2021, Retrieved from https://www.st.com/resource/en/datasheet/stg719.pdf, pp. 15.
Stubian et al., "Fast low-noise transimpedance amplifier for scanning tunneling microscopy and beyond," Rev. Sci. Instrum., 2020, vol. 917, 74701, pp. 11.
Su et al., "AlScN-based MEMS magnetoelectric sensor," Appl. Phys Lett., 2020, vol. 117, No. 132903, pp. 1-5.
Sun et al., "Low-Frequency Magnetic Field Detection Using Magnetoelectric Sensor With Optimized Metglas Layers by Frequency Modulation," IEEE Sens. J., Mar. 2022, vol. 22, No. 5, pp. 4028-4035.
Tang et al., "Vertical and Lateral Etch Survey of Ferroelectric AlN/Al1—xScxN in Aqueous KOH Solutions," Micromachines, 2022, vol. 13, No. 7, p. 19.
Texas Instruments, "DRV425 Fluxgate Magnetic-Field Sensor", Mar. 2020, pp. 1-41.
Texas Instruments, "LMH32401RGTEVM Evaluation Module", 2019, https://www.ticom/lit/ug/sbou233/sbou233.pdf?ts=1656379326394&ref_url=https%253A%252F%252Fwww.google.com%2.52F.
Texas Instruments, "OPAx320x Precision, 20-MHz, 0.9-pA, Low-Noise, RRIO, CMOSOperational Amplifier WithShutdown", Aug. 2020, Retrieved from https://www.ti.com/lit/ds/symlink/opa320.pdf?ts=1665035538189, pp. 55.
Texas Instruments, "THS413x High-Speed, Low-Noise, Fully-Differential I/O Amplifiers", 2022.
Uchikawa et al., "Measurement of magnetic field produced from the human body," IEEE trans J. Magn Jpn., Aug. 1992, vol. 7, No. 8, pp. 600-607.
Urs et al., "Direct Link between Specific Magnetic Domain Activities and Magnetic Noise in Modulated Magnetoelectric Sensors," Phys Rev Appl., Feb. 2020, vol. 13, No. 2, 024018, pp. 1-10.
Vertesy et al., "High sensitivity magnetic field sensor," Sensors and Actuators, 2000, vol. 85, No. 1-3, pp. 200-208.
Viehlandet al., "Magnetoelectric magnetic field sensors," MRS Bulletin, 2018, vol. 43, No. 11, pp. 834-840.
Villanueva et al., "Crowdsensing smart city parking monitoring", IEEE 2nd World Forum on Internet of Things (WF-IoT). IEEE, 2015, pp. 751-756.
Vrba et al., "SQUID sensor array configurations for magnetoencephalography applications," Supercond. Sci. Technol., Aug. 2002, vol. 15, No. 9, pp. R51-R59.
Wang et al., "Flux concentrator optimization exploiting saturation for micromachined AC magnetic field sensors", 4 pages.
Wang et al., "Low-resistance Ti/Al/Ti/Au multilayer ohmic contact to n-GaN," Journal of applied physics, 2001, vol. 89, No. 11, pp. 6214-6217.
Wang et al., "Multiferroic magnetic sensor based on AlN and A10.7Sc0.3N thin films", Presented at the IEEE International Ultrasonics Symposium, Xi'an, China, 2021, pp. 4.
Wang et al., "Optimized gas pressure of an Rb vapor cell in a single-beam SERF magnetometer," Optics Express, 2022, vol. 30, No. 1, pp. 336-348.
Wang et al., Nanoscale, 2016, vol. 8., No. 14, 7683-7687.
Yang et al., "Detection and analysis of COVID-19 in medical images using deep learning techniques," Scientific Reports, 2021, vol. 11, No. 1, pp. 13.
Yang et al., "Quench protection system of a 1 MW high temperature superconductor DC induction heater," IEEE Trans. Appl. Supercond., Sep. 2019, vol. 29, No. 6, pp. 1-7.
Zabel et al., "Phase modulated magnetoelectric delta-E effect sensor for sub-nano tesla magnetic fields," Appl. phys lett., Oct. 2015, vol. 107, No. 15, 152402, pp. 1-4.
Zaeimbashi et al., "Ultra-compact dual-band smart NEMS magnetoelectric antennas for simultaneous wireless energy harvesting and magnetic field sensing," Nat. Commun., May 2021, vol. 12, No. 1, 3141, pp. 11.
Zhai et al., "Detection of pico-Tesla magnetic fields using magneto-electric sensors at room temperature," Applied physics letters, 2006, vol. 88, No. 6, pp. 4.
Zhang et al., "A low noise readout circuit for integrated electro-chemical biosensor arrays," Sensors, 2004 IEEE, 2004, pp. 36-39.
Zhang et al., "A preliminary study of sensing appliance usage for human activity recognition using mobile magnetometer", ACM Press, 2012, pp. 4.

(56) References Cited

OTHER PUBLICATIONS

Zhaung et al., "Theoretical Intrinsic Equivalent Magnetic Noise Evaluation for Magneto (Elasto) Electric Sensors Using Modulation Techniques", IEEE Sensors Journal, 2014, vol. 14, No. 1, pp. 150-158.
Zhuang et al., "Evaluation of Applied Axial Field Modulation Technique on ME Sensor Input Equivalent Magnetic Noise Rejection", IEEE Sens. J., Oct. 2011, vol. 11, No. 10, pp. 2266-2272.
Akiyama et al., "Influence of growth temperature and scandium concentration on piezoelectric response of scandium aluminum nitride alloy thin films," Appl. Phys. Letters, Oct. 2009, vol. 95, No. 16, 162107, pp. 1-3.
Akiyama et al., "Influence of scandium concentration on power generation figure of merit of scandium aluminum nitride thin films," Appl Phys. letters, Jan. 2013, vol. 102, No. 2, 021915.
Allegro MicroSystems, "The Future of Sensing: XtremeSense™ TMR Technology," Retrieved from https://www.allegromicro.com, Retrieved on Mar. 14, 2024, pp. 9.
Andrews et al., "Implications of Passive Mixer Transparency for Impedance Matching and Noise Figure in Passive Mixer-First Receivers," IEEE Transactions on Circuits and systems I; Regular Papers, 2010, vol. 57, No. 12, pp. 3092-3103.
Auster et al., "The THEMIS Fluxgate Magnetometer," Space science reviews, 2008, vol. 141, No. 29, pp. 235-264.
Bennati et al., "20.5 a sub-pA current amplifier for single-molecule nanosensors," in 2009 IEEE International solid-state circuits conference—digest of technical papers, 2009, pp. 348-349.
Cai et al., "Magnetometer Basics for mobile phone applications," Electron. Prod., 2012, vol. 54, No. 2, pp. 3.
Carla et al., "Development of an ultralow current amplifier for scanning tunneling microscopy," Rev. Sci. Instrum., 2004, vol. 75, pp. 497-501.
Chaves et al., "Low frequency picotesla field detection using hybrid MgO based tunnel sensors," Applied physics letters, 2007, vol. 91, No. 10, pp. 3.
Chen et al., "Quasi-one-dimensional miniature multiferroic magnetic field sensor with high sensitivity at zero bias field," Applied Physics Letters, 2011, vol. 99, No. 4, 042505, pp. 1-3.
Cohen et al., "Magnetomyography: Magnetic fields around the human body produced by skeletal muscles," applied physics letters, 1972, vol. 21, No. 3, pp. 114-116.
Coillot et al., "Improvements on the design of search coil magnetometer for space experiments," Sensor Letters, 2007, vol. 5, No. 1, pp. 4.
Crescentini et al., "Noise Limits of CMOS Current Interfaces for Biosensors: A Review," IEEE Trans Biomed. Circuits Syst., 2014, vol. 8, No. 2, pp. 278-292.
Culuricello et al., "Ultralow current measurements with silicon-on-sapphire integrator circuits," IEEE Electron Device Lett., 2009, vol. 30, No. 3, pp. 258-260.
D'Agati et al., "High-Q Factor, Multiferroic Resonant Magnetic Field Sensors and Limits on Strain Modulated Sensing Performance," J. Microelectromechanical Syst., 2022, vol. 32, Issue 1, pp. 91-102.
Dang et al., "Ultrahigh sensitivity magnetic field and magnetization measurements with an atomic magnetometer," Applied Physics Letters, 2010, vol. 97, No. 15, 151110, pp. 4.
Dey et al., "Biomedical Signals", Acoustic Sensors for Biomedical Applications, 2019, pp. 7-20.
Dong et al. "Characterization of magnetomechanical properties in FeGaB thin films," Applied physics letters, 2018, vol. 113, No. 26, pp. 5.
Dong et al., "Lanthanide Nanoparticles: From Design toward Bioimaging and Therapy", Chemical Reviews, 2015, vol. 115, No. 19, 10725-10815.
Dong et al., "Low-voltage pentacene thin-film transistors with gate insulators and their reversible light-induced threshold voltage shift," Applied Physics Letters, 2005, vol. 86, No. 10, pp. 3.
Durdaut et al., "Fundamental Noise Limits and Sensitivity of Piezoelectrically Driven Magnetoelastic Cantilevers," J. Microelectromechanical syst., Oct. 2020, vol. 29, No. 5, pp. 1347-1361.
Elzenheimer et al., "Investigation of Converse Magnetoelectric Thin-Film Sensors for Magnetocardiography," IEEE Sens. J., Mar. 2023, vol. 23, No. 6, pp. 5660-5669.
Elzenheimer et al., "Magnetic Measurement of Electrically Evoked Muscle Responses With Optically Pumped Magnetometers," IEEE trans neural syst rehabil eng., Mar. 2020, vol. 28, No. 3, pp. 756-765.
Elzenheimer et al., "Magnetoneurograhy of an Electrically Stimulated Arm Nerve: Usability of Magnetoelectric (ME) Sensors for Magnetic Measurements of Peripheral Arm Nerves," Current Directions in Biomedical Engineering., 2018, vol. 4, No. 1, pp. 363-366.
Ferrari et al., "Transimpedance amplifier for high sensitivity current measurements on nanodevices," IEEE J. Solid-State Circuits, 2009, vol. 44, No. 5, pp. 1609-1616.
Finkel., "The Effect of Hf Doping on Piezomagnetic Properties of FeCo for Magnetoelectric Heterostructure Devices", Appl. Phys Lett., 2023, 1 page.
Garcia et al., "Pathway analysis: state of the art," Frontiers in Physiology, opinion, Aug. 10, 2015, vol. 6, pp. 16.
Garten et al., "Enhancing Converse Magnetoelectric Coupling Through Strain Engineering in Artificial Multiferroic Heterostructures," ACS Appl Mater Interfaces, Jun. 8, 2022, vol. 14, No. 22, pp. 25701-25709.
Gillette et al., "Improved sensitivity and noise in magneto-electric magnetic field sensors by use of modulated AC magnetostriction," IEEE Magnetics Letters, 2011, vol. 2, No. 2500104, pp. 1-4.
Goldstein et al., "CMOS Low Current Measurement System for Biomedical Applications," IEEE Trans. Biomed. Circuits Syst., 2012, vol. 6, No. 2, pp. 111-119.
Granata et al., "An ultralow noise current amplifier based on superconducting quantum interference device for high sensitivity applications," Rev Sci Instrum, Jan. 2011, vol. 82, Issue 1, pp. 5.
Harrison et al., "A low-power low-noise CMOS amplifier for neural recording applications," IEEE J. Solid-State Circuits, 2003, vol. 38, No. 6, pp. 958-965.
Hayes et al., "Electrically modulated magnetoelectric sensors," Appl. Phys Lett., May 18, 2016, vol. 108, No. 182902, pp. 1-6.
Heidari et al., "CMOS magnetic sensors for wearable magnetomyography", presented at the International Conference of the IEEE engineering in Medicine and Biology Society (EMBC), Honolulu, HI, USA, 2018, pp. 1-4.
Hui et al., "High Resolution Magnetometer Based on a High Frequency Magnetoelectric MEMS-CMOS Oscillator," Journal of Microelectromechanical systems, 2014, vol. 24, No. 1, pp. 134-143.
Huo et al., "Low Noise, Strain Modulated, Multiferroic Magnetic Field sensor systems", IEEE Sens. J., 2023, vol. 23, No. 13, pp. 14025-14040.
Iivanaines et al., "A general method for computing thermal magnetic noise arising from thin conducting objects," J. Appl. phys., Jul. 2021, vol. 130, No. 4, 043901, pp. 10.
Instruments, "450-MHz, Programmable Gain, differential output transimpedance amplifier", LMH32401 Datasheet, ed., 2019, pp. 1-40.
Karnaushenko et al., "High-Performance Magnetic Sensorics for Printable and Flexible Electronics," Advanced materials, 2015, vol. 27, No. 5, pp. 880-885.
Khan et al., "Magnetic sensors—A review and recent technologies," Engineering Research Express, 2021, vol. 3, No. 2, pp. 22.
Kim et al., "A Super-Lyophobic 3-D PDMS Channel as a Novel Microfluidic Platform to Manipulate Oxidized Galinstan," Journal of Microelectromechanical systems, 2013, vol. 22, No. 6, pp. 1267-1275.
Ieder et al., "Our apologizes for the delay in reporting, attached for your records . . . Biomed Tech (Berl)", May 2002, vol. 47, No. 5, 117-123.
Lee et al., "Calculation of magnetic field noise from high-permeability magnetic shields and conducting objects with simple geometry," J. Appl. Phys., Apr. 2008, vol. 103, No. 8, 084904, pp. 10.

(56) References Cited

OTHER PUBLICATIONS

Lenz et al., "Magnetic sensors and their applications," IEEE Sensors, 2006, vol. 6, No. 3, pp. 631-649.
Li et al., "Oxidation induced stress in SiO2/SiC structures", Applied physics letters, 2017, vol. 110, No. 141604, pp. 1-5.
Li et al., "SERF Atomic Magnetometer—Recent Advances and Applications: A Review," IEEE Sensors Journal, 2018, vol. 18, No. 20, pp. 8198-8207.
Mackert et al., "Magnetometry of injury currents from human nerve and muscle specimens using Superconducting Quantum Interferences Devices," Neuroscience Letters, 1999, vol. 262, No. 3, pp. 163-166.
Magnetic Shield Corp., "MuMetal Fully Annealed foil," Retrieved from www.magnetic-shield.com, Retrieved on Mar. 15, 2024, pp. 5.
Magnetic Shield Corp., "MuMetal Zero Gauss Chambers", Retrieved from https://www.magnetic-shield.com/mumetal-zero-gauss-chambers/, Retrieved on Mar. 15, 2024, pp. 6.
Melzer et al., "Wearable magnetic field sensors for flexible electronics," Advanced materials, 2015, vol. 27, No. 7, pp. 1274-1280.
Zhuang et al., "Our apologizes for the delay in reporting, attached for your records", Mater. Res. Soc. Symp. proc., Jan. 2012, vol. 1398, 11 pages.
Zuo et al., "Miniaturized Magnetic Sensors for Implantable Magnetomyography", Ad. Mater Technol., May 2020, vol. 5, pp. 1-15.

* cited by examiner

HIGH-Q FACTOR, MULTIFERROIC RESONANT MAGNETIC FIELD SENSORS AND LIMITS ON STRAIN MODULATED SENSING PERFORMANCE

CROSS-REFERENCE TO RELATED APPLICATIONS

The present application claims priority to and the benefit of U.S. patent application No. 63/482,225, "High-Q Factor, Multiferroic Resonant Magnetic Field Sensors And Limits On Strain Modulated Sensing Performance" (filed Jan. 30, 2023). All foregoing applications are incorporated herein by reference in their entireties for any and all purposes.

GOVERNMENT RIGHTS

This invention was made with government support under HR0011-20-C-0098 awarded by the Defense Advanced Research Projects Agency. The government has certain rights in the invention.

TECHNICAL FIELD

The present disclosure relates to the field of magnetic field sensors.

BACKGROUND

Magnetic fields produced by the body can provide information for medical diagnoses, patient monitoring, and robotic control. Measuring biomagnetic signals locally allows for an external sensing mechanism that is non-invasive and non-contact. Despite these advantages, current sensing systems are either prohibitively large, consume excessive power, or both when applied to on-body applications. Accordingly, there is a long-felt need for improved magnetic field sensor devices.

SUMMARY

Magnetic fields produced by the body can provide information for medical diagnoses, patient monitoring, and robotic control. Measuring biomagnetic signals locally allows for an external sensing mechanism that is non-invasive and non-contact. Despite these advantages, current sensing systems are either prohibitively large, consume excessive power, or both when applied to on-body applications. This study explores how multiferroic systems can provide an alternative to current biomagnetic sensing platforms. While maintaining a very small die size (2.25 $mm^2$) and low power consumption (13 mW), multiferroic resonant MEMS magnetometers can provide high sensitivity and low noise at room temperature. Two resonant plate designs operating in the MHz regime are explored, implementing a strain modulation technique to upconvert low frequency magnetic field signals to the resonance band of the plates, utilizing the high device Q factors. When operated below the Duffing limit, sensitivities of 58.4 mA/T and 37.7 mA/T with resolutions of 5.03 nT/√Hz and 2.72 nT/√Hz, respectively, were observed for the two devices. Without electric modulation, the large sensor design shows a sensitivity of 1.56 A/T and a resolution of 2 pT/√Hz when sensing an AC magnetic field at the device resonance.

Provided is a magnetic field sensor component, comprising: a piezoelectric portion; a plate portion comprising (i) a drive electrode superposed over the piezoelectric portion and in mechanical communication with the piezoelectric portion, the drive electrode comprising a magnetostrictive material and (ii) a sense electrode superposed over the piezoelectric portion and in mechanical communication with the piezoelectric portion, the sense electrode comprising a magnetostrictive material; and a tether portion extending from the plate portion, and the magnetostrictive drive electrode being configured to be electrically driven so as to effect a strain modulation of the magnetostrictive drive electrode that upconverts a received magnetic field to a resonance band of the magnetostrictive drive electrode.

Also provided is a method, comprising operating a magnetic field sensor component according to the present disclosure, e.g., according to any one of Aspects 1-11.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document. In the drawings.

DETAILED DESCRIPTION OF ILLUSTRATIVE EMBODIMENTS

Figure 1:
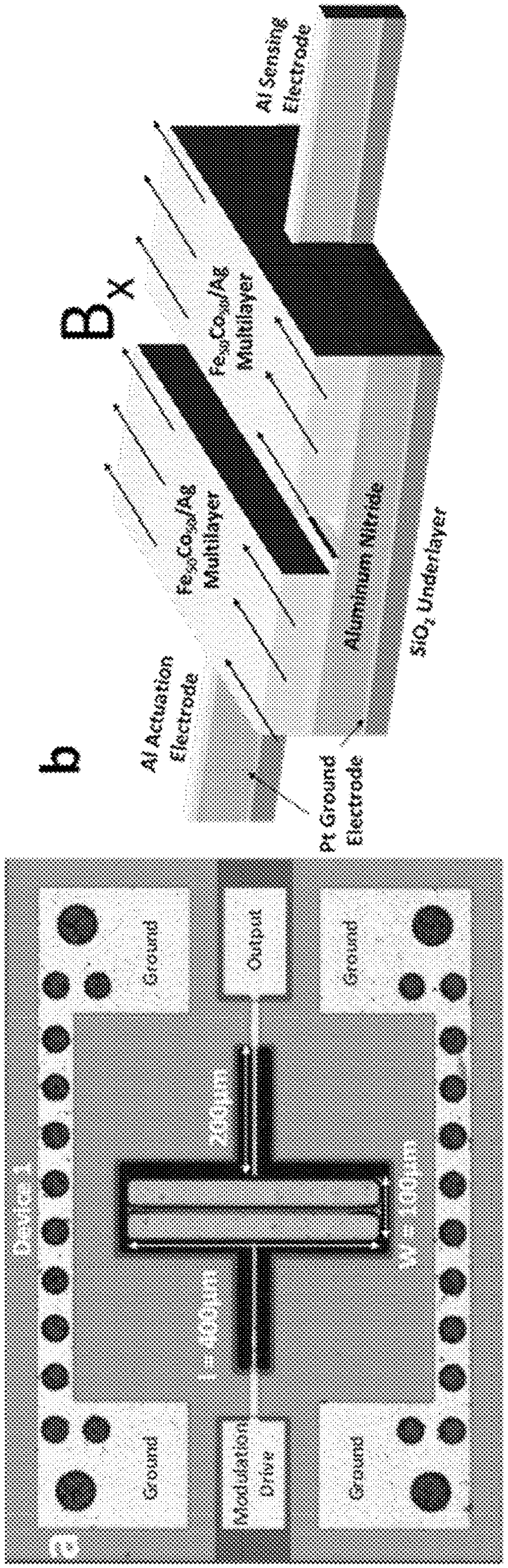
FIG. 1A: Top-down optical microscope view of the 8 MHz Device 1 magnetometer design.
FIG. 1B: A 3D schematic with external Bx field direction indicated.

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms “a,” “an,” and “the” include plural referents unless the context clearly dictates otherwise.

As used in the specification and in the claims, the term “comprising” can include the embodiments “consisting of” and “consisting essentially of” The terms “comprise(s),” “include(s),” “having,” “has,” “can,” “contain(s),” and variants thereof, as used herein, are intended to be open-ended transitional phrases, terms, or words that require the presence of the named ingredients/steps and permit the presence of other ingredients/steps. However, such description should be construed as also describing compositions or processes as “consisting of” and “consisting essentially of” the enumerated ingredients/steps, which allows the presence of only the named ingredients/steps, along with any impurities that might result therefrom, and excludes other ingredients/steps.

As used herein, the terms “about” and “at or about” mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is “about” or “approximate” whether or not expressly stated to be such. It is understood that where “about” is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently of the endpoints. The endpoints of the ranges and any values disclosed herein are not limited to the precise range or value; they are sufficiently imprecise to include values approximating these ranges and/or values.

As used herein, approximating language can be applied to modify any quantitative representation that can vary without resulting in a change in the basic function to which it is related. Accordingly, a value modified by a term or terms, such as “about” and “substantially,” may not be limited to the precise value specified, in some cases. In at least some instances, the approximating language can correspond to the precision of an instrument for measuring the value. The modifier “about” should also be considered as disclosing the range defined by the absolute values of the two endpoints. For example, the expression “from about 2 to about 4” also discloses the range “from 2 to 4.” The term “about” can refer to plus or minus 10% of the indicated number. For example, “about 10%” can indicate a range of 9% to 11%, and “about 1” can mean from 0.9-1.1. Other meanings of “about” can be apparent from the context, such as rounding off, so, for example “about 1” can also mean from 0.5 to 1.4. Further, the term “comprising” should be understood as having its open-ended meaning of “including,” but the term also includes the closed meaning of the term “consisting.” For example, a composition that comprises components A and B can be a composition that includes A, B, and other components, but can also be a composition made of A and B only. Any documents cited herein are incorporated by reference in their entireties for any and all purposes.

Exemplary Disclosure—A

Magnetic field sensors are important in many areas of technology including consumer electronics [1-3], space based systems [4, 5], and biomedical applications [6, 7]. In particular, biomedical applications have challenging restrictions in terms of resolution, size, and power consumption. In the body, magnetic fields are generated wherever electric currents are present [8, 9]. Most notably, the heart, skeletal muscles, brain, and nerves all produce magnetic fields. These fields can vary in amplitude and frequency from low femto-Tesla higher frequency signals for nerves to hundreds of pico-Tesla for the low frequency cardiac signals [10, 11]. Table 1 summarizes the frequency and amplitude ranges of the primary biomagnetic signals at typical epicutaneous distances. Different magnetic sensing techniques such as magnetocardiography, magnetoneurography, magnetoencephalography, and magnetomyography are based upon the detection of these small magnetic fields from different regions of the body. Improving the capability to detect magnetic fields produced by the human body can benefit the medical industry in a variety of ways. For example, magnetomyography of skeletal muscles can provide information on injured muscle fibers and nerves [12, 13] without the need for invasive techniques.

TABLE I

Magnetic fields produced by the body with associated amplitudes and frequency ranges at relative distances.

| Body Part | Distance | Frequency Range | Amplitude |
|---|---|---|---|
| Heart | 7 cm | 0.01-50 Hz | ~640 pT |
| Brain | 3 cm | 1-100 Hz | ~1 pT |
| Muscle | 1.5 cm | 10-100 Hz | ~0.8 pT |
| Nerves | 1.4 cm | 90-1000 Hz | ~0.02 pT |

A major difficulty in detecting biomagnetic signals is obtaining a sensor with large sensitivity and low noise over a large (~1 kHz) bandwidth. Hall sensors [14-16] are easily fabricated magnetic sensors where overall size, power consumption, and cost are low. Unfortunately, Hall sensors have yet to demonstrate the low noise values required for reliable biomagnetic sensing, with noise values around 100 nT/<Hz.

Superconducting quantum interference devices (SQUID) have extremely low noise performance in the low fT/√Hz range [17-19]. However, these sensors require cryogenic cooling refrigerators resulting in high power consumption, large form factors, and high cost.

Spin exchange relaxation free (SERF) [20-22] atomic magnetometers have more recently shown resolutions as low as 0.16 fT/√Hz [23] without the need for cryogenic cooling. However, to achieve these ultra-low noise performances, SERF magnetometers still require pumped lasers with high power consumption and large (~5 $cm^3$) volume vapor cubes. Additionally, the bandwidth of operation is small and does not cover the full frequency range of magnetic signals produced by the body.

Other approaches, including magnetoresistance, fluxgate, and optically pumped magnetometers have been explored for medical applications, but face similar drawbacks due to size and power consumption [24-28].

Multiferroic materials provide a unique magnetic sensing solution for biomedical applications. Theory predicts, and prior studies demonstrate [29-31], that MEMS multiferroic sensors operating at mechanical resonance have the potential to provide high sensitivity and low noise simultaneously, within a very small footprint and requiring very low power to operate. Also, previous studies of multiferroic sensors demonstrate a modulation technique [32-34], where the low frequency biomagnetic fields are mixed into the mechanical resonance band of the device, yielding an enhancement proportional to the Q factor, which can be over 1000. If these high-Q factor resonances are in the MHz regime, then bandwidths compatible with biomagnetic sensing can also be achieved.

This article describes the design considerations and tradeoffs between two multiferroic MEMS plate resonator magnetic sensors. The microfabrication process is described, and the Q factor, sensitivity, and noise value of both components are characterized and compared to finite element simulations. In addition, a discussion of how Duffing nonlinearity limits the achievable sensitivity and noise floor of modulated multiferroic sensors is provided.

Device Structure and Microfabrication

A multiferroic magnetometer, such as that shown in FIG. 1, primarily consists of a magnetostrictive and piezoelectric material [35-40].

Strain is generated in the magnetostrictive material due to an applied external magnetic field as described by (1) and (2), where ε is the strain, F is the force applied, and k is the spring constant of the device. Also, $d_{33_m}$ is the piezomagnetic coefficient of the magnetostrictive material that describes the change in strain per change in magnetic field, $B_x$ is the input magnetic flux density, $\mu_0$ is the permeability of free space, $k_m$ is the magnetostrictive spring constant, and Q is the mechanical quality factor that enhances the signal at resonance.

$$\varepsilon = Q \times \frac{F}{k} \tag{1}$$

$$F = d_{33_m} * \frac{B_x}{\mu_0} * k_m \tag{2}$$

The magnetostrictive spring constant is a function of the magnetostrictive layer thickness ($t_m$), width (w), Young's modulus ($E_m$), and length (l), as described in (3).

$$k_m = \frac{t_m * w * E_m}{l} \tag{3}$$

Since the magnetostrictive and piezoelectric films can be modeled of as two parallel springs, k can be written as (4), with the piezoelectric spring constant ($k_p$) described in (5), where $t_p$ is the thickness of the piezoelectric film and $E_p$ is the piezoelectric Young's modulus.

$$k = k_m + k_p \tag{4}$$

$$k_p = \frac{t_p * w * E_p}{l} \tag{5}$$

Therefore, the strain produced by the external magnetic field is given by (6), where the $k_{eq}$ term describes the reductions in the device strain from magnetic field due to the increase in stiffness from attachment to the piezoelectric layer and can be found using (7).

$$\varepsilon = d_{33_m} * \frac{B_x}{\mu_0} * k_{eq} * Q \tag{6}$$

$$k_{eq} = \frac{k_m}{k_m + k_p} = \frac{t_m E_m}{t_m E_m + t_p E_p} \tag{7}$$

The strain from the magnetostrictive material, generated due to an applied external magnetic field, is transferred to a mechanically coupled piezoelectric material, resulting in charge generation given by (8), where q/A is the charge density, a is the stress in the piezoelectric film, and $d_{31_p}$ is the transverse piezoelectric coefficient of the piezoelectric material.

$$\frac{q}{A} = \sigma * d_{31_p} = \varepsilon * E_p * d_{31_p} \tag{8}$$

Adjusting for the area of the electrodes, the total charge that can be collected is given by (9), where q is the charge and A is the output electrode area. The short circuit current sensitivity is then given as the time derivative of the charge per applied magnetic field density, as shown in (10), where $i_{sense}$ is the peak output current and $f_0$ is the resonance frequency.

$$q = \varepsilon * E_p * d_{31_p} * A \tag{9}$$

$$\frac{i_{sense}}{B_x} = 2\pi f_0 * d_{33_m} * \frac{1}{\mu_0} * k_{eq} * Q * E_p * d_{31_p} * A \tag{10}$$

The open-circuit voltage sensitivity can also be found, where the voltage drops across the load capacitor formed by the parallel plates of the top and bottom electrodes. The open-circuit voltage sensitivity is given by (11), where V is the open-circuit voltage, C is the device self-capacitance, and $\epsilon_p$ is the piezoelectric relative permittivity, and $\epsilon_0$ is the permittivity of free space.

$$\frac{V}{B_x} = \frac{q}{C} * \frac{1}{B_x} = \frac{t_p * q}{\epsilon_p \epsilon_0 * A} * \frac{1}{B_x} = d_{33_m} * \frac{1}{\mu_0} * k_{eq} * Q * E_p * d_{31_p} * t_p * \frac{1}{\epsilon_p \epsilon_0} \tag{11}$$

The preceding equations neglect effects of the non-active layers such as the metal electrodes which will be considered using finite element modeling (FEM).

While a simply designed MEMS multiferroic magnetic sensor could operate directly at the low frequencies required by biomagnetic fields, the large Q factors inherent in MEMS parts (which can be over 1000) causes the sensing bandwidth to be very small, resulting in a large portion of the biomagnetic information to be missed. Instead, as shown in FIG. 1, drive and sense electrodes are used to employ a modulation technique where the low frequency magnetic field signals are mixed up to the high frequency resonance band, making use of the large enhancement of the Q factor over a sensing bandwidth large enough to collect the full spectrum of biomagnetic data. The modulation technique works by varying the piezomagnetic coefficient ($d_{33m}$) of the magnetostrictive material. Assuming the variation of the piezomagnetic coefficient is purely sinusoidal, the change in the coefficient can be described in (12), where $d_{33m\_Max}$ is the maximum $d_{33m}$ value, $d_{33m\_Min}$ is the minimum $d_{33m}$ value, $f_{mod}$ is the frequency at which $d_{33m}$ is varying, and $\Delta d_{33m}$ is the change in magnitude of the $d_{33m}$ coefficient.

$$d_{33_m} = \left(d_{33_{m\_Max}} - d_{33_{m\_Min}}\right) * \cos(2\pi f_{mod} t) = \Delta d_{33_m} * \cos(2\pi f_{mod} t) \quad (12)$$

To make the $d_{33m}$ coefficient time varying, a modulation voltage is applied to the piezoelectric film at the device's mechanical resonance frequency. This modulation signal causes a time varying stress to be applied to the magnetostrictive layer, resulting in a change in the $d_{33m}$. Simultaneously, the external sinusoidal magnetic field still interacts with the magnetostrictive material as described before. The strain imparted into the film is then the product of two sinusoidal signals and is updated in (13) to include the modulation, where $f_{sig}$ is the frequency of the external applied magnetic field to be sensed.

$$\varepsilon = \frac{1}{2} * \Delta d_{33_m} * \frac{B_x}{\mu_0} * k_{eq} * Q * [\cos(2\pi(f_{mod} - f_{sig})t) + \cos(2\pi(f_{mod} + f_{sig})t)] \quad (13)$$

Figure 2:
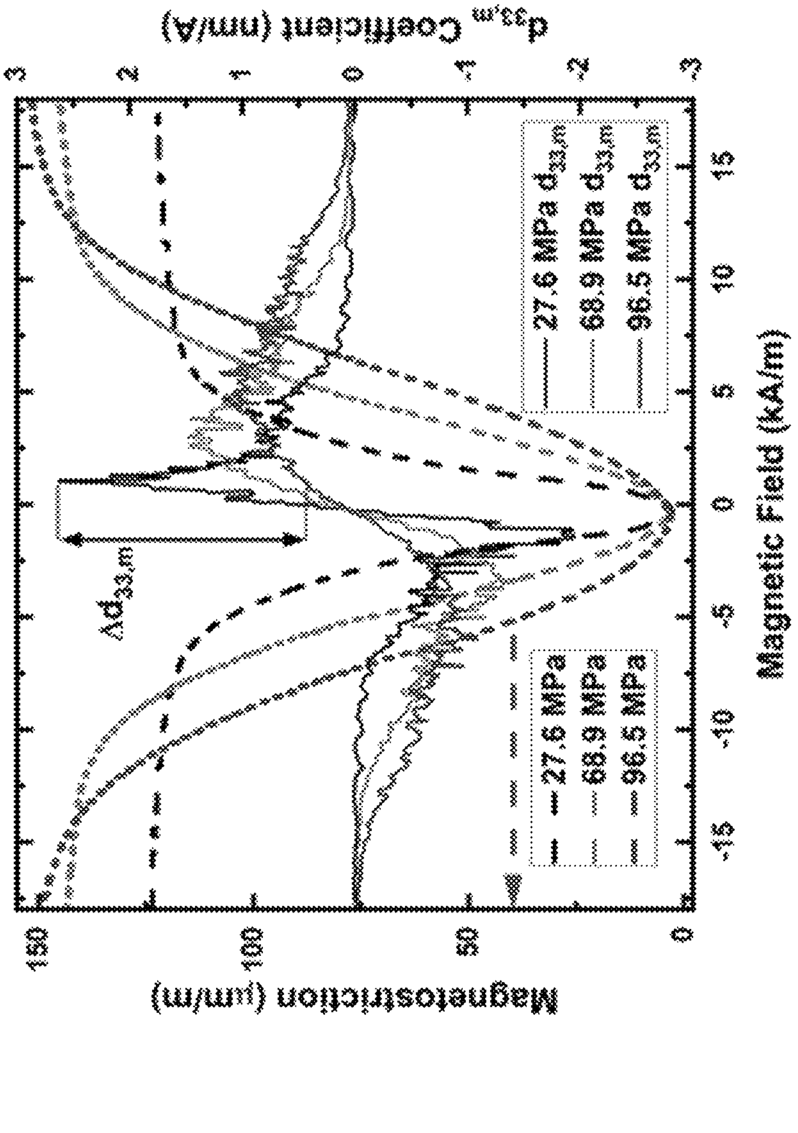
FIG. 2: Change in maximum piezomagnetic coefficient in bulk $Fe_{50}Co_{50}$ due to changes in the applied compressive stress.

The stress induced change of magnetostrictive properties for bulk $Fe_{50}Co_{50}$ grown by Etrema is depicted in FIG. 2 and illustrates the functional characteristics the sensors exploit as a detection mechanism. The key for this method to realize high sensitivity as presented earlier in (10) is to maximize the change in the piezomagnetic coefficient ($\Delta d_{33m}$) induced by the modulation, where $\Delta d_{33m}$ replaces $d_{33m}$ in (10). The resulting modulated output current is given by (14) and the resulting modulated output voltage is given by (15).

$$I_{out} = \pi f_0 * \Delta d_{33_m} * \frac{B_x}{\mu_0} * k_{eq} * Q * E_p * d_{31_p} * A[\cos(2\pi(f_{mod} - f_{sig})) + \cos(2\pi(f_{mod} + f_{sig}))] \quad (14)$$

$$V_{out} = \frac{1}{2} * \Delta d_{33_m} * \frac{B_x}{\mu_0} * k_{eq} * Q * E_p * d_{31_p} * t_p * \frac{1}{\epsilon_p \epsilon_0}[\cos(2\pi(f_{mod} - f_{sig})) + \cos(2\pi(f_{mod} + f_{sig}))] \quad (15)$$

Two extensional mode plate resonator designs [41] at different resonant frequencies were explored. Compared to Device 1 depicted in FIG. 1, Device 2 has a plate length and width of 200 μm and 50 μm, respectively, and a tether length of 100 μm. For both devices, the film stack was kept constant and is provided in FIG. 3. In piezoelectric films, the maximum charge is generated at the point of maximum stress. Therefore, for the geometry shown in FIG. 1, maximum stress should be designed to be placed at the center of the plate where the tether anchors are present.

Figure 3:
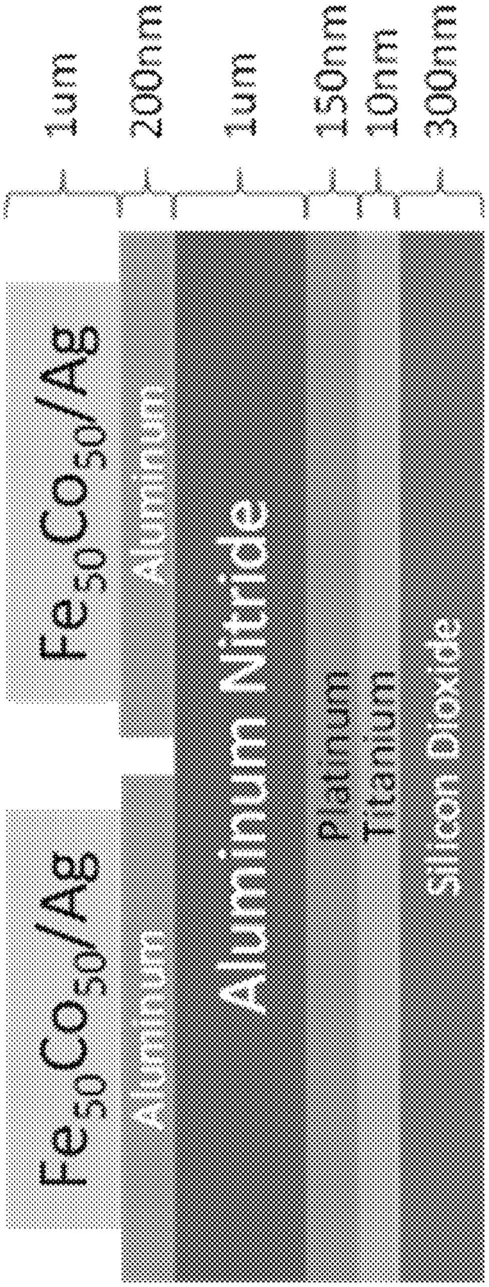
FIG. 3: Multiferroic magnetic sensor film stack.

To do so, the device length should be half wavelength for the desired frequency. The target frequencies were 8 MHz for Device 1 and 16 MHz for Device 2 to ensure sufficient bandwidth to cover the biomagnetic frequency range. Using (16) the wave velocity from the film stack in FIG. 3 is calculated [42], where $t_x$ refers to the thickness of each film as labeled, Ex refers to the Young's modulus of each film as labeled, and $\rho_x$ refers to the density of each film as labeled. The wave velocity is then used to find the length (17) of the plate necessary to produce the frequencies desired above. The width was then chosen to keep a length-to-width aspect ratio of 4:1 to keep the device in a length extensional mode at resonance. The tethers on either side were chosen to be quarter wavelength to maximize the quality factor.

$$v = \sqrt{\frac{E_{eq}}{\rho_{eq}}} = \sqrt{\frac{\Sigma(t_i * E_i)}{\Sigma(t_i * \rho_i)}} \quad (16)$$

$$l_{plate} = \frac{\lambda}{2} = \frac{v}{2 * f_0} \quad (17)$$

Modal analysis simulations were performed using COMSOL finite element modeling (FEM) with the material parameters provided in Table 2 where ρ is the density, E is the Young's Modulus, $\varepsilon_r$ is the relative permittivity, $\mu_r$ is the relative permeability, and v is the poisson ratio.

TABLE II

Material parameters used in COMSOL simulations and theoretical calculations.

| | AlN | $Fe_{50}Co_{50}$/Ag | $SiO_2$ | Pt | Al |
|---|---|---|---|---|---|
| $d_{31p}$ | 1.9 pm/V | — | — | — | — |
| $d_{33m}$ | — | 12 mm/A | — | — | — |
| ρ | 3300 (kg/m$^3$) | 8290 (kg/m$^3$) | 2200 (kg/m$^3$) | 21450 (kg/m$^3$) | 2700 (kg/m$^3$) |
| E | 344 (GPa) | 189 (GPa) | 70 (GPa) | 168 (GPa) | 70 (GPa) |
| $\varepsilon_r$ | 9 | 1 | 1 | 1 | 1 |
| $\mu_r$ | 1 | 300 | 1 | 1 | 1 |
| v | 0.2 | 0.29 | 0.17 | 0.38 | 0.35 |

Figure 4:
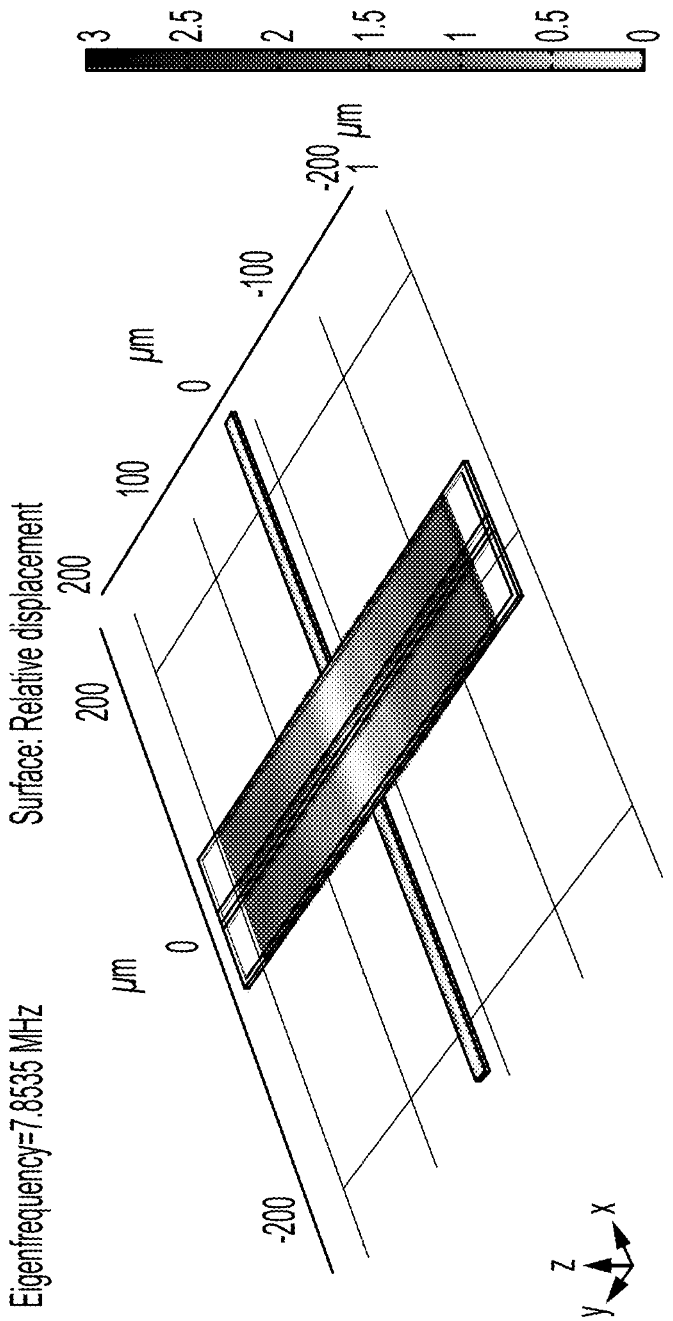
FIG. 4: Device 1 extensional mode shape showing a resonance frequency of 7.85 MHz.
Figure 5:
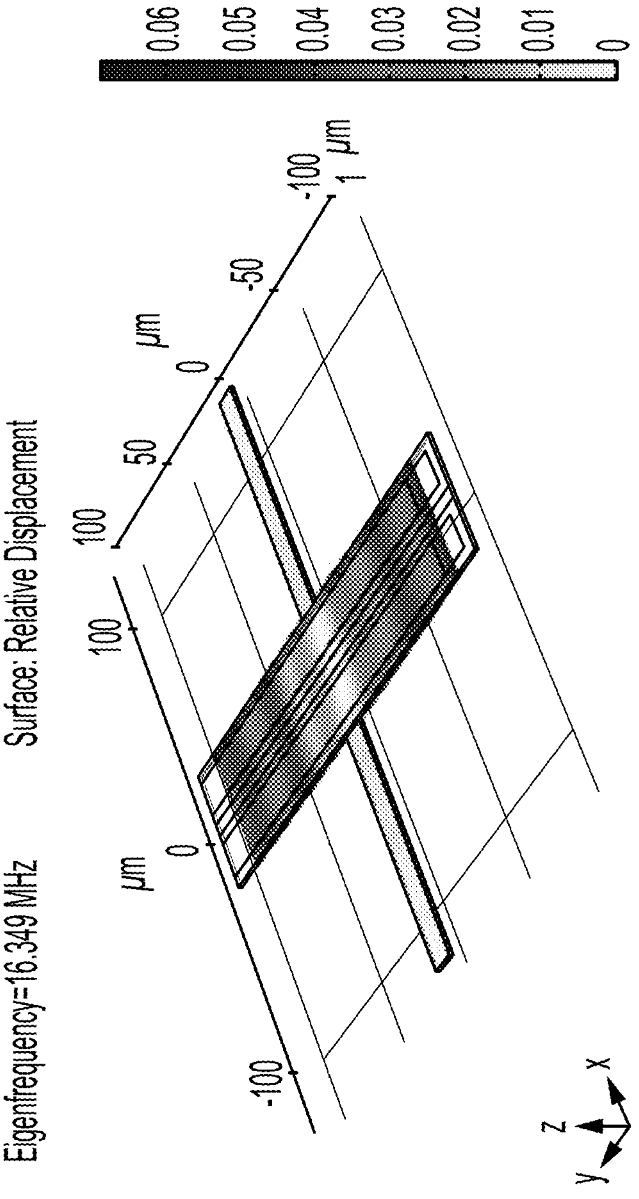
FIG. 5: Device 2 extensional mode shape showing a resonance frequency of 16.349 MHz.
Figure 6:
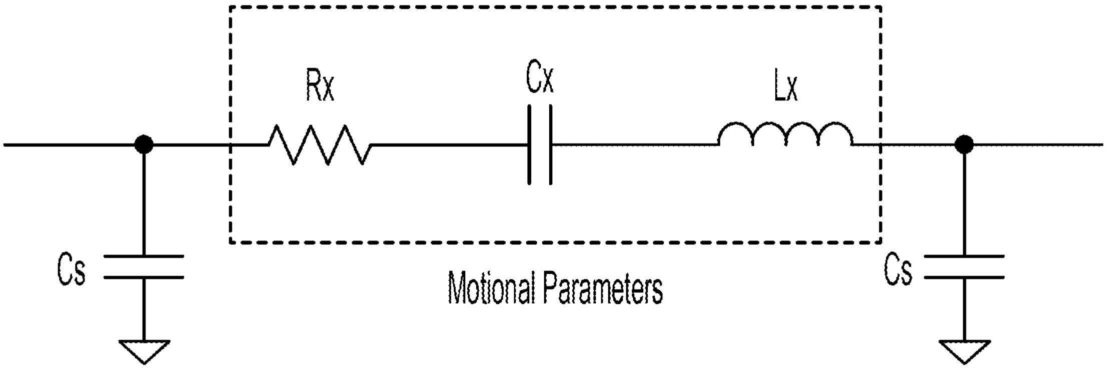
FIG. 6: Equivalent circuit model of both devices with motional parameters indicated.

The extensional mode shape and resonant frequency for Device 1 and Device 2 are provided in FIG. 4 and FIG. 5, respectively. The devices can be modeled using an equivalent circuit model shown in FIG. 6. The model values can be obtained through a frequency sweep in COMSOL finite element analysis simulations. Plotting $S_{21}$ with a 50Ω source and load impedance, the motional impedance ($R_x$) of the devices can be calculated from the insertion loss on resonance using (18), where $R_s$ is the source impedance, $R_l$ is the load impedance, and $S_{21}$ is the insertion loss on resonance.

$$R_x = (R_s + R_l) * \left(10^{\frac{S21}{-20}} - 1\right) \quad (18)$$

The motional capacitance ($C_x$) and inductance ($L_x$) for each device can be calculated using (19) and (20) respectively.

$$C_x = \frac{1}{2 * \pi * f_0 * R_x * Q} \quad (19)$$

$$L_x = \frac{Q * R_x}{2 * \pi * f_0} \quad (20)$$

These values are summarized in Table 3 along with the shunt capacitance ($C_s$), resonant frequency ($f_0$), length (l), and width (w). The feedthrough capacitor between the electrodes was excluded since it is always much smaller than that of the shunt capacitors.

TABLE III

Summary of device dimensions and modeling parameters.

| | Device 1 | Device 2 |
|---|---|---|
| Length | 400 μm | 200 μm |
| Width | 100 μm | 50 μm |
| | 7.85 MHz | 16.34 MHz |
| | 2616 Ω | 5235 Ω |
| | 6.41 fF | 1.51 fF |
| Lx | 64.03 mH | 63.10 mH |
| | 1.590 pF | 0.398 pF |

Figure 7:
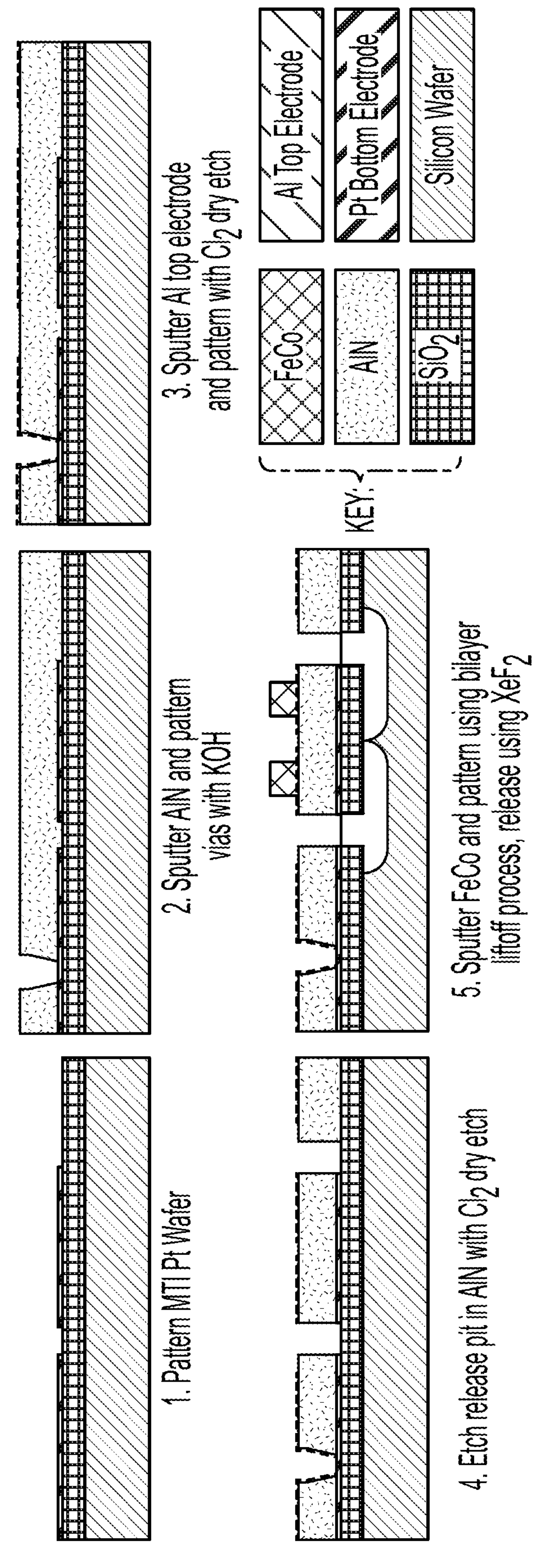
FIG. 7: 5-layer fabrication process used to create the multiferroic magnetometers.

The multiferroic magnetic sensors are fabricated using a 5-mask process. Substrates are obtained from MTI corporation with 300 nm $SiO_2$, a 10 nm Ti adhesion layer, and 150 nm of (111) oriented Pt deposited on (100) low resistivity P-type 4" wafers. Orientation of the Pt film ensures the subsequent AlN deposition will orient properly in the c-axis, leading to better $d_{31}$ coefficients. The received wafers are patterned with the first photomask and wet etched in Aqua Regia to form the bottom electrode ground plane and provide a release window for the last step of the process. Next, 1 μm of AlN is sputtered as the piezoelectric layer. Using the second photomask, vias are etched into the AlN by wet 30% KOH etching at room temperature. A SiNx hard mask is used during the etch to prevent pinholes and is removed afterwards using reactive ion etching (RIE) with $CF_4$. 200 nm of Al is then sputtered on top of the AlN, filling the vias. The previous KOH wet etch leaves a sloped sidewall profile that allows the Al to make connection from the bottom Pt to the top plane of the AlN. The Al is then patterned with the third photomask layer to define the top electrodes (both ground and signal) using $Cl_2/BCl_3$ dry etching. Next, $Cl_2/BCl_3$ dry etching was used with the fourth photomask and a SiNx hard mask to etch down to the Si wafer layer to define the device sidewall and the areas where the $XeF_2$ release etch will access the Si to undercut the device. The fifth photomask was then used to pattern a bilayer liftoff resist. A 1 μm thick $Fe_{50}Co_{50}$/Ag multilayer stack consisting of alternating layers of ~2 nm Ag and ~8 nm $Fe_{50}Co_{50}$ was then deposited and lifted off for use as the magnetostrictive layer. The purpose of the multilayered magnetic structure is to achieve better control of the magnetic properties. The expectation is that the stack will lead to softer magnetic properties and easy in-plane anisotropy, as a consequence of improving the magnetoelastic coupling. In particular, adding an alternating non-magnetic layer such as silver keeps the polycrystalline grain size formed in the FeCo layer small, leading to lower coercive fields and increased saturation magnetostriction, as has been demonstrated in previous studies. [43-46] As shown in (6), (10) and (11), larger strains, output current, and output voltage can be realized with a high $d_{33m}*k_{eq}$ product in response to magnetic field. Since $k_{eq}$ is related to the thickness and Young's modulus of the magnetostrictive film, ideally a thick magnetostrictive film with both a high piezomagnetic coefficient and Young's modulus will yield large strains and sensor output signals. With the material properties provided in Table II, the $d_{33m}*k_{eq}$ product for the $Fe_{50}Co_{50}$/Ag multilayer is comparable to that of other thin film magnetostrictive materials [47] while also providing robust properties over different deposition and processing conditions. Finally, the devices are laser diced to a 1.5×1.5 mm die and released using $XeF_2$. The full fabrication process is captured in FIG. 7.

Electrical Characterization

Figure 8:
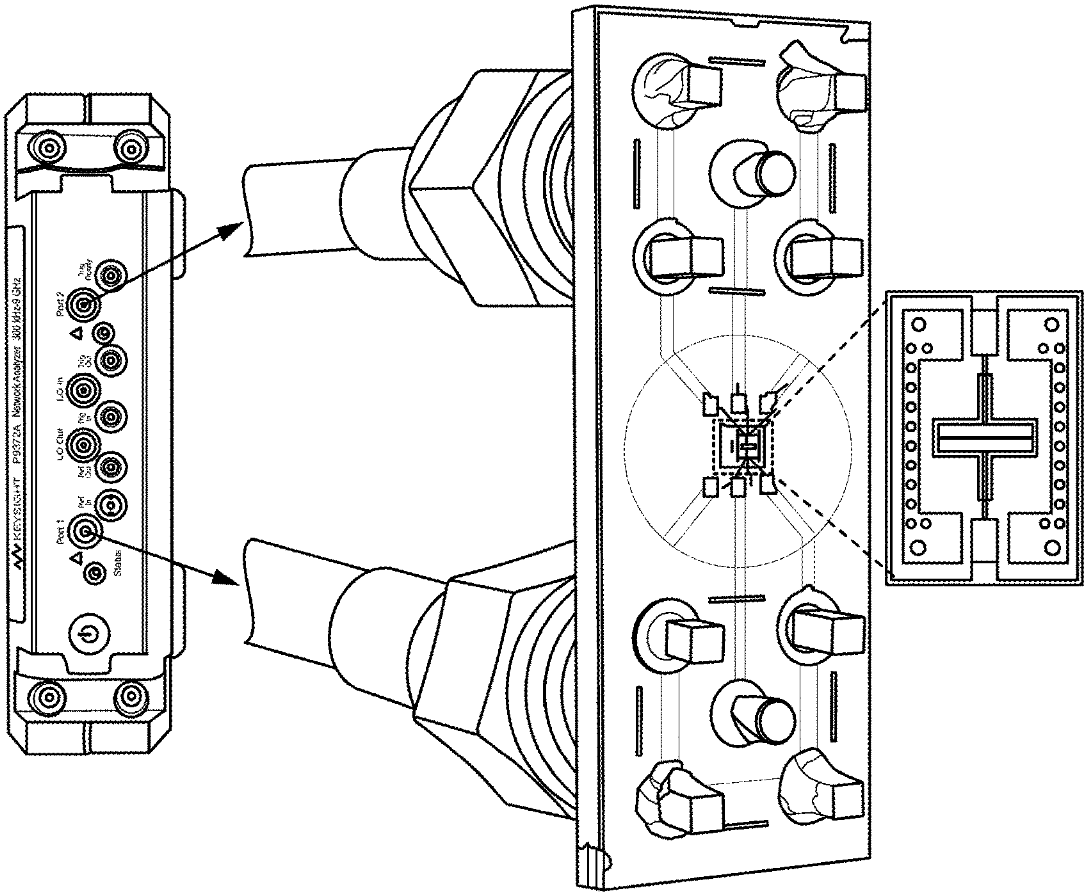
FIG. 8: Optical image showing the electrical characterization test setup, including SMA connections.
Figure 9:
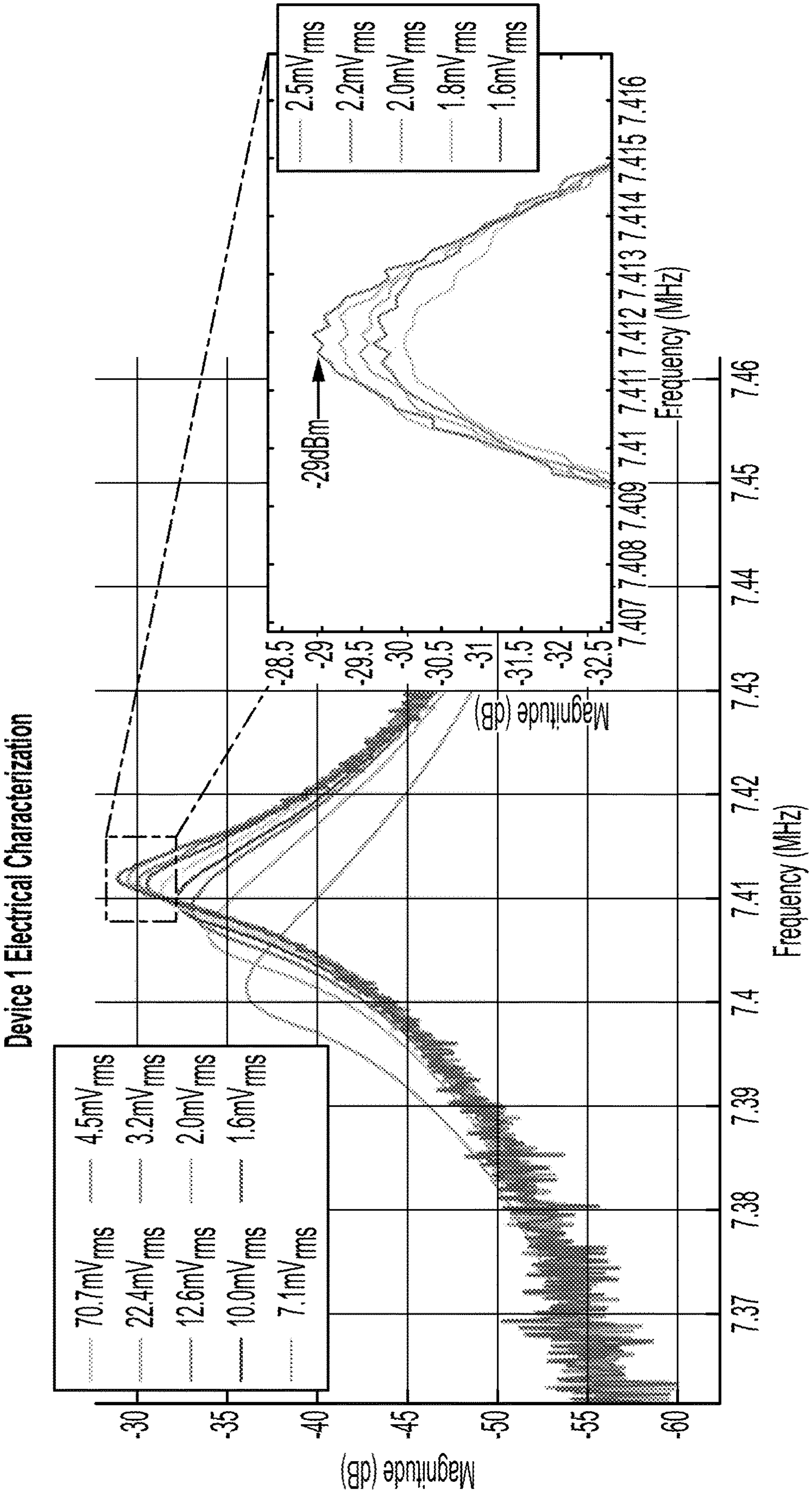
FIG. 9: Device 1 $S_{21}$ response. Duffing nonlinearity can be seen as input power is increased. The inset shows a more detailed view of the response near resonance.
Figure 10:
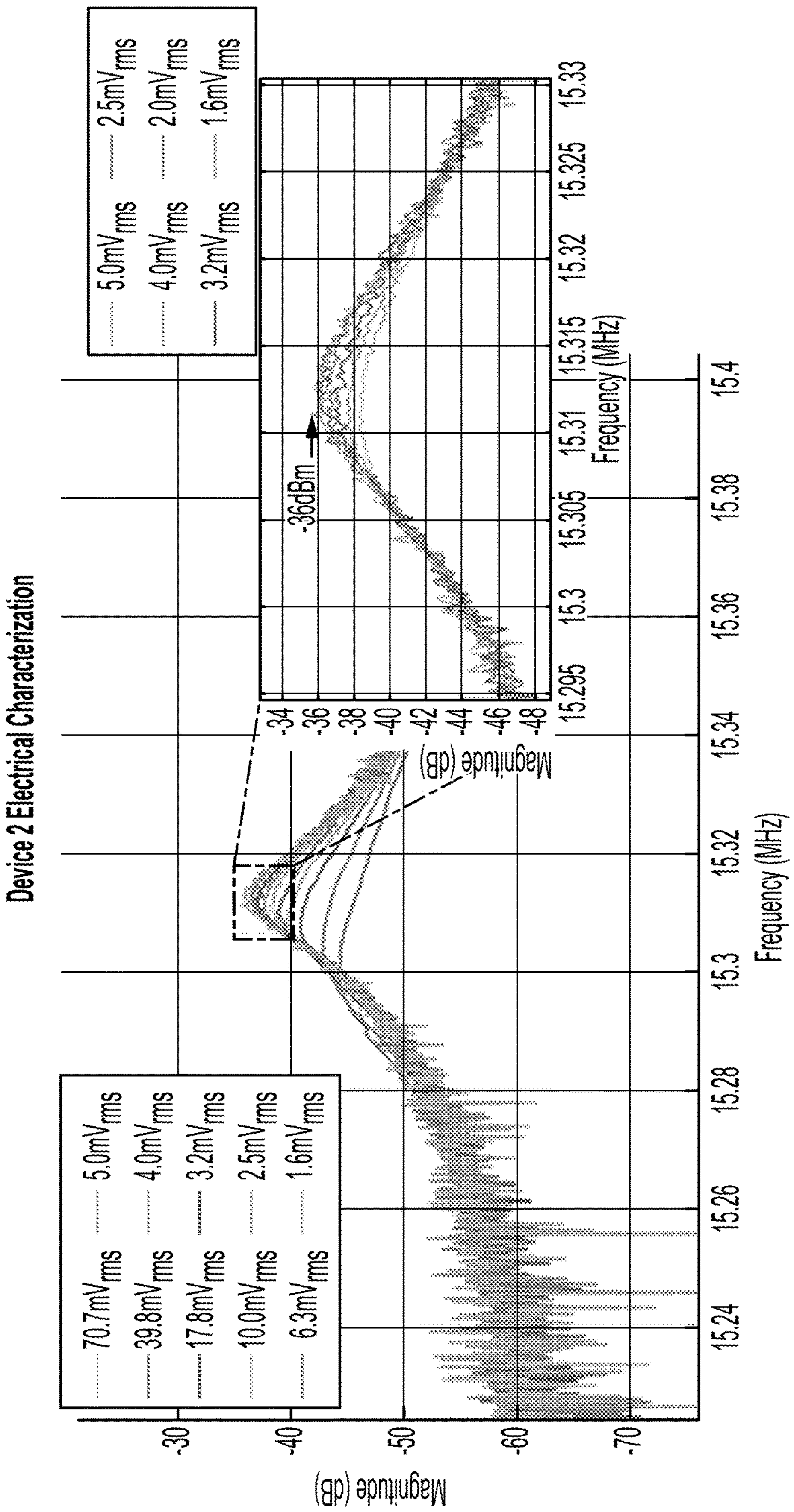
FIG. 10: Device 2 $S_{21}$ response. Duffing nonlinearity can again be seen as the input power is increased. The inset shows a more detailed view of the response on resonance.

Once devices were fabricated, the individual dies were adhered to a custom printed circuit board with the device ports accessible via SMA connectors as shown in FIG. 8. Initial electrical characterization was performed using a Keysight P9372A vector network analyzer (VNA). FIG. 9 and FIG. 10 show the $S_{21}$ response of the two devices, where motional impedance, resonant frequency, and Q factor are determined. Compared to the modal analysis previously mentioned in COMSOL, the resonance frequencies are slightly lower. This can be attributed to small fabrication misalignments, etching inconsistencies, and properties of the films. Device 1 had a Q factor of 1330 and Device 2 had a Q factor of 1230, both measured in ambient conditions.

This matches the theoretical predictions, since the smaller design would be expected to have a larger motional impedance due to its 4 times smaller area. Also, because of this reason, the insertion loss of Device 2 is higher, with an $S_{21}$ peak at −36 dBm, compared to that of Device 1 at −29 dBm. Additionally, as the power is increased in the experiment, the introduction of a Duffing nonlinearity is observed. This phenomenon is discussed in further detail in later sections as it relates to the optimal sensor sensitivity and signal-to-noise ratio.

Magnetic Bias Experiments

Figure 11:
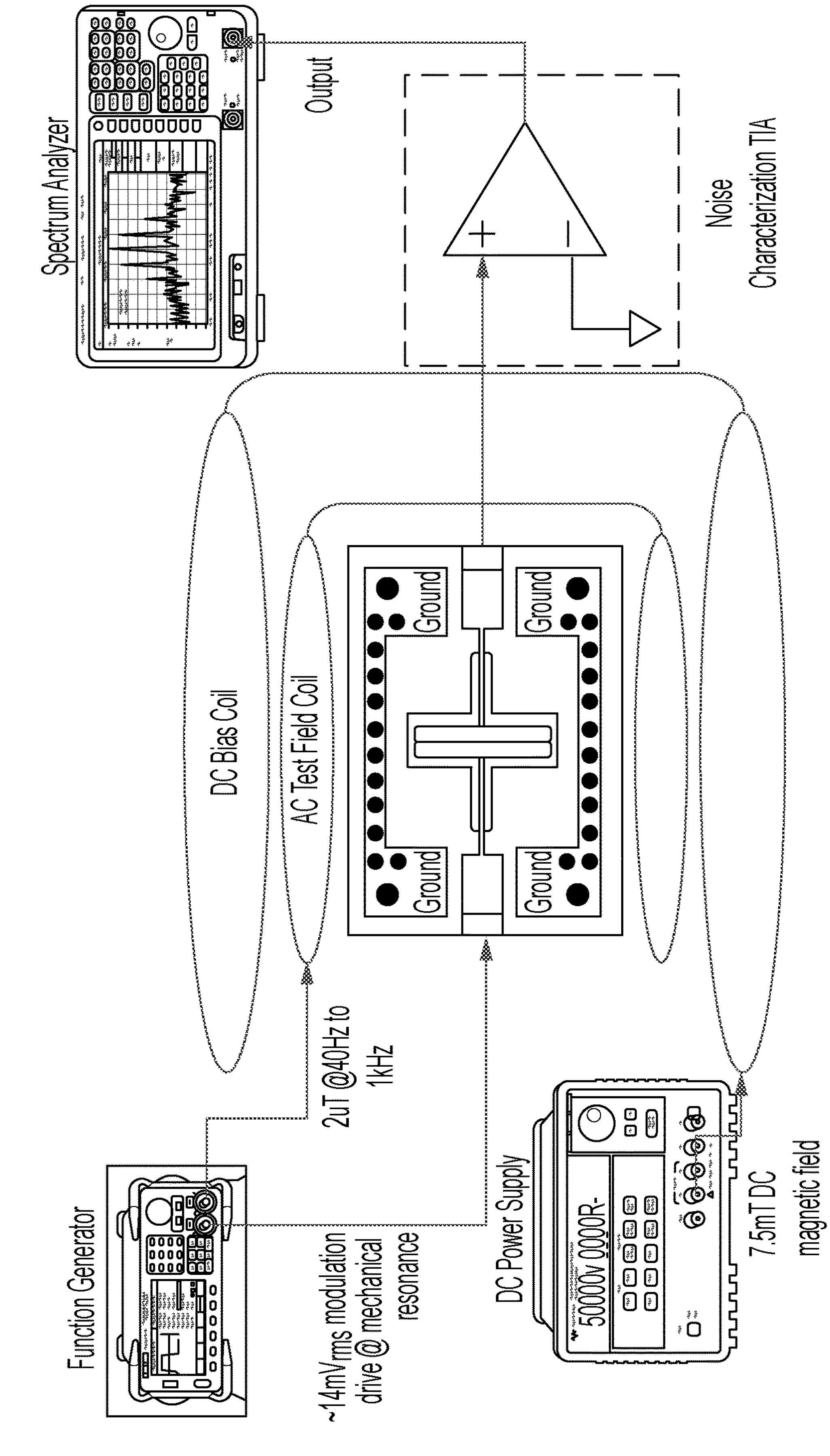
FIG. 11: Testing setup used for bias and noise experiments.
Figure 12:
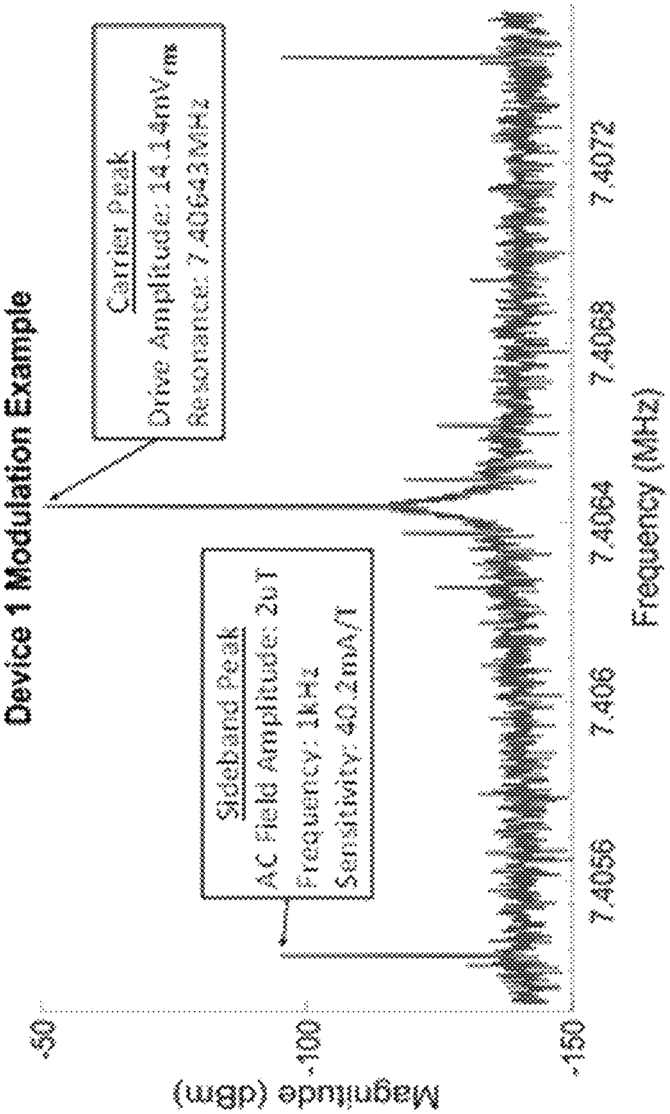
FIG. 12: Example of a typical modulated output seen during bias field and noise experiments. A carrier peak at resonance and two sideband peaks above and below the carrier are seen.
Figure 13:
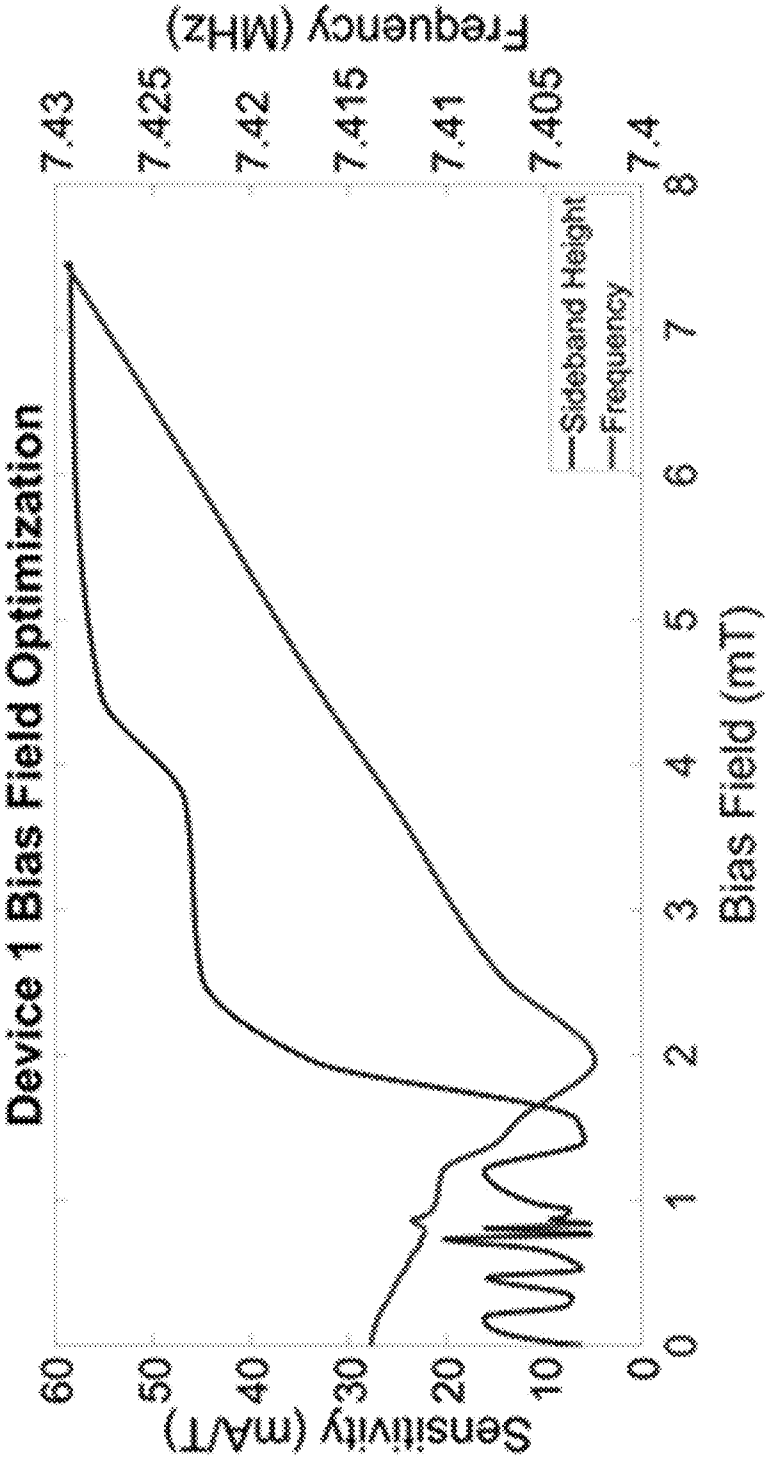
FIG. 13: Summary of Device 1 sensitivity and frequency change with increasing bias field.
Figure 14:
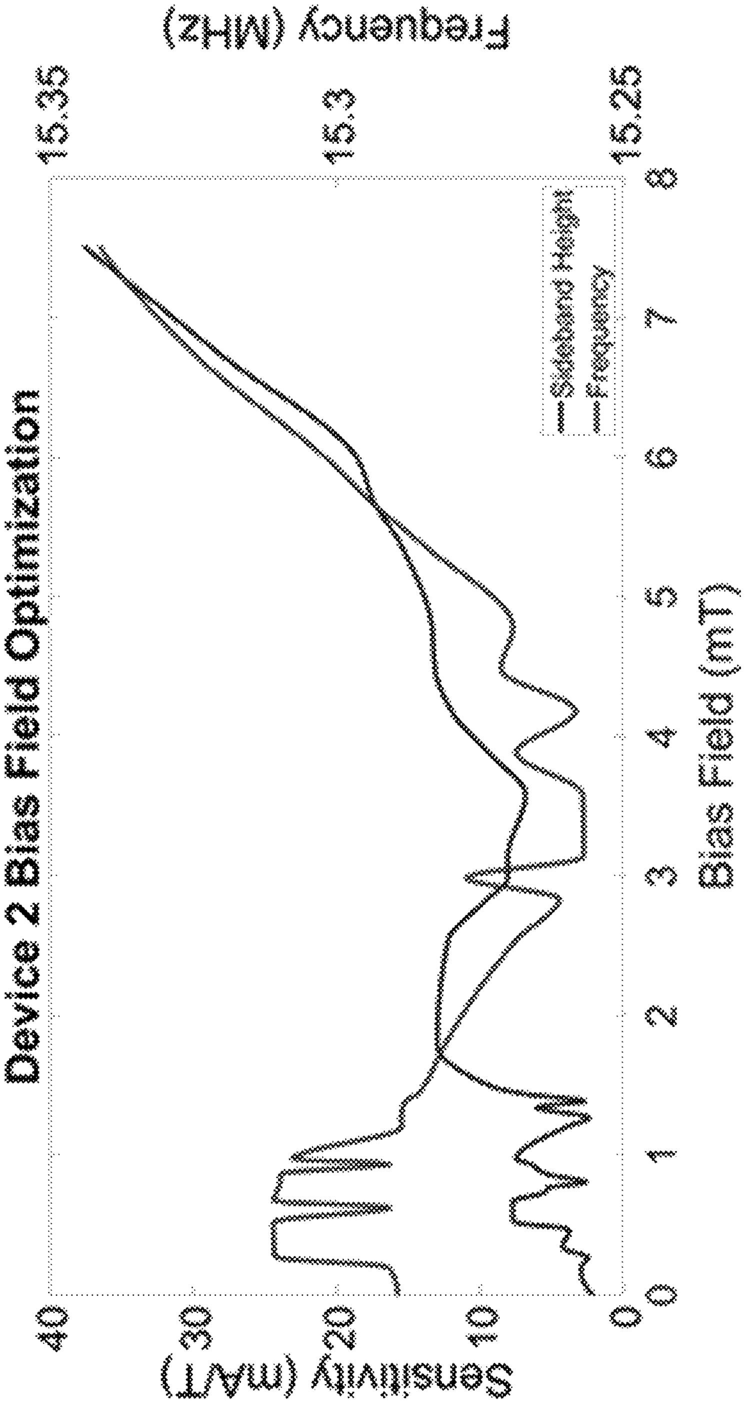
FIG. 14: Summary of Device 2 sensitivity and frequency change with increasing bias field.

Next, experiments were performed to find the optimal bias field for the magnetostrictive material. FIG. 11 shows the testing setup used for this experiment. A Keysight 3600A series function generator was used to provide an AC magnetic field signal of 2 $\mu T_{rms}$ to the device through a set of RF coils at a frequency between 10 Hz and 1 kHz. The same function generator was used to strain modulate the device at either 14.14 $mV_{rms}$ or 17.68 $mV_{rms}$ for Device 1 and 2, respectively. The modulation signal was set to the resonance frequency of the device under test, as determined by the electrical characterization results. A power supply was used to vary the bias field through an electromagnet and the output of the magnetometer is collected into a Rigol RSA3045 spectrum analyzer. FIG. 12 provides an example of a typical output signal seen by the spectrum analyzer, with a carrier peak at the resonance of the plate, and two sideband peaks. To find the optimum bias field for the magnetostrictive material, the bias field was increased incrementally through the full current range able to be supplied to the electromagnet (0 A-~5 A). When the bias field applied to the $Fe_{50}Co_{50}$/Ag is changed, the Young's Modulus is affected, resulting in a shift in resonance frequency. The modulation signal was adjusted to account for the resonance shift and was determined by the highest amplitude carrier peak for each data point taken. FIGS. 13 and 14 show the sideband peak amplitude relative to the DC magnetic bias field provided for both devices along with the frequency shifts. It was observed that higher bias fields generated larger output signals. While the sideband amplitude for Device 1 levels off around 5 mT, the sideband peaks of Device 2 continued to increase up to the maximum bias field capable of being provided by the DC power supply. It would be expected that the output power of Device 2 would also level off at some point past the supplied bias field, but for this study, subsequent measurements used the maximum bias field of 7.47 mT.

Noise Experiments

Figure 15:
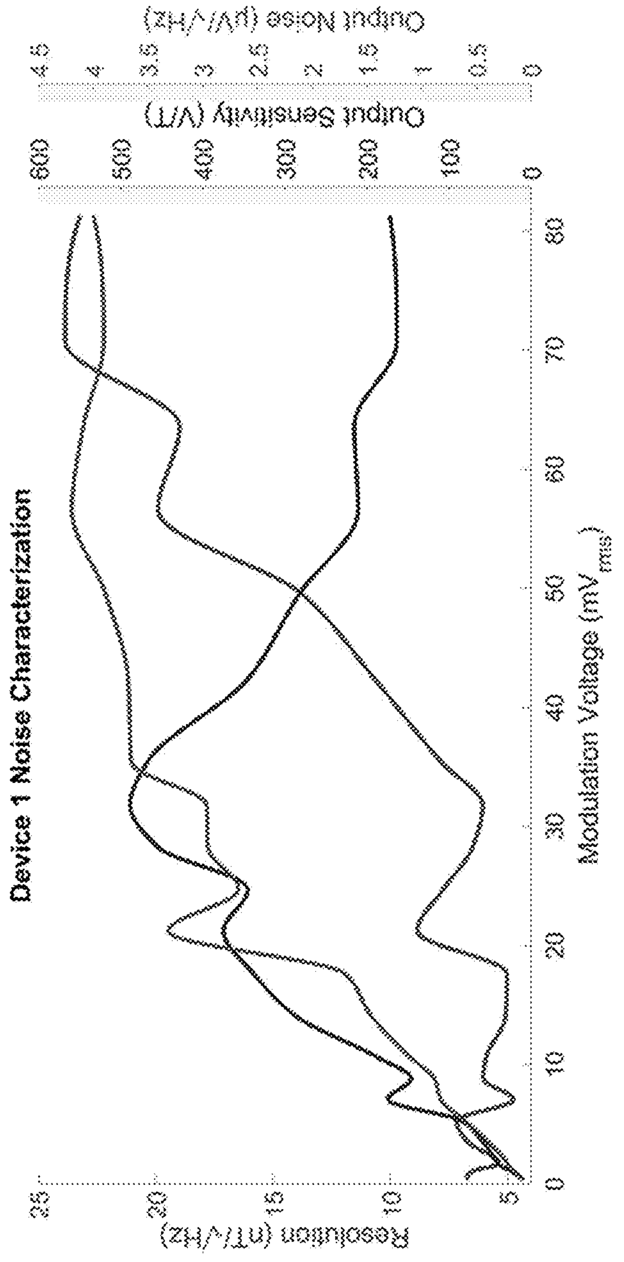
FIG. 15: Summary of the noise and sensitivity of Device 1 with increasing modulation voltage.
Figure 16:
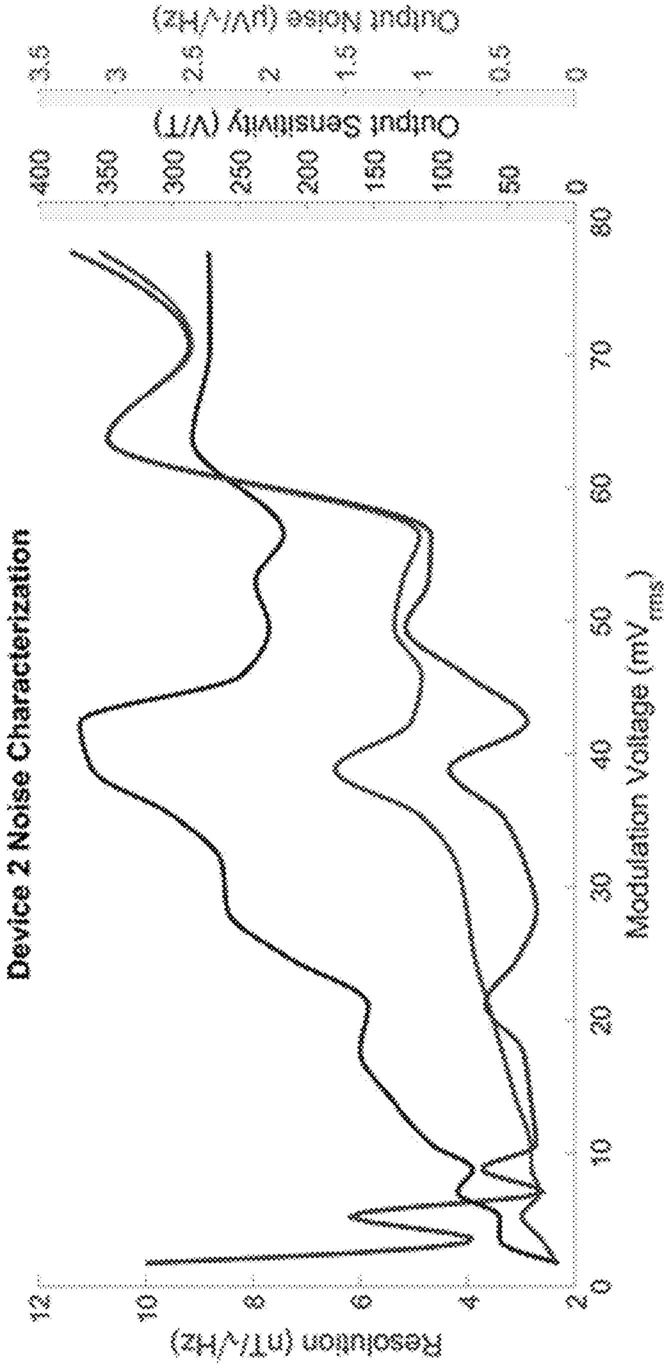
FIG. 16: Summary of the noise and sensitivity of Device 2 with increased modulation voltage.

Once the optimal bias field was determined for each device, noise characteristics were determined. The test setup in FIG. 11 was used again, but a Texas Instruments LMH32401RGTEVM Evaluation Module transimpedance amplifier (TIA) was added to the output of the device before the spectrum analyzer. The transimpedance amplifier in the circuit was utilized to amplify the signal above the noise floor of the spectrum analyzer so the signal-to-noise ratio (SNR) could be accurately determined. The modulation amplitude was increased incrementally, and the SNR of the sideband peaks was determined at each point. The change in resonance frequency was also accounted for at each measurement point, determined in the same manner as during the bias field experiments. MATLAB was used to average the noise floor around the sideband peaks to obtain an accurate noise value. The resolution was then calculated by dividing the noise floor by the sideband sensitivity for an integration bandwidth of 1 Hz on the spectrum analyzer. FIGS. 15 and 16 summarize the sensitivity, noise, and resolution values at each modulation voltage applied. As shown, the best SNR for Device 1 was 51.99 dB at 17.67 $mV_{rms}$, resulting in a resolution of 5.03 nT/√Hz. Device 2 had an SNR of 57.3 dB at 28.28 $mV_{rms}$, resulting in a resolution of 2.72 nT/√Hz. For reference, the input noise of the TIA is only 46 nV/√Hz [48], which is lower than the smallest noise value recorded from the devices.

Duffing Nonlinearity Discussion

The key to increasing the output signal is to maximize $\Delta d_{33m}$. One way to improve the $\Delta d_{33m}$ value is to increase the modulation voltage applied to the AlN. Doing so substantially increases the stress in the $Fe_{50}Co_{50}$/Ag, causing a larger shift in the maximum $d_{33m}$ coefficient position. From theoretical calculations applying a 100 $mV_{rms}$ modulation signal at the device resonance will result in a stress change of approximately 20 MPa in the $Fe_{50}Co_{50}$/Ag. Referring to FIG. 2, this could result in a significant $\Delta d_{33m}$ if the $Fe_{50}Co_{50}$/Ag is changing from an initial stress of 28 MPa. However, if the initial stress in the $Fe_{50}Co_{50}$/Ag is closer to 69 MPa, the $\Delta d_{33m}$ would not be as large. Therefore, the initial stress state of the $Fe_{50}Co_{50}$/Ag could potentially limit the response of the devices and is the subject of on-going research. Increasing this strain modulation too far leads to the onset of the Duffing nonlinearity phenomenon depicted in FIGS. 9 and 10. Driving the plate at higher amplitude results in a softening of the stiffness of the device, leading to the peak amplitude compressing and moving to a lower frequency. This occurs to the devices at a modulation voltage that is much lower than expected since the strain of less than ±20 ppm associated with these vibration amplitudes are well within the materials' linear mechanical regime. Even the strain at a modulation drive amplitude of 100 $mV_{rms}$ is only ±105.3 ppm. Therefore, it is possible that thermal nonlinearities are limiting the maximum input voltage and device strain as was previously reported for contour mode AlN resonators. [49] Ongoing research to thermally compensate the sensors will determine if this is indeed the limiting mechanism. The onset of nonlinearity manifests itself as an increase in the noise floor seen on the spectrum analyzer during the experiments. Therefore, the increased $\Delta d_{33m}$ value (leading to increased sensitivity) is competing with the Duffing nonlinearity phenomenon (causing increased noise), resulting in an optimal drive amplitude that maximizes the $\Delta d_{33m}$ value before the plate goes too far into the nonlinear regime. At this optimum noise point, the input referred sensitivity of Device 1 and Device 2 were 58.4 mA/T and 37.7 mA/T respectively.

Figure 17:
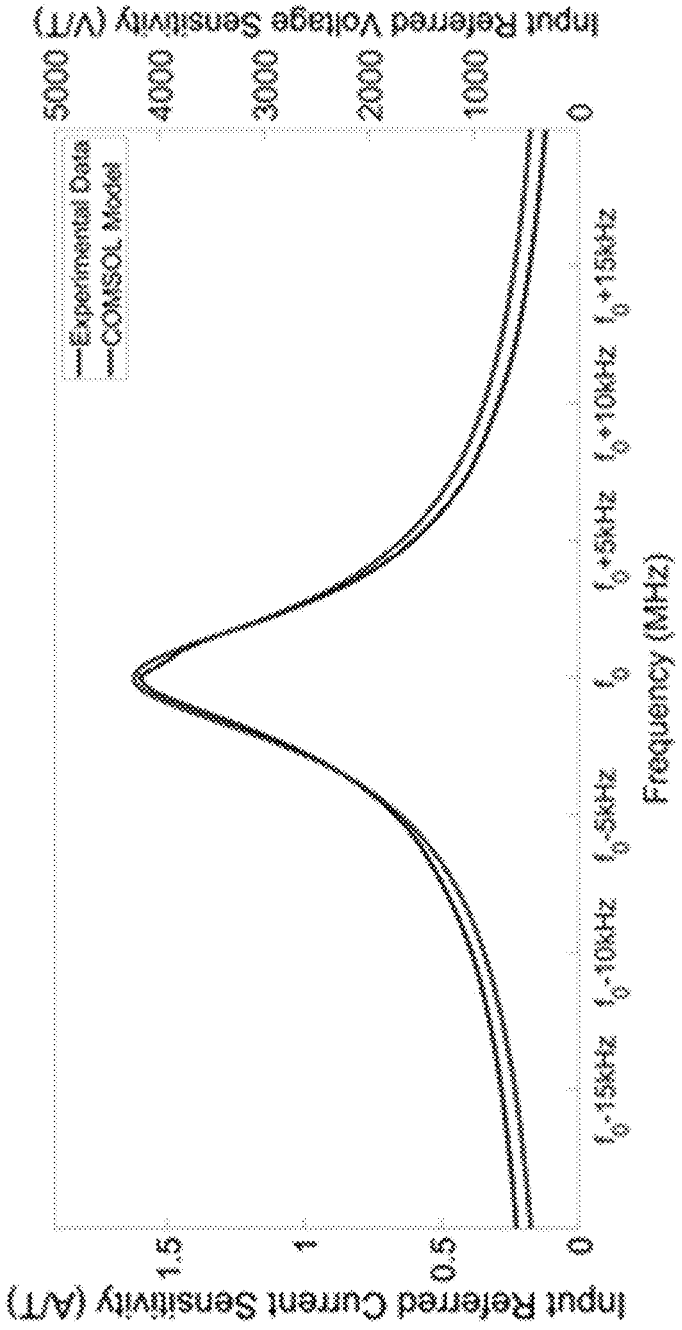
FIG. 17: Overlay of COMSOL simulation with experimental data taken at resonance of Device 1. The resonance frequency $f_0$ is 7.44 MHz. The y-axes correspond to both curves simultaneously.

COMSOL simulations were utilized to predict the sensitivity without electrical modulation applied. In other words, when the AC magnetic field to be sensed lies directly at the resonance frequency of the plate. In this case, without strain modulation, the device would not enter the nonlinear regime and would exhibit the native $d_{33m}$ coefficient of the magnetostrictive material and its coupling to the piezoelectric. The COMSOL simulation for the geometry of Device 1 predicts a sensitivity of 1.565 A/T. Experimental data for this method was also taken on Device 1 and compared to the COMSOL simulations. Good agreement between simulation and experimental data is shown in FIG. 17. In Device 1, for the optimal modulation voltage of 17.67 $mV_{rms}$, a relatively small stress change of 3.5 MPa in the $Fe_{50}Co_{50}$/Ag is calculated. Referring to FIG. 2, this would result in a much smaller $\Delta d_{33m}$ value compared to the native $d_{33m}$ of 12 nm/A of the $Fe_{50}Co_{50}$/Ag. The resolution of the device without strain modulation applied was calculated using the same method as in Section 5. A resolution of 2 pT/√Hz for the unmodulated data is similarly superior to those measured when utilizing strain modulation for Device 1.

Conclusion

This study describes the design, fabrication, and characterization of multiferroic resonant magnetic field sensors. Utilizing an $Fe_{50}Co_{50}$/Ag multilayer magnetostrictive material mechanically coupled to an AlN piezoelectric material, two designs were considered and compared. For the purposes of sensing low frequency magnetic fields necessary for biological magnetic field sensing, a strain modulation technique was employed in the device with an actuation and sense electrode. Both designs had high Q factors over 1000. When the modulation technique was applied to the devices, an unexpected Duffing nonlinearity phenomenon was observed at relatively low driving modulation amplitudes. While increasing the modulation voltage increased the sensitivity in both devices, it also increased the noise floor. Ultimately, Device 1 had a larger sensitivity and Q factor due to its increased area, and therefore lower motional impedance; however, it also had a higher noise value than Device 2. Additionally, higher sensitivities can be achieved when applying the magnetic field directly at the resonance frequency of the devices, as observed through experimental measurements and confirmed with COMSOL simulations. This indicates that the full magnetostrictive potential is not realized before the onset of nonlinearity, likely due to frequency shifts caused by device heating. [49]

References

[1] Y. Cai, Y. Zhao, X. Ding, and J. Fennelly, "Magnetometer Basics for Mobile Phone Applications," vol. 54, no. 2.

[2] M. Zhang and A. A. Sawchuk, "A preliminary study of sensing appliance usage for human activity recognition using mobile magnetometer," 2012: ACM Press, doi: 10.1145/2370216.2370380. [Online]. Available: https://dx.doi.org/10.1145/2370216.2370380

[3] F. J. Villanueva, D. Villa, M. J. Santofimia, J. Barba, and J. C. Lopez, "Crowdsensing smart city parking monitoring," 2015: IEEE, doi: 10.1109/wf-iot.2015.7389148. [Online]. Available: https://dx.doi.org/10.1109/wf-iot.2015.7389148

[4] H. C. Seran and P. Fergeau, "An Optimized Low-Frequency Three-Axis Search Coil Magnetometer for Space Research," Review of Scientific Instruments, 2005.

[5] C. Coillot, J. Moutoussamy, P. Leroy, G. Chanteur, and A. Roux, "Improvements on the Design of Search Coil Magnetometer for Space Experiments," Sensor Letters, vol. 5, no. 1, 2007, doi: https://doi.org/10.1166/sl.2007.050.

[6] M. Melzer et al., "Wearable Magnetic Field Sensors for Flexible Electronics," Advanced Materials, vol. 27, no. 7, pp. 1274-1280, 2015, doi: 10.1002/adma.201405027.
[7] D. Karnaushenko, D. Makarov, M. Staber, D. D. Karnaushenko, S. Baunack, and O. G. Schmidt, "High-Performance Magnetic Sensorics for Printable and Flexible Electronics," Advanced Materials, vol. 27, no. 5, pp. 880-885, 2015, doi: 10.1002/adma.201403907.
[8] Y. Uchikawa and M. Kotani, "Measurement of Magnetic Field Produced From the Human Body," IEEE Translation Journal on Magnetics in Japan, vol. 7, no. 8, 1992, doi: 10.1109/TJMJ.1992.4565462.
[9] D. Cohen and E. Givler, "Magnetomyography: magnetic fields around the human body produced by skeletal muscles," Applied Physics Letters, vol. 21, no. 3, pp. 114-116, 1972, doi: 10.1063/1.1654294.
[10] S. Zuo, H. Heidari, D. Farina, and K. Nazarpour, "Miniaturized Magnetic Sensors for Implantable Magnetomyography," Advanced Materials Technologies, vol. 5, no. 6, 2020, doi: https://doi.org/10.1002/admt.202000185.
[11] H. Heidari, S. Zuo, and A. K. K. Nazarpour, "CMOS Magnetic Sensors for Wearable Magnetomyography," presented at the International Conference of the IEEE Engineering in Medicine and Biology Society (EMBC), Honolulu, HI, USA, 2018.
[12] M. A. Garcia and O. Baffa, "Magnetic fields from skeletal muscles: a valuable physiological measurement?," (in English), Frontiers in Physiology, Opinion vol. 6, 2015 Aug. 10, 2015, doi: 10.3389/fphys.2015.00228.
[13] B.-M. Mackert et al., "Magnetometry of injury currents from human nerve and muscle specimens using Superconducting Quantum Interferences Devices," Neuroscience Letters, vol. 262, no. 3, pp. 163-166, 1999/03/12/1999, doi: https://doi.org/10.1016/S0304-3940(99)00067-1.
[14] R. S. Popovic, "High Resolution Hall Magnetic Sensors," in 29th International Conference on Microelectronics, Belgrade, Serbia, 2014, doi: 10.1109/MIEL.2014.6842087.
[15] B. T. Schaefer et al., "Magnetic field detection limits for ultraclean graphene Hall sensors," Nature Communications, vol. 11, no. 1, 2020, doi: 10.1038/s41467-020-18007-5.
[16] Z. Wang, M. Shaygan, M. Otto, D. Schall, and D. Neumaier, "Flexible Hall sensors based on graphene," Nanoscale, vol. 8, no. 14, pp. 7683-7687, 2016, doi: 10.1039/c5nr08729e.
[17] C. Granata, A. Vettoliere, and M. Russo, "An Ultralow Noise Current Amplifier Based on Superconducting Quantum Interference Device for High Sensitivity Applications," Review of Scientific Instruments, 2010.
[18] J. Lenz and A. S. Edelstein, "Magnetic Sensors and Their Applications," IEEE Sensors, vol. 6, no. 3, 2006, doi: 10.1109/JSEN.2006.874493.
[19] D. Murzin et al., "Ultrasensitive Magnetic Field Sensors for Biomedical Applications," Sensors, vol. 20, no. 6, p. 1569, 2020, doi: https://doi.org/10.3390/s20061569.
[20] Y. Wang et al., "Optimized gas pressure of an Rb vapor cell in a single-beam SERF magnetometer," Optics Express, vol. 30, no. 1, p. 336, 2022, doi: 10.1364/oe.447456.
[21] J. Li et al., "SERF Atomic Magnetometer-Recent Advances and Applications: A Review," IEEE Sensors Journal, vol. 18, no. 20, pp. 8198-8207, 2018, doi: 10.1109/jsen.2018.2863707.
[22] Y. Yang et al., "A new wearable multichannel magnetocardiogram system with a SERF atomic magnetometer array," Scientific Reports, vol. 11, no. 1, 2021, doi: 10.1038/s41598-021-84971-7.
[23] H. B. Dang, A. C. Maloof, and M. V. Romalis, "Ultrahigh sensitivity magnetic field and magnetization measurements with an atomic magnetometer," Applied Physics Letters, vol. 97, no. 15, p. 151110, 2010, doi: 10.1063/1.3491215.
[24] M. A. Khan, J. Sun, B. Li, A. Przybysz, and J. Kosel, "Magnetic Sensors—A Review and Recent Technologies," Engineering Research Express, vol. 3, no. 2, 2021, doi: https://doi.org/10.1088/2631-8695/ac0838.
[25] R. C. Chaves and P. P. Freitas, "Low Frequency Picotesla Field Detection Using Hybrid MgO Based Tunnel Sensors," Applied Physics Letters, vol. 91, no. 10, 2007, doi: https://doi.org/10.1063/1.2775802.
[26] G. Vértesy, A. Gasparics, and J. Szöllősy, "High Sensitivity Magnetic Field Sensor," Sensors and Actuators, vol. 85, no. 1-3, p. 7, 2000, doi: https://doi.org/10.1016/S0924-4247(00)00368-X.
[27] H. U. Auster et al., "The THEMIS Fluxgate Magnetometer," Space Science Reviews, vol. 141, p. 29, 2008, doi: https://doi.org/10.1007/s11214-008-9365-9.
[28] H. Lee, T.-H. Shin, J. Cheon, and R. Weissleder, "Recent Developments in Magnetic Diagnostic Systems," Chemical Reviews, vol. 115, no. 19, 2015, doi: https://doi.org/10.1021/cr500698d.
[29] Y. Chen et al., "Quasi-one-dimensional miniature multiferroic magnetic field sensor with high sensitivity at zero bias field," Applied Physics Letters, vol. 99, no. 4, p. 042505, 2011, doi: 10.1063/1.3617434.
[30] D. Viehland, M. Wuttig, J. McCord, and E. Quandt, "Magnetoelectric magnetic field sensors," MRS Bulletin, vol. 43, no. 11, pp. 834-840, 2018, doi: 10.1557/mrs.2018.261.
[31] M. Li et al., "Ultra-sensitive NEMS magnetoelectric sensor for picotesla DC magnetic field detection," Applied Physics Letters, vol. 110, no. 14, 2017, doi: 10.1063/1.4979694.
[32] P. Hayes et al., "Electrically Modulated Magnetoelectric Sensors," Applied Physics Letters, vol. 108, no. 18, 2016, doi: 10.1063/1.4948470.
[33] M. Zaeimbashi et al., "Ultra-Compact Dual-Band Smart NEMS Magnetoelectric Antennas for Simultaneous Wireless Energy Harvesting and Magnetic Field Sensing," Nature Communications, vol. 12, no. 1, 2021, doi: https://doi.org/10.1038/s41467-021-23256-z.
[34] X. Zhuang, M. L. C. Sing, C. Dolabdjian, P. Finkel, J. Li, and D. Viehland, "Theoretical Intrinsic Equivalent Magnetic Noise Evaluation for Magneto (Elasto) Electric Sensors Using Modulation Techniques," IEEE Sensors Journal, vol. 14, no. 1, pp. 150-158, 2014, doi: 10.1109/jsen.2013.2274098.
[35] Y. Wang, K. Liu, S. Shao, J. Kim, and T. Wu, "Multiferroic Magnetic Sensor Based on AlN and Al0.7Sc0.3N Thin Films," presented at the IEEE International Ultrasonics Symposium, Xi'an, China, 2021.
[36] S. Dong, J. Zhai, Z. Xing, J.-F. Lie, and D. Viehland, "Extremely Low Frequency Response of Magnetoelectric Multilayer Composites," Applied Physics Letters, vol. 86, no. 10, 2005, doi: https://doi.org/10.1063/1.1881784.
[37] J. Su et al., "AlScN-Based MEMS Magnetoelectric Sensor," Applied Physics Letters, vol. 117, no. 13, 2020, doi: https://doi.org/10.1063/5.0022636.
[38] Y. Hui, T. Nan, N. X. Sun, and M. Rinaldi, "High Resolution Magnetometer Based on a High Frequency Magnetoelectric MEMS-CMOS Oscillator," Journal of Microelectromechanical Systems, vol. 24, no. 1, 2014, doi: 10.1109/JMEMS.2014.2322012.
[39] S. M. Gillette, A. L. Geiler, D. Gray, D. Viehland, C. Vittoria, and V. G. Harris, "Improved Sensitivity and Noise in Magneto-Electric Magnetic Field Sensors by Use of Modulated AC Magnetostriction," IEEE Magnetics Letters, vol. 2, 2011, doi: 10.1109/LMAG.2011.2151178.
[40] J. Zhai, Z. Xing, S. Dong, J. Li, and D. Viehland, "Detection of Pico-Tesla Magnetic Fields using Magneto-Electric Sensors at Room Temperature," Applied Physics Letters, vol. 88, no. 6, 2006, doi: https://doi.org/10.1063/1.2172706.
[41] G. Piazza, P. J. Stephanou, and A. P. Pisano, "Piezo-electric Aluminum Nitride Vibrating Contour-Mode MEMS Resonators," Journal of Microelectromechanical Systems, vol. 15, no. 6, 2006, doi: 10.1109/JMEMS.2006.886012.
[42] B. Kim, R. H. O. III, and K. E. Wojciechowski, "AlN Microresonator-Based Filters with Multiple Bandwidths at Low Intermediate Frequencies," Journal of Microelectromechanical Systems, vol. 22, no. 4, 2013, doi: 10.1109/JMEMS.2013.2251414.
[43] M. Staruch et al., "Reversible strain control of magnetic anisotropy in magnetoelectric heterostructures at room temperature," Sci Rep, vol. 6, p. 37429, Nov. 21, 2016, doi: 10.1038/srep37429.
[44] C. L. Platt, A. E. Berkowitz, D. J. Smith, and M. R. McCartney, "Correlation of coercivity and microstructure of thin CoFe films," Journal of Applied Physics, vol. 88, no. 4, pp. 2058-2062, 2000, doi: 10.1063/1.1305833.
[45] L. M. Garten, M. L. Staruch, K. Bussmann, J. Wollmershauser, and P. Finkel, "Enhancing Converse Magnetoelectric Coupling Through Strain Engineering in Artificial Multiferroic Heterostructures," ACS Appl Mater Interfaces, vol. 14, no. 22, pp. 25701-25709, Jun. 8, 2022, doi: 10.1021/acsami.2c03869.
[46] L. C. Wang, H. J. Hatton, M. D. Cooke, and M. R. J. Gibbs, "<Microstructure and Magnetoelastic Properties of FeCo—Ag Multilayers—Wang.pdf>," Journal of Applied Physics, vol. 89, no. 11, 2001, doi: 10.1063/1.1354591.
[47] C. Dong et al., "Characterization of magnetomechanical properties in FeGaB thin films," Applied Physics Letters, vol. 113, no. 26, 2018, doi: 10.1063/1.5065486.
[48] T. Instruments, ""450-MHz, Programmable Gain, Differential Output Transimpedance Amplifier," LMH32401 Datasheet," ed, 2019.
[49] J. Segovia-Fernandez and G. Piazza, "Thermal Non-linearities in Contour Mode AlN Resonators," Journal of Microelectromechanical Systems, vol. 22, no. 4, pp. 976-985, 2013, doi: 10.1109/jmems.2013.2252422.
[50] R. H. Olsson, J. Nguyen, T. Pluym, and V. M. Hietala, "A Method for Attenuating the Spurious Responses of Aluminum Nitride Micromechanical Filters," Journal of Microelectromechanical Systems, vol. 23, no. 5, pp. 1198-1207, 2014, doi: 10.1109/jmems.2014.2308544.

Exemplary Disclosure—B

Low noise sensors with low power consumption are needed for sensing the bio-magnetic potentials produced by the human body. Compared to their electrical counterparts, bio-magnetic sensors are non-invasive and non-contact. A strain modulated FeCo—Hf/AlScN based sensor with a bandwidth of 3.4 kHz and a magnetic noise spectral density at 1 kHz of 59.5 pT/√Hz before demodulation and 98.5 pT/√Hz after demodulation in an unshielded environment is presented. The footprint of the sensor including flux concentrators is 0.125 $cm^2$, and the total power consumption of the printed circuit board based readout electronics is 440 mW. A theoretical analysis for scaling of the sensitivity and the noise spectral density of modulated multiferroic sensor systems is presented.

I. Introduction

Magnetic fields are generated by electric currents. In the body, the heart, brain, and muscles all utilize potential differences to operate, and the associated currents produce magnetic fields. Magnetoencephalography, magnetoneurography, magnetomyography, and magnetocardiography are techniques for the detection of the magnetic fields produced by the brain, nerves, skeletal muscles, and heart, respectively. Magnetoencephalography requires detection of signals in the frequency range of 1-100 Hz and with amplitudes of ~100 fT to 1 pT when measured 1.5 cm from the scalp [1]. Magnetoneurography requires detection of magnetic fields at a higher frequency of 100-1000 Hz but at much lower amplitude of ~20-100 fT, depending on the nerve-to-sensor distance [2]. Magnetomyography requires detection of 0.1 to 1 kHz signals with amplitudes in the 10's of pT when measured 4 cm from the elbow and 100's of fT when measured 4 cm from the palm [3]-[6]. Magnetocardiography requires detection of signals with amplitudes on the order of 10's of pT when measured 3 cm from the chest and in the frequency range of 0.01-50 Hz for healthy patients [7]. Some cardiovascular conditions, such as idiopathic dilated cardiomyopathy, result in MCG readings containing higher frequency components [8].

To detect these biological signals a sensor with large fractional bandwidth and low noise is needed. Superconducting quantum interference devices (SQUIDs) are capable of detecting signals in the low IT but require cryogenic cooling and thus are often inaccessible in portable applications due to high power consumption and large size [9]-[12]. Spin exchange relaxation free (SERF) atomic magnetometers can achieve noise spectral densities of 0.16 fT/Hz [13] without utilizing cryogenic refrigeration. However, this technology requires the use of lasers with high power consumption. Additionally, the bandwidth of SERFs is around 100 Hz which cannot capture the entire range of biological signals [14]-[16]. An off-the-shelf SERF sensor by QuSpin has a bandwidth of 100 Hz and a power consumption of 5 W, including readout circuitry [17].

Previously, research utilizing magnetically or piezoelectrically modulated magnetoelectric (ME) sensors, or non-modulated ME sensors have been able to show noise spectral densities and bandwidths on the order of bio-magnetic signals. Non-modulated ME sensors have shown noise spectral densities of 250 fT/Hz, but with very small bandwidth [18]. Piezo-modulated ME sensors are capable of larger bandwidth with noise spectral densities around 20 pT/√Hz at 10 Hz [19]. Magnetically modulated ME sensors have shown noise spectral densities of 200-4,000 pT/√Hz with sufficient bandwidths but at a much larger sensor volume than other technologies [20]. Other magnetically modulated ME sensors have shown 10 pT limit of detection with 34 Hz bandwidth [21]. The noise spectral density, bandwidth, sensor volume, and power consumption of these sensors along with SQUID and SERF sensors and various other commercially available and state-of-the-art research sensors are shown in Table II for comparison.

Recently, work by D'Agati et al. utilizing a piezoelectrically modulated multiferroic magnetometer composed of aluminum nitride (AlN) and iron cobalt (FeCo) demonstrated a sensitivity of 58.4 mA/T and a magnetic noise spectral density of 5.03 nT/√Hz while maintaining a small footprint (2.25 $mm^2$) [22]. In this work we explore the use of scandium-alloyed AlN (AlScN) and flux concentrators to improve the sensitivity and noise spectral density of magneto-electric sensors. To maintain the high quality (Q) factors that lead to superior noise performance and to obtain sufficient bandwidth for bio-magnetic sensing, the device reported in this work is operated at a mechanical resonance frequency of ~6.7 MHz and the low-frequency bio-magnetic signals are mixed up to this higher frequency using non-linear strain modulation [22].

Figure 18:
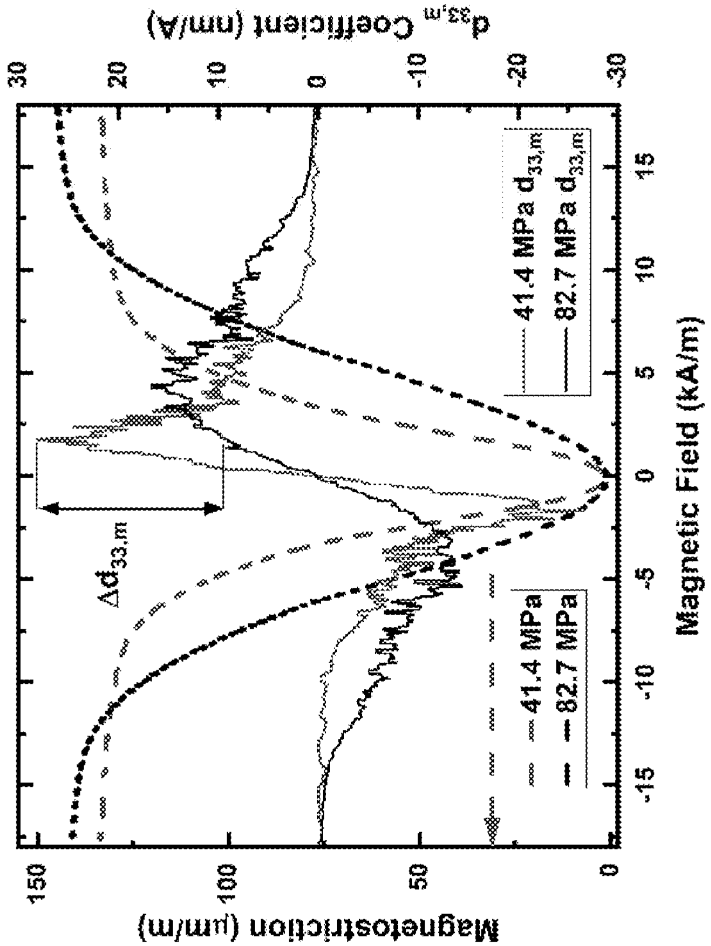
FIG. 18: Magnetostrictive curve for bulk $Fe_{0.50}Co_{0.50}$ showing the change in $d_{33}$ coefficient with stress.

Strain modulated magnetoelectric sensors were previously reported in [22]-[24]. A sinusoidal voltage is applied across the electrodes of a piezoelectric layer, typically at the device resonant frequency, causing the piezoelectric layer to strain. This strain changes the stress state of the magnetostrictive layer, resulting in the modulation of the stress dependent piezomagnetic coefficient of the magnetostrictive layer, $d_{33\_magnetic}$. The relationship between the change in $d_{33\_magnetic}$ and stress in bulk FeCo grown by Etrema is illustrated in FIG. 18. As a result of the change in $d_{33\_magnetic}$, the strain induced by low-frequency magnetic fields is mixed with the higher frequency modulation signal and the overall output signal is amplified by the mechanical Q factor of the resonator. The piezoelectric layer then produces a time varying current that is proportional to the magnetic field.

While the magnetoelectric sensor converts magnetic field into an electrical signal, a full sensor system requires a readout circuit of the type discussed in Section V of this work. In this work the sensor is electrically modulated at the device resonant frequency. Therefore, the input signal of the readout is in the megahertz frequency range [22]. In addition to amplification, the circuit also performs demodulation to the original magnetic signal frequency. In this paper, a printed circuit board (PCB) version of the readout is presented as the most straightforward and cost-effective solution, as the multiferroic sensor in this work has a resonant frequency below 20 MHz [22]. Therefore, commercial electronic chip-based circuits are implemented to amplify and demodulate the sensor's output signal before it is digitalized for further processing.

Electronic current sensing often utilizes a transimpedance amplifier (TIA) [25], sensing either in the continuous time [26]-[30] or discrete time domain [31]-[34]. Compared to an application specific integrated circuit (ASIC) solution, the larger parasitic capacitors of the PCB will result in a large charge injection error if using discrete time sensing. Therefore, a commercial integrated resistive feedback transimpedance amplifier is chosen at the sensor interface. Demodulation is performed after amplification to reduce the overall impact of the demodulator noise.

There are several challenges underlying this application. The most critical consideration is that the sensor output current is on order of pA-nA, based on the sensitivity of the sensor. Hence, ultra-low electrical noise at the sensor resonant frequency is required at the front-end interface. The circuit noise, when interfaced with the sensor, should contribute noise on order of, or less than, the intrinsic thermal noise of the sensor. In addition, the circuit must handle a large modulation current generated by the modulation voltage of at least 80 $mV_{PP}$ while also linearly amplifying the much smaller currents produced by the magnetic fields. Therefore, the amplification before the demodulation should be carefully designed to avoid saturation.

Along with changes to device composition, a PCB electrical readout circuit is reported for low noise amplification and demodulation of the magnetic sensor response. The circuit achieves a noise floor of 5.5 pA/√Hz when interfaced to the sensor, a value close to the sensor thermal Brownian noise limit of 3.5 pA/√Hz. The circuit dynamic range is large enough to allow for the amplification of the small currents produced by the body (<500 pT) while the also amplifying the 75 $\mu A_{PP}$ modulation signal present at the sensor output. A canceller architecture is adopted that reduces the noise introduced by the modulator by 4 times. Overall, the circuit consumes 440 mW power consumption. The reported electronics allows for the small form factor and low power consumption required for on-body sensing. A thorough noise analysis including both the magneto-electric sensor and the readout electronics is provided. Finally, the sensor is characterized using the implemented readout showing a magnetic noise spectral density at 1 kHz of 59.5 pT/√Hz before demodulation and 98.5 pT/√Hz after demodulation in an unshielded environment.

Section II reports on the device design and fabrication. Section III details the sensor electrical and magnetic characterization. In Section IV, the sensor circuit and noise models are introduced. In Section V, the readout circuit, as well as the circuit noise improvement are detailed. Section VI introduces the basic theory of the noise analysis and the scaling of the underlying sensor system noise including the interaction between the sensor and the readout electronics. Finally, the performance of the readout circuit and integrated sensor system are presented in Section VII and Section VIII, respectively.

II. Device Structure and Fabrication

The magnetoelectric sensor in this work utilizes stress modulation to convert low-frequency magnetic fields to mechanical strain centered at the device resonant frequency. D'Agati et al. [22] described the current sensitivity of a strain modulated magnetic field sensor. Adding the additional gain due to flux concentration the sensitivity is given by:

$$S = \frac{i_{sense}}{B_x} = 2\pi f_0 \times Q \times \Delta d_{33\_magnetic} \times d_{31\_piezo} \times E_{piezo} \times \text{Area} \times k_M \times G_{FC} \times \frac{1}{\mu_0} \quad (1)$$

where $f_0$ is the resonant frequency of the device, Q is the device quality factor, $d_{31}$_piezo is the piezoelectric coefficient and $E_{piezo}$ is the Young's Modulus of the piezoelectric material, Area is the device area of the sensing electrode, $k_M$ represents reductions in the device strain under magnetic field due to the increase in stiffness from attachment to the piezoelectric layer, $G_{FC}$ is the gain of any flux concentration used, $\mu_0$ is the permeability of free space, and $B_x$ is the external magnetic flux density applied to the sensor. $k_M$ can be found using [22]:

$$k_M = \frac{E_{magnetic} t_{magnetic}}{E_{magnetic} t_{magnetic} + E_{piezo} t_{piezo}} \quad (2)$$

where $E_{magnetic}$ is the Young's modulus of the magnetostrictive material and $t_{magnetic}$ and $t_{piezo}$ are the thickness of the magnetostrictive and piezoelectric materials respectfully. The change in piezomagnetic coefficient [22], $\Delta d_{33\_magnetic}$, represents the difference between the maximum and minimum piezomagnetic coefficients achieved from the device under time varying stress modulation.

Figure 19A:
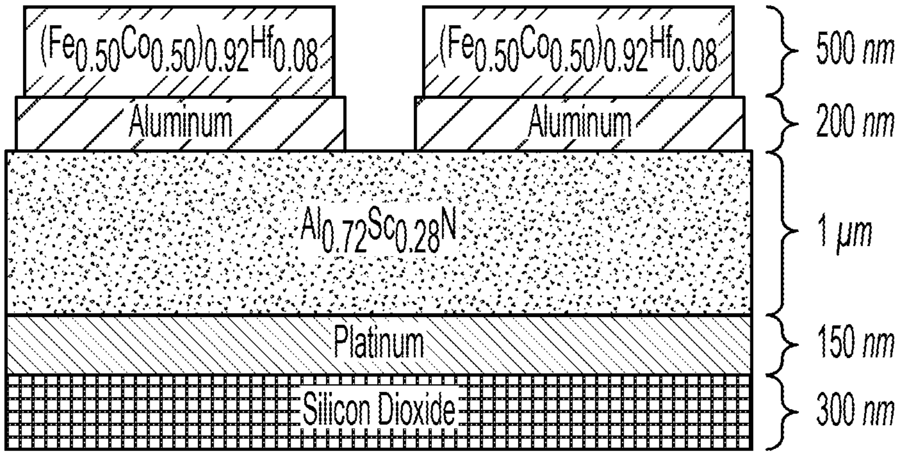
FIG. 19A: Schematic showing a material stack for the multiferroic sensor.
Figure 19C:
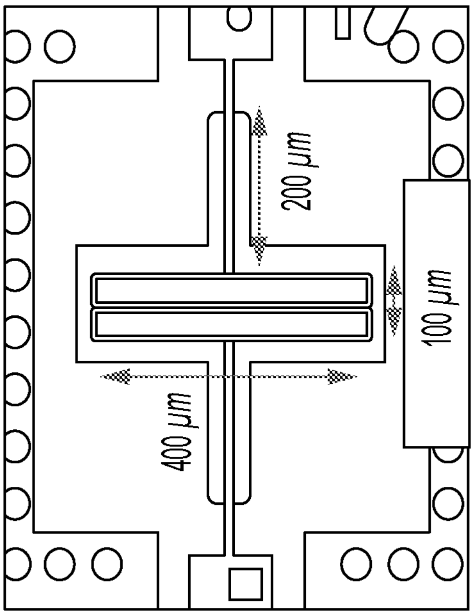
FIG. 19C: Schematic showing a top-down view of the multiferroic sensor.
Figure 19B:
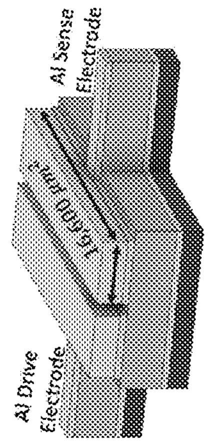
FIG. 19B: Schematic showing a 3D model of the multiferroic sensor.

The sensor microfabrication utilizes a variant of the five photomask process previously reported by D'Agati [22]. In the modified process a 1 m sputtered $Al_{0.72}Sc_{0.28}N$ film is utilized and is patterned using a 30% aqueous potassium hydroxide wet etch [35]. A 500 nm thick hafnium doped iron cobalt film ($(Fe_{0.50}Co_{0.50})_{0.92}Hf_{0.8}$) is utilized as the magnetostrictive material [36]. Reducing the thickness of the magnetostrictive material results in higher mechanical quality factors. FIG. 19A shows the film stack of the fabricated devices along with a 3D model shown in FIG. 19B, and a top-down optical image shown in FIG. 19C.

III. Device Characterization

A. Electrical and Magnetic Characterization

Figure 20:
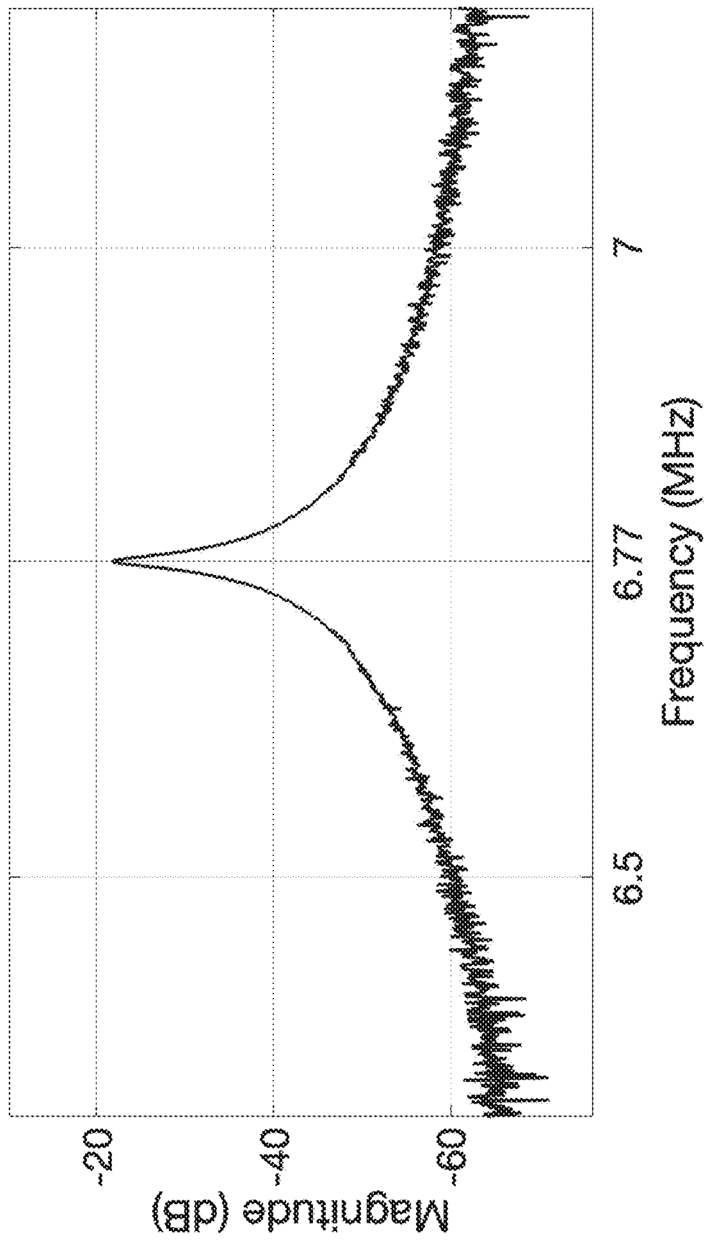
FIG. 20 Diagram of an electrical response of the multiferroic sensor with a Q of 999, an insertion loss of −21 dB in a 50Ω system, and a resonant frequency of 6.77 MHz.

A Keysight P9372A vector network analyzer was used to measure the $S_{21}$ response for the device, which is shown in FIG. 20. The device had a Q factor of 999, a resonant frequency of 6.77 MHz and an insertion loss of −21 dB in a 50Ω system.

Figure 21:
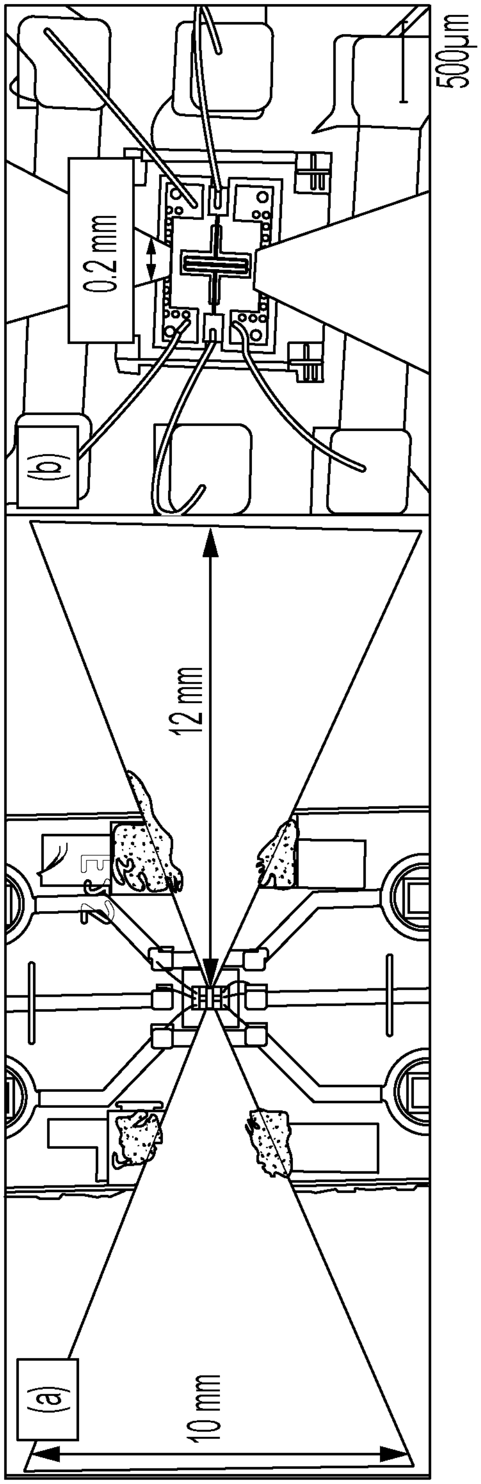
FIG. 21A: Full-sized view of a magnetic field sensor with flux concentrators attached.
FIG. 21B: Close-up image of a magnetic field sensor with flux concentrators attached showing the alignment of the flux concentrators with the sensor.
Figure 22:
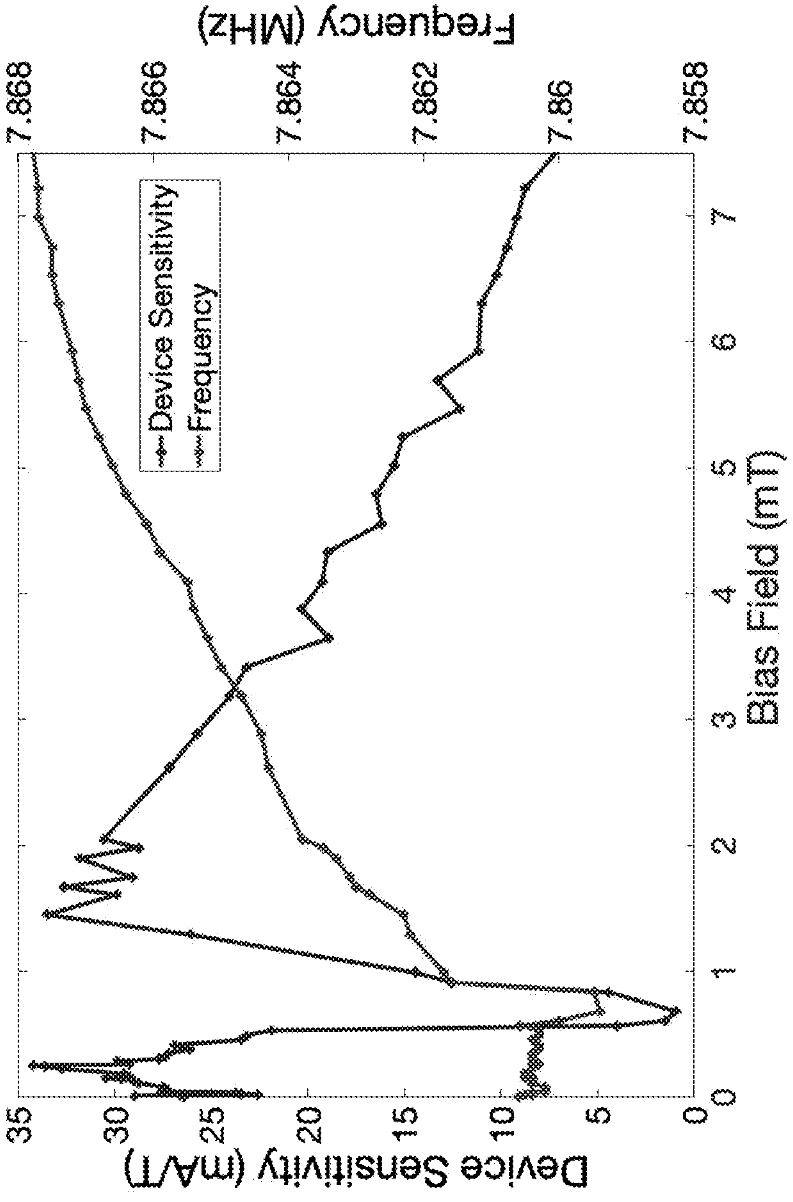
FIG. 22: Summary of relationship between bias field and device sensitivity and resonant frequency.

The device was adhered and wire bonded to a PCB after fabrication, as shown in FIG. 21. Magnetostrictive films require an external DC magnetic bias to operate efficiently. The magnetic bias field for FeCo—Hf film was determined to be 2 mT by varying the DC current in two electromagnets to sweep the magnetic field while observing device sensitivity with a Rigol RSA3045 spectrum analyzer [22]. The relationship between DC magnetic bias field and device sensitivity and resonant frequency for a sensor with the same magnetostrictive layer as the device discussed in this work is shown in FIG. 22. At 2 mT bias field, small changes in DC bias field result in small changes in sensitivity and resonant frequency.

Next, the optimum drive voltage amplitude which excites the stain modulation was determined. This value, referred to as the modulation voltage, was found by biasing the sensor with 2 mT of DC magnetic field and increasing the modulation voltage until the signal-to-noise ratio observed on a spectrum analyzer was maximized. This value was determined to be 100 $mV_{PP}$ for the device discussed in this work. The amplitude of the modulation voltage is limited by the sensor Duffing nonlinearity, whereas applying a modulation voltage that is too low would decreases the amount of current produced for a given magnetic signal [22].

After preliminary device characterization, flux concentrators were utilized to improve the response of the sensor. Flux concentrators provide additional gain but will also decrease the spatial resolution of the fields being sensed. In this work, the spatial distortion will be proportional to both the length (1.2 cm) and width (1 cm) of the flux concentrator, as shown in FIG. 21.

The flux concentrators were cut from a 100 m thick sheet of MuMetal [37] using a IPG Photonics IX280-DXF green laser. Details of the flux concentrator design are given in [38]. The flux concentrators were aligned by hand and adhered to the sensor device following release. The final device with flux concentrators is shown in FIGS. 21A and 21B.

B. Flux Concentration Effect on Sensitivity and Bandwidth

To determine the effect of flux concentration on device sensitivity, a 1 kHz magnetic field was applied both with and without flux contractors and the sensitivity was measured. The addition of the flux concentrators shown in FIGS. 21A and 21B resulted in the sensor producing 25 times more current for the same AC magnetic field, resulting in a sensitivity increase from 0.028 A/T to 0.71 A/T. This improvement, shown in FIG. 23, was measured with a 1 kHz magnetic field of 533 $nT_{RMS}$. The measurement of the device with flux concentration shows distortions at 60 Hz and its associated harmonics due to the improved sensitivity brining these responses above the sensor noise floor. Below we show that magnetic shielding can reduce but not eliminate these distortions.

The permeability of the MuMetal concentrators changes with magnetic field [37], and the exact value is unknown at the level of DC magnetic field used to bias the magnetostrictive film. Thus, the exact skin depth of the concentrators cannot be reported.

Figure 24:
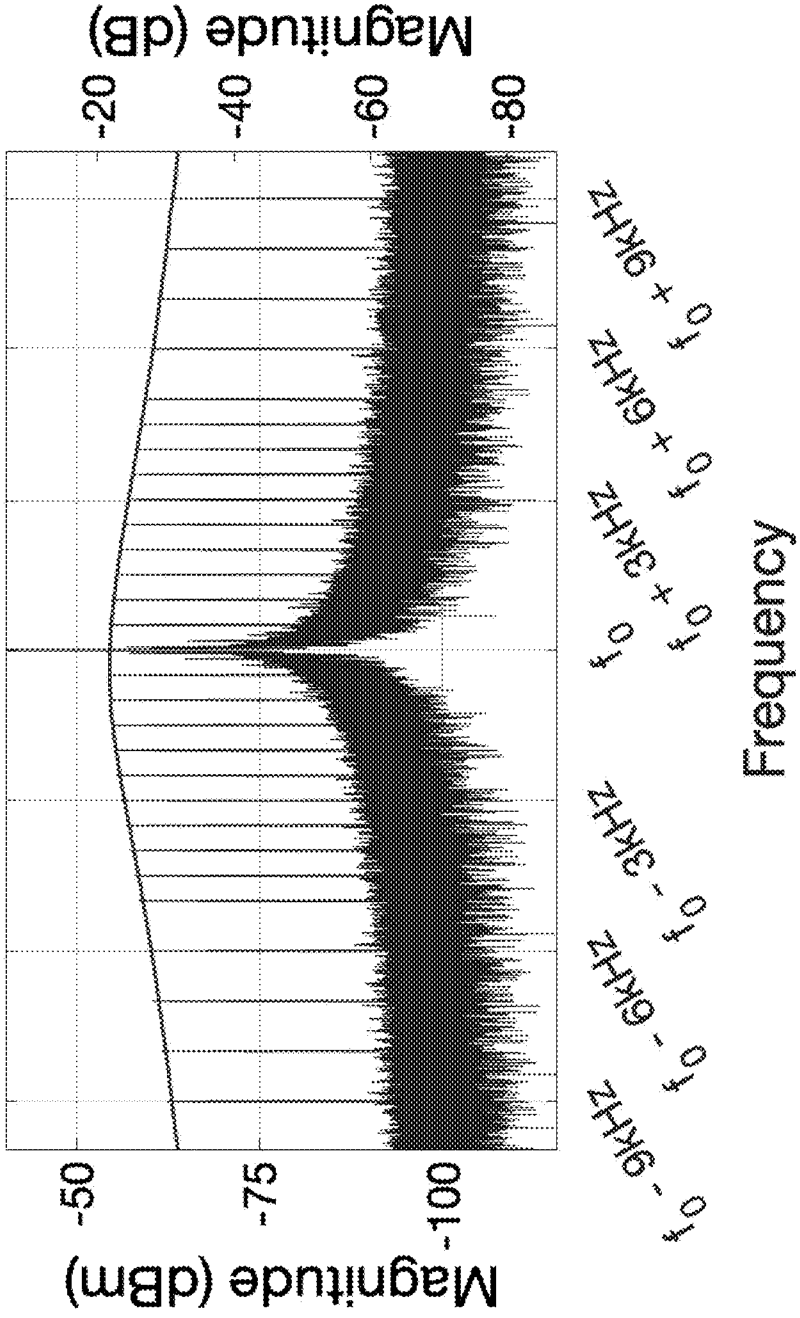
FIG. 24: Power spectrum of device with flux concentrators excited with 533 $nT_{RMS}$ signals at frequencies up to 9 kHz overlaid with the $S_{21}$ response of the unbiased device.

The bandwidth of the sensor with flux concentrators was measured to determine any impact of the skin effect. FIG. 24 shows the response of the sensor with 100 m thick MuMetal concentrators to a magnetic field of a 533 $nT_{RMS}$ at various frequencies. The bandwidth of the sensor device is approximately 3.4 kHz, which closely matches the 3 dB bandwidth of 6.75 kHz as determined from the original $S_{21}$ measurement, showing that the skin depth of the flux concentrators does not impact the sensor system bandwidth over the relevant range for bio-magnetic signals.

Figure 23:
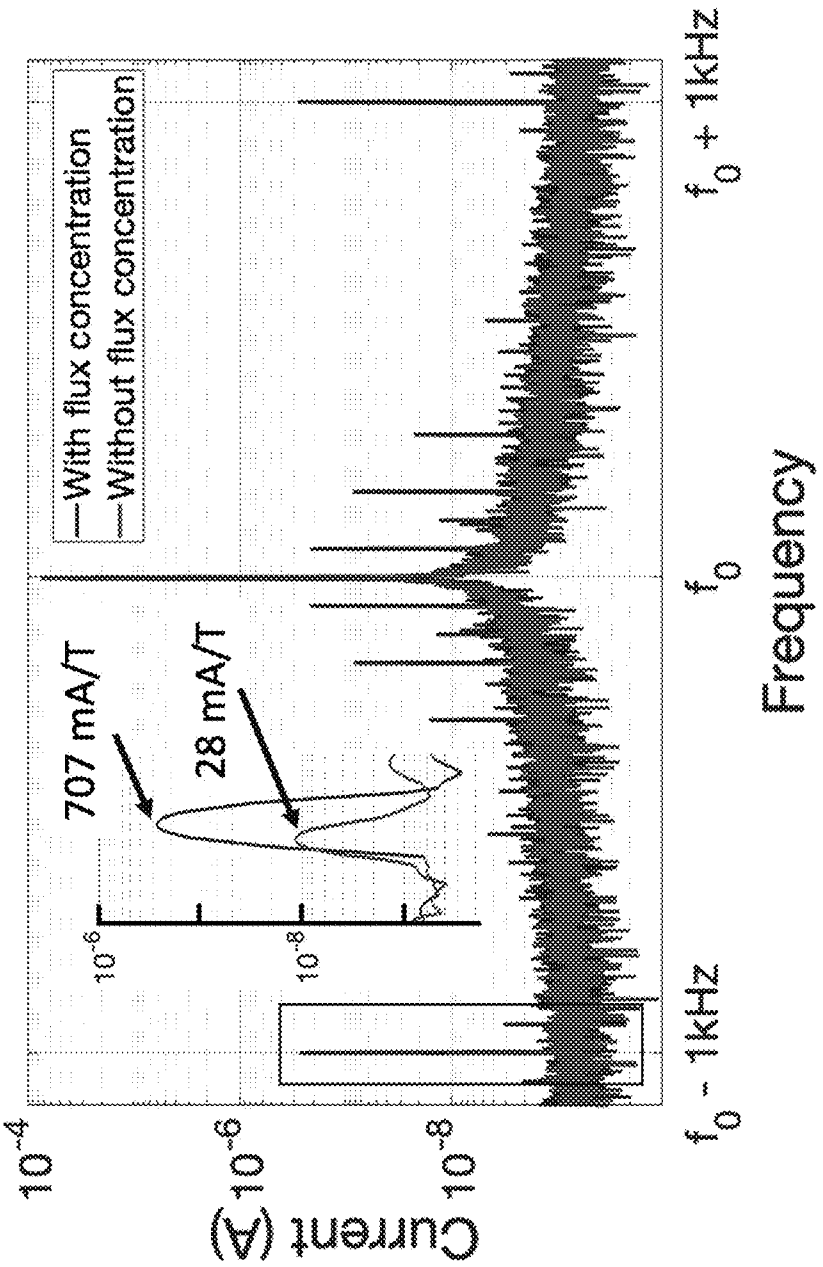
FIG. 23: Output spectrum for a device with and without flux concentrators excited by a 1 kHz 533 $nT_{RMS}$ magnetic field.

An addition transimpedance gain of 10 kΩ using the LMH32401RGTEVM Evaluation board from Texas Instruments [39] was applied before the spectrum analyzer to determine the effect of the flux concentrators on the noise floor. The additional gain brings the noise-floor of the integrated system above that of the spectrum analyzer. The additional gain of the TIA indicated the flux concentration did not increase the noise floor, as shown in FIG. 23.

In addition to amplifying the AC magnetic flux, the flux concentrators also amplified the DC bias field being applied to the device by 25 times. The Young's Modulus of the magnetostrictive film, and therefore the resonant frequency of the device, changes with DC bias field. The additional gain from the flux concentrators made tuning the DC bias field to obtain the same resonant frequency of the device without flux concentrators difficult. The resonant frequency of the device with flux concentrators was found to be 6.760 MHz compared to a resonant frequency of 6.765 MHz without flux concentration.

IV. Sensor Equivalent Circuit and Noise Model

Figure 25A:
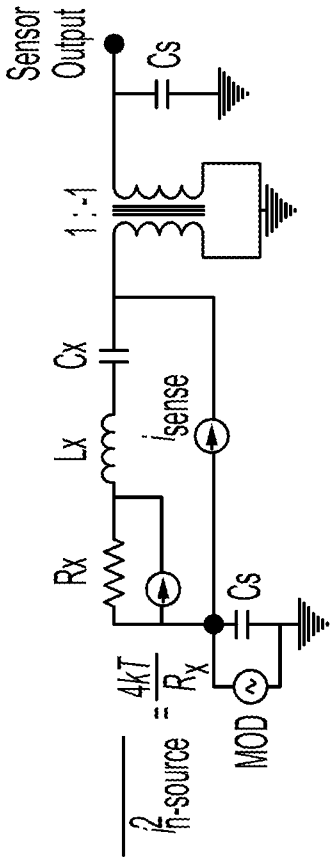
FIG. 25A: Circuit model of the sensor with thermal noise sources in which the sensor is represented by a current source.
Figure 25B:
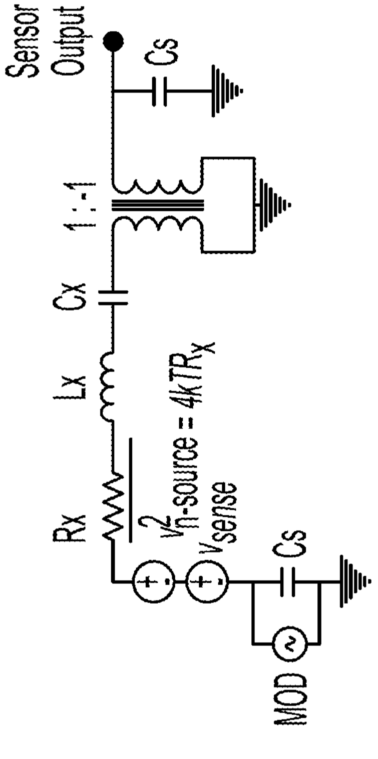
FIG. 25B: Circuit model of the sensor with thermal noise sources in which the sensor is represented by a voltage source.

The equivalent circuit model for the magnetoelectric sensor modeled as a current source or voltage source is given in FIGS. 25A and 25B [40]. $R_x$, $L_x$, and $C_x$ are the motional resistor, inductor, and capacitor, respectively. Both models will give identical noise analysis results. The current source model ($i_{sense}$) will be used when carrying through the noise analysis due to its simplicity.

The motional resistor $R_x$, of a multiferroic sensor is given by [22]:

$$R_K = \frac{2t_{piezo}}{2\pi f_0 \times \text{Area} \times Q \times d_{31\_piezo}^2 E_{piezo}} \times \frac{1}{k_p^2} \tag{3}$$

where $k_p$ captures the reduction in the piezoelectric strain per applied electric field due to the stiffness of the attached magnetostrictive material, given by:

$$k_p = \frac{E_{piezo} t_{piezo}}{E_{magnetic} t_{magnetic} + E_{piezo} t_{piezo}} \tag{4}$$

The equivalent current thermal noise generator associated with the sensor motional resistance which represents the sensor thermal or Brownian noise:

$$\overline{i_{n-source}^2} = \frac{4kT}{R_K} \tag{5}$$

where k is the Boltzmann constant. Then the magnetic self-noise of the sensor is given by:

$$B_{n-sensor} = \frac{\sqrt{\frac{4kT}{R_K}}}{S} \tag{6}$$

where S is the sensitivity of the sensor in A/T given by (1). This represents the lowest magnetic noise floor achievable by the sensor when interfaced with noiseless readout circuits. The thermal noise of the sensor is then:

$$i_{n-source} = \sqrt{\frac{4kT\pi \times f_0 \times \text{Area} \times Q \times d_{31\_piezo}^2 E_{piezo} \times k_p^2}{t_{piezo}}} \tag{7}$$

The sensor magnetic noise floor at the sensor's resonance frequency when interfaced with noiseless electronics is then given by:

$$B_{n-sensor} = \frac{i_{n-source}}{S} = \frac{\mu_0}{\Delta d_{33\_magnetic} \times G_{FC}} \times \frac{k_p}{k_M} \sqrt{\frac{kT}{\pi f_0 \times \text{Area} \times Q \times t_{piezo} \times E_{piezo}}} \tag{8}$$

$$\text{Since, } \frac{k_p}{k_M} = \frac{E_{piezo} t_{piezo}}{E_{magnetic} f_{magnetic}}:$$

$$B_n = \frac{\mu_0 \sqrt{\frac{kT \times t_{piezo} \times E_{piezo}}{\pi f_0 \times \text{Area} \times Q}}}{\Delta d_{33\_magnetic} \times G_{FC} \times E_{magnetic} t_{magnetic}} \tag{9}$$

V. Sensor Readout Design

A. Architecture

Figures 27A, 27B, 27C:
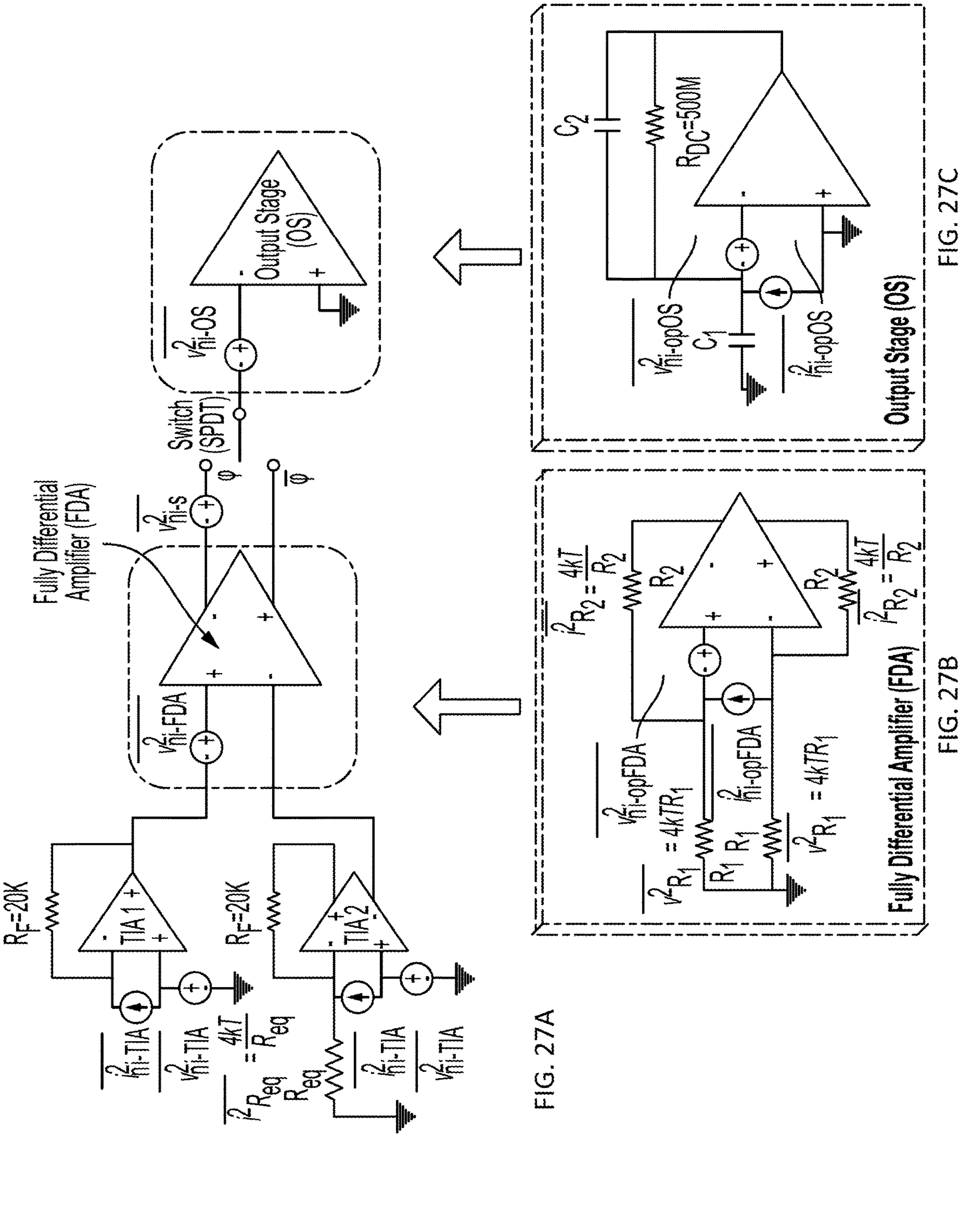
FIG. 27: The readout including all noise generators. (a) Input-referred noise model for each stage in the close-loop configuration. (b) (c) Critical noise generators in FDA and OS stages.

The readout block diagram for the magnetoelectric sensor is shown in FIG. 27. Before the demodulation, the front-end TIA is chosen to be LMH32401 from Texas Instruments [41], which gives differential outputs and 20 kΩ transimpedance gain. This component is chosen for the low input-referred current noise of 2.5 pA/√Hz averaged between 1 MHz and 20 MHz. Besides this, the 1.5 $V_{PP}$ output voltage swing allows the TIA to handle as large as 75 $\mu A_{PP}$ input current, which corresponds to a 97 $mV_{PP}$ modulation voltage for a sensor with a motional impedance of 1.3 kΩ. In addition, this TIA maintains good current noise performance when driven by a low input impedance. A second TIA is used for the modulation noise cancellation, which is described in the Modulation Noise Canceling section below. Demodulation is achieved using a single-pole-double-throw (SPDT) switch STG719 from STMicroelectronics chosen for its fast switching speed [42]. The aliasing noise from the input and the power supply can be less significant by adding an additional gain stage using THS4131 from Texas Instruments [43] before the demodulator. THS4131 is a low noise, high bandwidth, fully differential amplifier (FDA). This gain stage is set to 10.7 V/V with the bandwidth of 20 MHz to optimize the total input-referred noise. After the switch, the demodulated signal is further amplified by an OPA2320 from Texas Instruments [44], which also filters the high frequency and DC components introduced by the down conversion mixing. OPA2320 is a low noise, large gain-bandwidth-product CMOS amplifier, which allows a gain as large as 454 V/V while maintaining a bandwidth which is larger than 1 kHz. This CMOS amplifier has low input bias current allowing a larger feedback resistor when compared to alternative bipolar junction transistors (BJT) amplifiers. The two TIAs consume 198 mW, the FDA amplifier consumes 218 mW, and the output stage (OS) consumes 24 mW. The total power consumption of the readout electronics is 440 mW.

B. Circuit Noise Analysis

The transimpedance gain of the TIA, $G_{TIA}$, and the gain provided by the FDA, $G_{FDA}$, before demodulation, yields a total transimpedance gain of:

$$G_{RF} = G_{TIA} G_{FDA} \tag{10}$$

By performing the demodulation with a square wave at the output of the FDA:

$$V_{FDA+} \times sq(1, 0) - V_{FDA-} \times sq(0, 1) \tag{11}$$

where sq(1,0) is the square wave with the first half cycle as a 1 and the second half cycle as a 0, sq(0,1) is the square wave with 0 and 1 inversed.

sq(1,0) can be expressed as:

$$sq(1, 0) = \frac{1}{2}\left(\frac{4}{\pi}\sum_{m=1}^{\infty}\frac{\sin(2\pi(2m-1)f_0 t)}{2m-1} + \frac{1}{2}\right) \tag{12}$$

where m is a positive integer. For the down-conversion mixer, most higher frequency components will be filtered, then:

$$sq(1, 0) \cong \frac{1}{2}\left(\frac{4}{\pi}\sin(2\pi f_0) + \frac{1}{2}\right) \tag{13}$$

If $V_{FDA+}$=0.5 A sin(2π$f_{RF}$t), $V_{FDA-}$=−0.5 A sin(2π$f_{RF}$t) then:

$$V_{FDA} \times sq(1, 0) = \frac{A}{2\pi}\cos(2\pi(f_0 + f_{RF})t) - \frac{A}{2\pi}\cos(2\pi(f_0 - f_{RF})t) + \frac{A}{8}\sin(2\pi f_{RF}\tau) \tag{14}$$

where $f_0$−$f_{RF}$ is the demodulated low frequency, which is equal to the sensed magnetic field frequency, $f_s$. Going through the same process for the term $V_{FDA-}$×sq(0,1), after the switch, filtering the higher frequency components, from (11) and (14):

$$V_{FDA+}\times sq(1,0)-V_{FDA-}\times sq(0,1)\cong\frac{A}{\pi}\cos(2\pi(f_0-f_{RF})t) \quad (15)$$

Therefore, the demodulation will attenuate the signal by a factor of π if only considering the first order harmonic of the square wave.

The readout, including all the noise generators, is shown in FIG. 27. As shown in FIGS. 10B and 10C, the input-referred noise of the FDA and the OS with the feedback is related to the input-referred noise listed in the datasheets of THS4131 and OPA2320 [45]:

$$\overline{v_{ni-FDA}^2}=8kTR_1+\frac{8kTR_1^2}{R_2}+\overline{i_{ni-opFDA}^2}R_1^2+\overline{v_{ni-opFDA}^2}\left(\frac{R_1^2}{R_2^2}+1\right) \quad (16)$$

$$\overline{v_{ni-OS}^2}=\left(\frac{C_1+C_2}{C_1}\right)^2\overline{v_{ni-opOS}^2}+\frac{\overline{i_{ni-opOS}^2}}{(2\pi fC_1)^2} \quad (17)$$

where $$\overline{i_{ni-opFDA}^2}$$

and $$\overline{v_{ni-opFDA}^2}$$

are the input-referred current and voltage noise of the open loop amplifier THS4131.

$$\overline{i_{ni-opOS}^2}$$

and $$\overline{v_{ni-opOS}^2}$$

are the parameters of OPA2320. The noise from the 500 MΩ resistor $R_{DC}$ is insignificant when compared to the amplifier noise. The noise introduced by the switching can be denoted by $$\overline{v_{ni-s}^2}$$

at the input, which includes noise aliasing from the square wave demodulation.

If including the input-referred current noise of one TIA $$\overline{i_{ni-TIA}^2},$$

the input-referred current noise of the readout in this work, $$\overline{i_{ni-circuit}^2},$$

at the sensor interface is given in (18). If the open loop gain of the TIA is large enough, the following stages are insignificant compared to the input-referred voltage noise of the TIA. The input-referred voltage noise of the readout is given in (19). The noise power spectral density (PSD) for noise sources after the demodulation should be considered at the frequency of the measured magnetic field, while the PSD for noise sources prior to demodulation should be taken within the resonant band of the sensor.

$$\overline{i_{ni-circuit}^2}=\overline{i_{ni-TIA}^2}+\frac{\overline{v_{ni-FDA}^2}}{G_{TIA}^2}+\frac{\overline{v_{ni-s}^2}}{G_{RF}^2}+\frac{\overline{v_{ni-OS}^2}\pi^2}{G_{RF}^2} \quad (18)$$

$$\overline{v_{ni-circuit}^2}=\overline{v_{ni-TIA}^2} \quad (19)$$

C. Modulation Noise Cancelling

TABLE I

SUMMARY OF APPROACHES TO SCALE SENSOR NOISE

| Technique | Magnetic Noise Scaling when Limited by Circuit Current Noise[a] | Magnetic Noise Scaling when Limited by Circuit Voltage Noise | Magnetic Noise Scaling when Limited by Sensor Thermal Noise |
|---|---|---|---|
| Increased Modulation Depth of the Piezomagnetic Coefficient ($\Delta d_{33\_magnetic}$) | $\frac{1}{\Delta d_{33\_magnetic}}$ | $\frac{1}{\Delta d_{33\_magnetic}}$ | $\frac{1}{\Delta d_{33\_magnetic}}$ |
| Flux Concentrator Gain ($G_{FC}$) | $\frac{1}{G_{FC}}$ | $\frac{1}{G_{FC}}$ | $\frac{1}{G_{FC}}$ |
| Increase Thickness of Magnetostrictive Layer ($t_{magnetic}$) | $\frac{1}{t_{magnetic}}$ | $\downarrow^{b}$ | $\frac{1}{t_{magnetic}}$ |
| Increase in Device Quality Factor (Q) | $\frac{1}{Q}$ | 1 | $\frac{1}{\sqrt{Q}}$ |
| Increase in Device Area (Area) parallel | $\frac{1}{\text{Area}}$ | 1 | $\frac{1}{\sqrt{\text{Area}}}$ |

TABLE I-continued

SUMMARY OF APPROACHES TO SCALE SENSOR NOISE

| Technique | Magnetic Noise Scaling when Limited by Circuit Current Noise[a] | Magnetic Noise Scaling when Limited by Circuit Voltage Noise | Magnetic Noise Scaling when Limited by Sensor Thermal Noise |
|---|---|---|---|
| Increase in Device Area (Area) series | 1 | $\frac{1}{\text{Area}}$ | $\frac{1}{\sqrt{\text{Area}}}$ |
| Increase in Device Operating Frequency ($f_0$) change the output current | $\frac{1}{f_0}$ | 1 | $\frac{1}{\sqrt{f_0}}$ |
| Increase Piezoelectric Coefficient ($d_{31\_piezo}$) | $\frac{1}{d_{31\_piezo}}$ | $d_{31\_piezo}$ | 1 |

[a]This work

[b] $\frac{1}{t_{magnetic}(E_{magnetic}t_{magnetic}+E_{piezo}t_{piezo})}$ according to (25)

Figure 26:
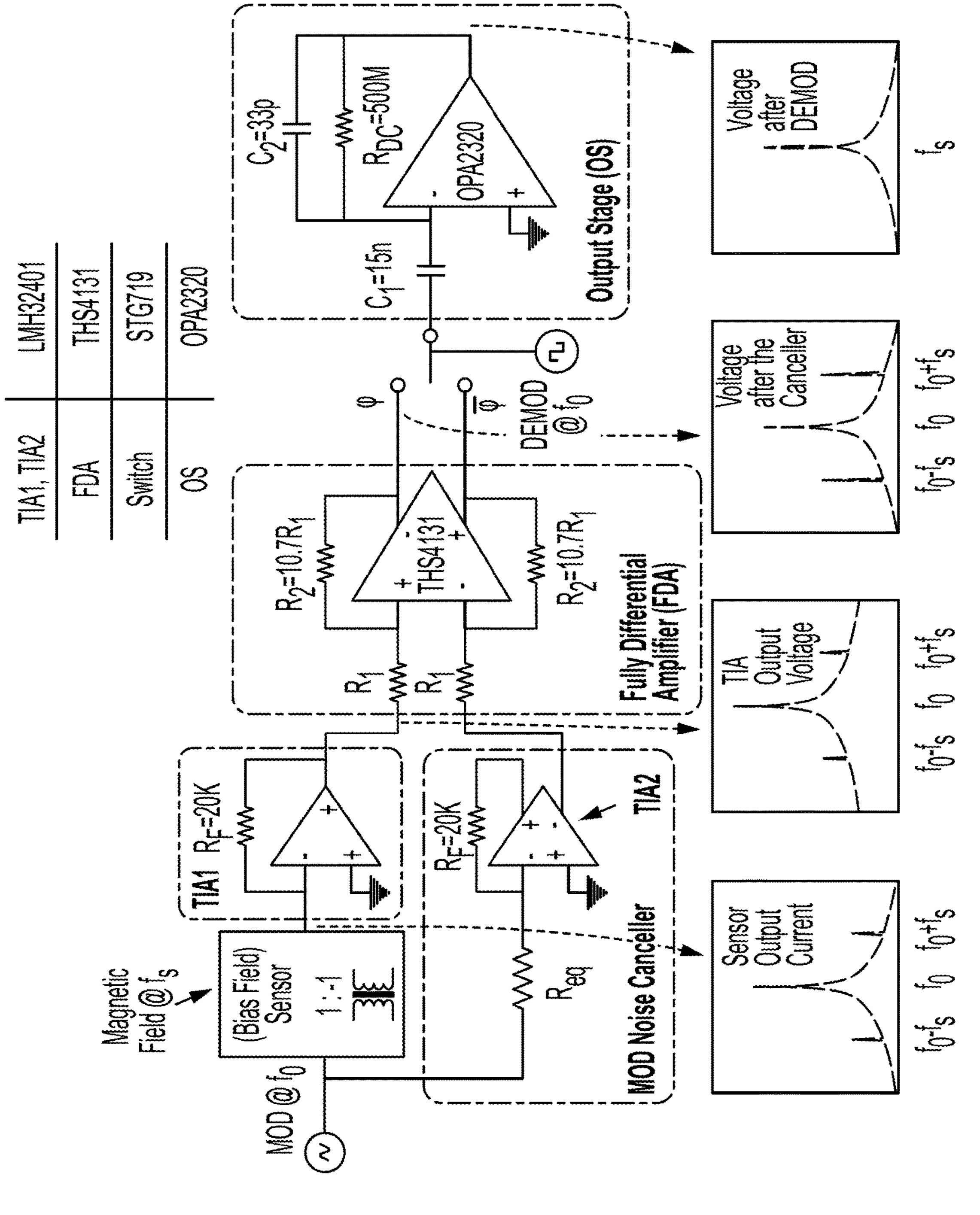
FIG. 26: Schematic of the magnetoelectric sensor readout including Amplification, Demodulation and Modulation noise cancelling.

During the practical measurement, the noise which is contributed by the voltage source used for the modulation is nontrivial. For example, 30 $mV_{PP}$ generated from the function generator 33522B introduces a noise of 10.7 nV/√Hz, which is equivalent to 8.2 pA/√Hz for the sensor motional impedance of 1.3 kΩ and grows linearly for higher modulation voltages. Therefore, a second TIA is introduced in the MOD noise canceller which creates a replica copy of the modulation noise and modulation voltage for later subtraction, as shown in FIG. 26. $R_{eq}$ connected at the input of the second TIA is chosen to match the magnetoelectric sensor motional impedance $R_x$, which creates a replicated current due to the modulation voltage and the modulation noise. As the sensor produces a 180° phase shift of the modulation current and noise at its output, inversed outputs of TIA1 and TIA2 are chosen respectively to enable reduction of the modulation signal and noise by the FDA. Also a transformer is connected at the output of each TIA to maintain the transimpedance gain as 20 kΩ even for a single-ended output [39]. This architecture enables a large cancellation of the modulation, and the attenuation of the modulation voltage reduces the dynamic range requirements on the FDA and demodulator. The noise comparison will be shown in the measurement section below. However, the limitation for the designed canceller arises from the different phase shift for the sidebands at different frequencies due to the high-Q sensor response. For the sensor device in this paper, there is an additional 15° phase shift for the sidebands 1 kHz away from the resonant frequency, which limits the maximum cancellation of the noise to 12 dB. For sidebands that are closer to the resonant frequency, the cancellation of the noise is improved. Also, additional noise of the second TIA and $R_{eq}$ will be added to the input-referred current noise of the readout as shown in (20), while the input-referred voltage noise is still dominated by the TIA that is connected to the sensor.

$$\overline{i_{ni-circuit}^2} = \frac{4kT}{R_{eq}} + 2\overline{i_{ni-TIA}^2} + \frac{\overline{v_{ni-FDA}^2}}{G_{TIA}^2} + \frac{\overline{v_{ni-s}^2}}{G_{RF}^2} + \frac{\overline{v_{ni-OS}^2}\pi^2}{G_{RF}^2} \tag{20}$$

$$\overline{v_{ni-circuit}^2} = \overline{v_{ni-TIA}^2} \tag{21}$$

VI. Magnetoelectric Sensor Integrated System Analysis

A. Noise Analysis

Figure 28:
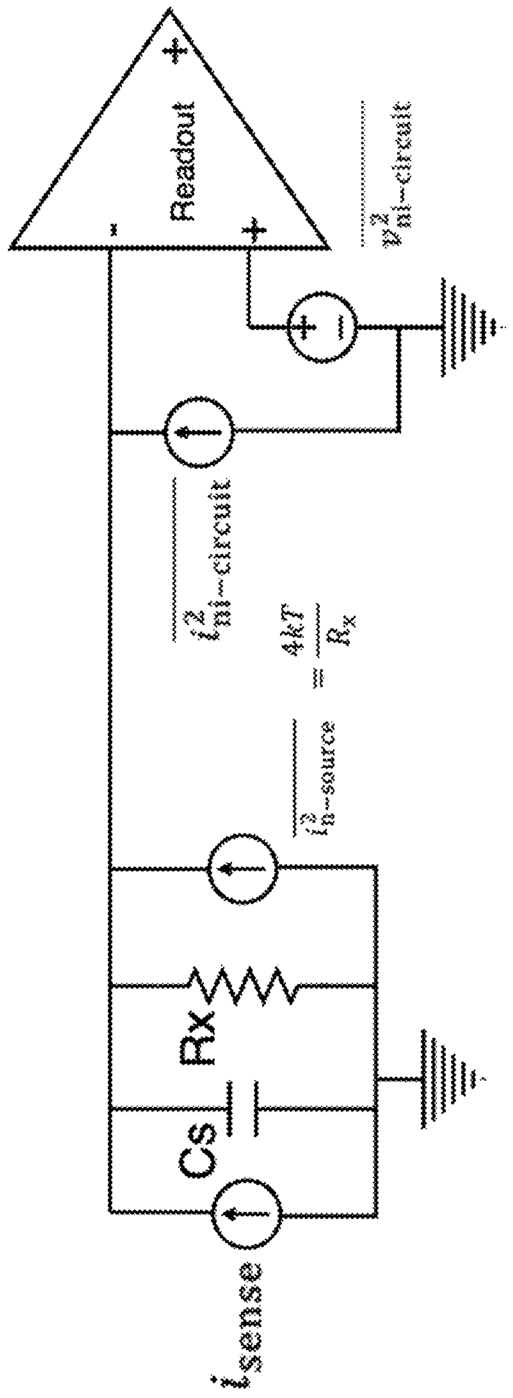
FIG. 28: Noise models at the interface of the sensor and the electronics when the sensor is operated at resonance.
Figure 29A:
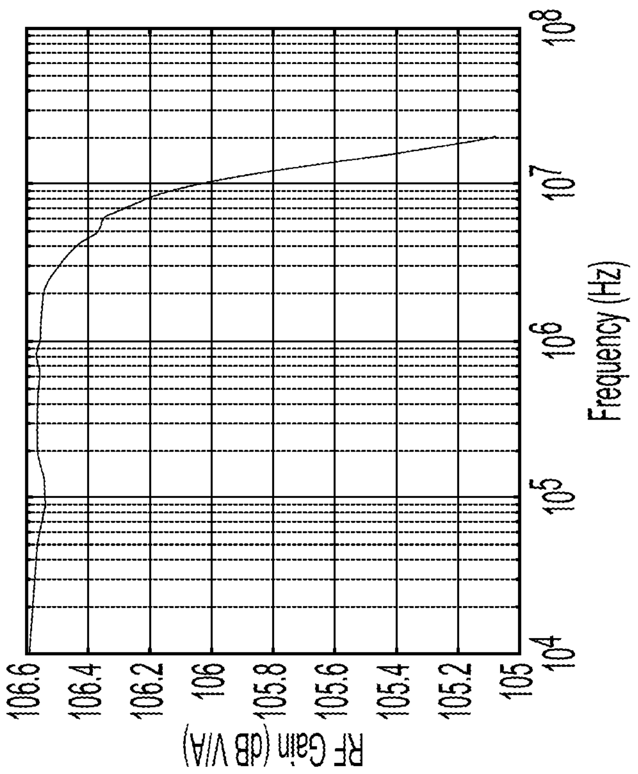
FIG. 29A: A transimpedance gain measured at the output of the FDA before the demodulation.
Figure 29B:
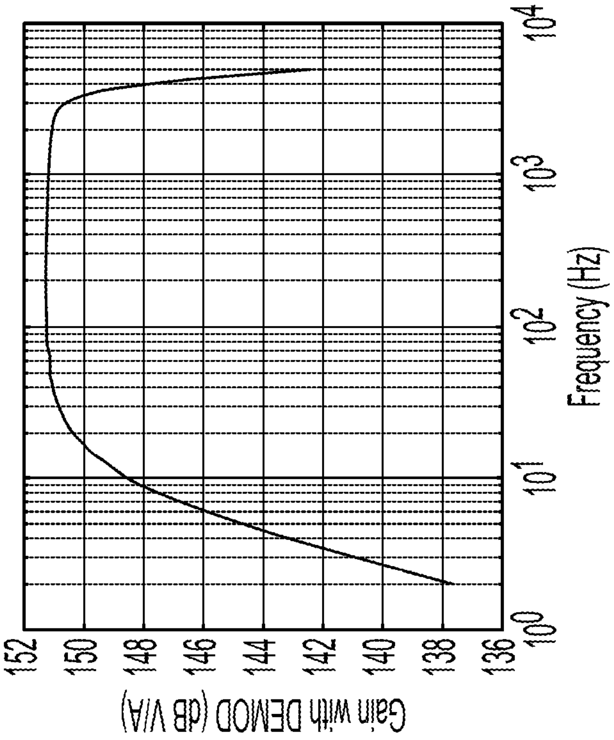
FIG. 29B: A transimpedance gain measured at the output of the OS after demodulation.

The noise analysis of the magnetically modulated ME sensor with a charge current amplifier has been performed in [20] previously. The noise analysis of the sensor system in this work is shown as follows, which is based on FIG. 28 with the input-referred current and voltage noise models of the readout circuit. When the readout circuit noise is introduced as $$\overline{i_{ni-circuit}^2}$$

and $$\overline{v_{ni-circuit}^2},$$

the noise floor of the sensor system in T/√Hz is given by:

$$B_{n-sensor} = \frac{\sqrt{\overline{i_{n-total}^2}}}{S} = \frac{\sqrt{\frac{4kT}{R_x} + \overline{i_{ni-circuit}^2} + \overline{v_{ni-circuit}^2}/R_x^2}}{S} \tag{22}$$

There are three cases. Firstly, if the total noise is dominated by the sensor noise, the noise floor of the sensor is given by (9). Secondly, if the total noise is dominated by the circuit noise, while the circuit noise is dominated by the input referred current noise, $$\overline{i_{ni-circuit}^2},$$

the noise floor of the sensor system is approximately:

$$B_{n-sensor} = \frac{\sqrt{\overline{i_{ni-circuit}^2}}}{S} \tag{23}$$

The circuit readout reported in this work is input-referred current noise limited. As reported in the datasheet of LMH32401, the total input-referred current noise is not significantly changed for input impedances of 3 pF from 100 kHz to 10 MHz, corresponding to a source impedance of 53 kΩ at 100 kHz and 530Ω at 10 MHz. Therefore, the voltage noise of the chosen TIA is insignificant compared to the current noise. Thus, we expect $$\overline{i^2_{ni-circuit}} > \overline{v^2_{ni-circuit}} / R_x^2$$

for the sensor source impedance of 1.3 kΩ. Thirdly, if the total noise is dominated by the circuit noise, while the total circuit noise is dominated by the input-referred voltage noise generator, then the total current noise is approximately:

$$\overline{i^2_{n-total}} = \frac{\overline{v^2_{ni-circuit}}}{R_x^2} \tag{24}$$

From (1), (3), (22), (24), the noise floor of the sensor system is given by:

$$B_{n-sensor} = \frac{\sqrt{\overline{v^2_{ni-opTIA}}}\,\mu_0 d_{31\_piezo} E_{piezo}{}^2 t_{piezo}}{2 \times \Delta d_{33\_magnetic} \times G_{FC}} \times \frac{1}{E_{magnetic} t_{magnetic} (E_{magnetic} t_{magnetic} + E_{piezo} t_{piezo})} \tag{25}$$

B. Scaling of the Noise

Based on (9), (23) and (25), the scaling of the noise of the sensor system is summarized in Table I.

The critical parameters for magnetostrictive materials in high performing magnetostrictive sensors are the change in strain (ε) per change in magnetic field (H), or the piezomagnetic coefficient:

$$d_{33\_magnetic} = \frac{d\epsilon}{dH} \tag{26}$$

and the Young's Modulus, $E_{magnetic}$. A larger possible improvement, comes from the potential for the piezomagnetic coefficient to be modulated much more strongly within the stress limit before the resonating sensor device becomes nonlinear and the noise floor dramatically increases [22]. This term is given by:

$$\Delta d_{33\_magnetic} = d_{33\_magnetic}(\sigma = \sigma_{Max}) - d_{33\_magnetic}(\sigma = \sigma_{Min}) \tag{27}$$

where $\sigma_{Min}$ and $\sigma_{Max}$ represent the maximum and minimum stress experienced by the magnetostrictive material as it is subjected to a time varying stress modulation. This will improve the sensitivity of the sensor directly, and subsequently improve the noise performance [22].

As flux concentration directly increases the magnetic field seen by the magnetostrictive material, the sensor sensitivity, $B_{n-sensor}$ in A/T, can be improved. The increase in the magnetic field is simply the gain of the flux concentrator, $G_{FC}$. While the flux concentrator contributes thermomagnetic noise, this contribution is well below the limit of detection [46]-[48], which is in line with our measurement of the sensor as shown in FIG. 23. Since flux concentration has no impact on the circuit noise or the sensor thermal noise, the magnetic noise floor simply decreases by the flux concentrator gain as described in (22).

The examination of (1), (9), (23) and (25) reveals that a key opportunity for improving the magnetic noise floor lies in increasing the thickness of the magnetostrictive layer.

The sensitivity of a multiferroic sensor, s, scales linearly with device quality factor Q as shown in (1). Therefore, when the total noise is dominated by circuit current noise, a larger sensor Q factor results in a linear reduction in the magnetic noise floor as seen in (23). Since the thermal noise of the sensor itself increases with √Q, the magnetic noise floor of the sensor itself, when interfaced with noiseless electronics, decreases with √Q as shown in (9). However, if the input-referred voltage noise is dominating the circuit noise when interfaced with the sensor, as shown in (25), the noise floor of the sensor system is not related to the device quality factor.

The sensitivity of a multiferroic sensor scales linearly with device area as shown in (1). Since the thermal noise of the sensor itself increases with √Area, the magnetic noise floor of the sensor, when interfaced with noiseless electronics, decreases with √Area as shown in (9). If the sensors are connected in parallel, the current will be multiplied, which increases the current sensitivity and the magnetic noise floor gets linearly reduced based on (23) if the circuit noise is dominated by electronics current noise. If the circuit noise is dominated by the input-referred voltage noise, the parallel connected sensors would decrease the motional impedance and the magnetic noise floor remains the same. If the sensor area is increased by connection of piezoelectric capacitors in series, the output current of the sensor is not changed but the motional impedance increases. This reduces the impact of the input-referred voltage noise generator on the total current noise in accordance with (24) and reduces the sensor noise floor as shown in Table I.

Equation (1) shows that the current sensitivity of a multiferroic sensor scales linearly with device resonant frequency, $f_0$, and the motional impedance scales as the inverse of $f_0$ as shown in (3). Since the thermal noise of the sensor itself increases with $\sqrt{f_0}$ due to the reduction in $R_x$, the magnetic noise floor of the sensor itself, when interfaced with noiseless electronics, decreases with $\sqrt{f_0}$ as shown in (9). Based on (23) and (25), the magnetic noise floor decreases linearly or is unaffected respectively in the two cases when the circuit noise is dominating.

When alloying AlN with Sc, both the piezoelectric coefficient and Young's Modulus are altered as the Sc concentration is increased [49]-[51]. Using $Al_{0.72}Sc_{0.28}N$, the sensitivity of the sensor in this work increases by 3.2 compared to previously reported AlN based sensors [22]. On one hand, this will provide a linear reduction in the magnetic noise floor when the noise is dominated by the circuit current noise according to (23). On the other hand, the magnetic noise floor will increase by $d_{31\_piezo}$ as shown in (25) in the case that the circuit noise is dominated by the voltage noise. Lastly, increasing the piezoelectric coefficient increases the sensor thermal noise and the sensor sensitivity by the same amount [52], [53]. Thus, once the device sensitivity is increased to the point that the device thermal noise dominates over the circuit noise, further increases in piezoelectric coefficient can only be utilized to reduce the power in the readout electronics, since lower power circuits often have higher noise due to the trade-off between the power and noise for transistors [45].

Finally, previous work has established the Duffing nonlinearity limits device performance by restricting the amplitude of the modulation signal that can be applied before the sensor goes into the nonlinear regime [22]. If a device that can be modulated at a higher amplitude while maintaining linear performance is developed, there will be a point where increasing modulation amplitude will result in an increase of magnetic noise. This noise increase would be the result of changes in magnetic domain states (e.g. hysteresis) which are caused by the modulation and result in thermal noise [54].

VII. Circuit Measurement Results

A. Amplification and Demodulation Performance

To measure the noise and the gain of the readout circuit, a 1.3 kΩ resistor at the input of the TIA is utilized to mimic the sensor motional impedance. Only one TIA is used to characterize the gain and the noise of the readout. FIG. 31 shows the transimpedance gain without and with demodulation. As shown in (a), the RF gain at the output of the FDA is $G_{RF}=G_{TIA}G_{FDA}=20\ k\Omega\times10.7=2.14\times10^5\Omega$ within the bandwidth, and the readout can be used for sensors with resonant frequencies below 20 MHz. The red curve in (b) shows with the demodulation at 7 MHz, the gain in the mid-band is around $3.67\times10^7\Omega$, with around 2.64 V/V gain attenuation by the demodulation which is around R derived in (15). To sense lower frequency bio-signals from heart, brain and muscle, the high-pass cut-off frequency of the sensing magnetic field should be low. This parameter in the reported readout is set to 10 Hz, which is defined by $$\frac{1}{2\pi C_2 R_{DC}}$$

and the low-pass cut-off frequency is 3.9 kHz, which is limited by the OPA2320 inner pole. The high-pass cut-off frequency can be tuned by changing $C_2$ and $R_{DC}$ if necessary to access lower frequency bio-magnetic signals.

Figure 30:
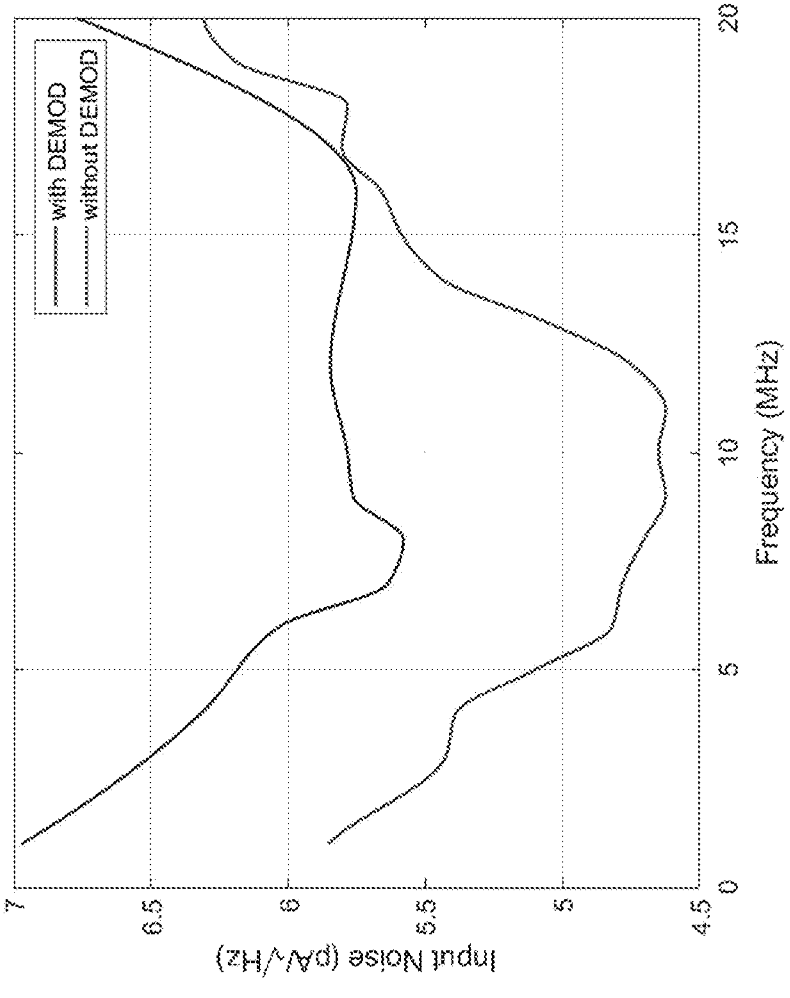
FIG. 30: Input-referred current noise measured at the output of the OS and at the output of the FDA.

FIG. 30 shows the input-referred current noise with and without demodulation with the 1.3 kΩ input resistor grounded. Without demodulation, the noise is dominated by the front-end TIA with a 1.3 kΩ source resistor, with the minimum at 9 MHz of 4.6 pA/√Hz. This is consistent with the theoretical noise floor at room temperature according to the datasheet [41]:

$$\sqrt{\overline{i^2_{ni-circuit}} + \frac{4\,kT}{R_x}} = \sqrt{(2.5\ \mathrm{pA})^2 + \frac{4\,kT}{1.3\ \mathrm{k\Omega}}} = 4.3\ \mathrm{pA}/\sqrt{\mathrm{Hz}} \tag{28}$$

The noise at lower frequencies is larger, which is consistent with the LMH32401 input current characterization. The noise at higher frequencies is larger because of the lower RF gain at higher frequencies. With demodulation, the DEMOD clock is swept and the noise at 1 kHz is integrated. In theory, the noise should be dominated by the TIA even when introducing the demodulator and the OS. However, during the measurement, aliased noise is introduced by the demodulation, which causes some discrepancy between the theory and the measurement as shown in FIG. 30. As the FDA stage has 20 MHz bandwidth, at lower demodulation frequencies, the aliased noise is larger. When the demodulation approaches 20 MHz, the noise with demodulation is close to the value without demodulation. As shown in the blue curve in FIG. 30, the demodulator introduces aliased noise, with the minimum noise of 5.58 pA/√Hz at 8 MHz.

TABLE II

COMPARISON OF MAGNETIC FIELD SENSORS

| | Noise Spectral Density (pT/√Hz) | Bandwidth (kHz) | Sensor Volume ($cm^3$) | Power (mW) |
|---|---|---|---|---|
| Commercially available sensors: | | | | |
| Magneto-inductive [55] | 1200 | 0.8 | 0.03 | >0.210 |
| Hall [56] | 130,000 | 17 | 0.01 | 34 |
| SERF [17] | $1\times10^{-2}$ at 3-100 Hz | 0.1 | 5 | 5000 |
| Flux Gate [57] | 1500 | 47 | 0.16 | 19.8 |
| State-of-the-art research sensors: | | | | |
| SQUID [11], [12], [58] | $1.2\times10^{-3}$ at 10 Hz | 1.0 | Not reported[a] | Not reported[a] |
| Non-modulated ME [18] | 0.25 at 958 Hz | 0.004 | 0.18 | Not reported |
| Magnetically modulated ME [20] | 4000 at 0.1 Hz | | 4 | Not reported |
| | 200 at 100 Hz | 1.0 | | |
| Surface acoustic wave [59] | 2400 at 10 Hz | 1200 | Not reported | 100[b] |
| Delta-E effect sensor [60] | 140 at 20 Hz | 0.03 | 0.03 | Not reported |
| Piezo-modulated ME [23] | 5000 at 2 Hz | 0.1 | 0.02 | Not reported |
| Piezo-modulated ME [19] | 20 at 10 Hz | 6.2 | 0.61 | Not reported |
| This work Piezo-modulated ME PCB | Before demodulation: 59.5 at 1 kHz After demodulation: 98.5 at 1 kHz | 3.4 | 0.125[c] | 440 |
| Projected ASIC | ~60 | 3.4 | 0.125[c] | 5.9 |

[a]Requires cryogenic cooling
[b]Sensor only
[c]Sensor with integrated DC magnetic bias circuitry

B. Improvement from Modulation Noise Cancelling

Figure 31A:
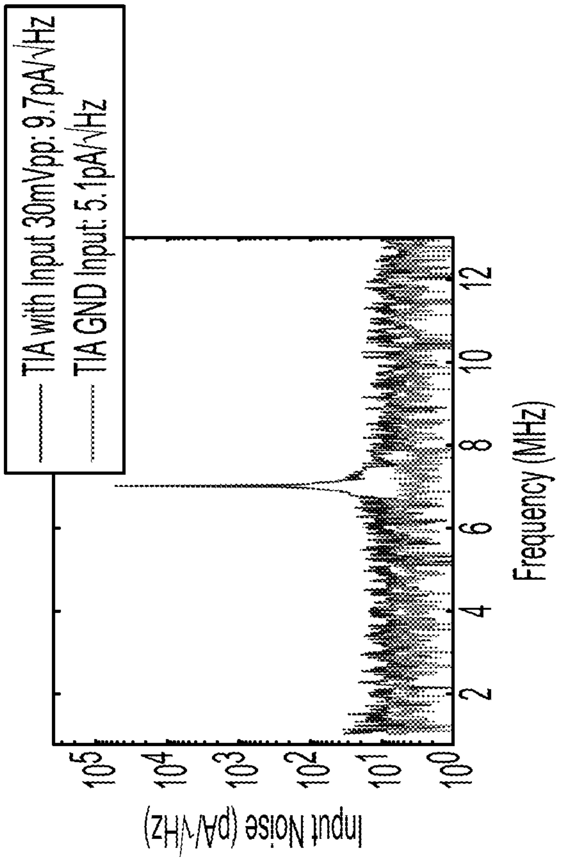
FIG. 31A: Diagram of input-referred noise with noise measured at the output of one TIA.
Figure 31B:
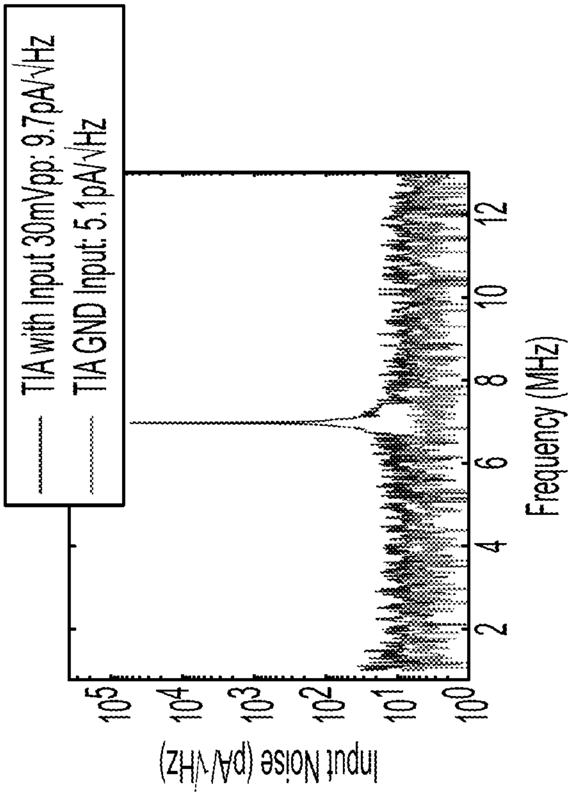
FIG. 31B: Diagram of input-referred noise with noise measured at the output of the FDA, with one or two TIAs connected.
Figure 31C:
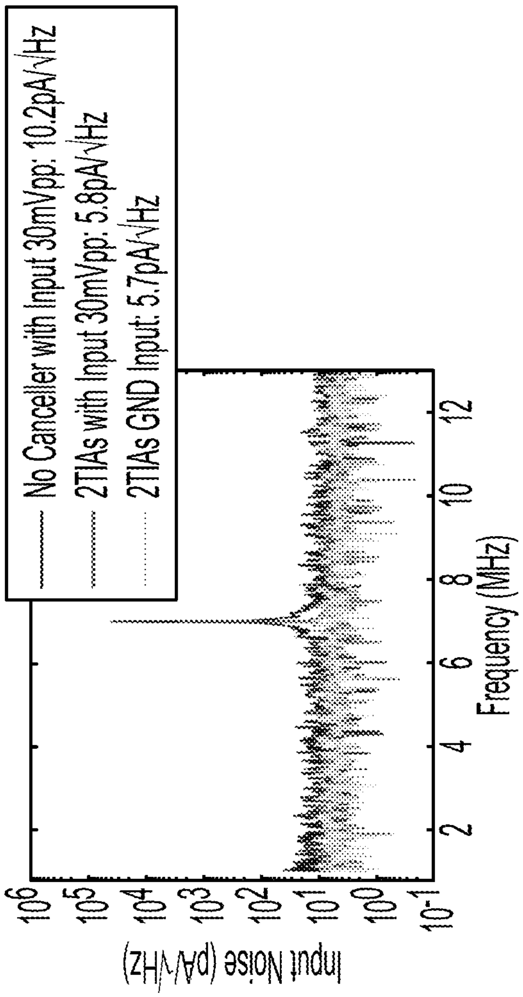
FIG. 31C: Diagram of input-referred noise with noise measured at the output of the FDA.
Figure 31D:
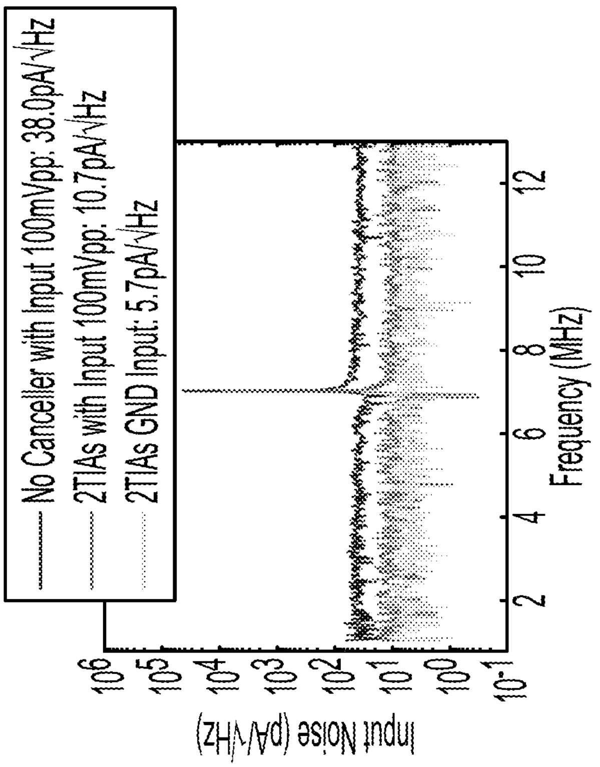
FIG. 31D: Diagram of input-referred noise with noise measured at the output of the FDA.

When the modulation voltage was connected to drive the sensor, which is represented by the $R_x$=1.3 kΩ resistor, additional noise was introduced when compared to when $R_x$ was electrically grounded. The canceller was introduced to reduce the noise coming from the modulation voltage, which is supported by the noise spectrum shown in the FIG. 31. The function generator Keysight 33522B drives $R_x$ at 7 MHz functioning as the modulation voltage. FIG. 31A shows that 30 $mV_{PP}$ from the function generator, which is within the linear range of the TIA, increases the noise from 5.1 pA/√Hz to 9.7 pA/√Hz. FIG. 31B demonstrates that adding the canceller increases the circuit noise from 4.5 pA/√Hz to 5.7 pA/√Hz. FIGS. 31C and 31D demonstrate that adding the canceller reduces the noise, as well as attenuates the modulation input, which reduces the dynamic range requirements for the FDA and switch. When driving at 30 $mV_{PP}$, the input-referred noise is reduced from 10.2 pA/√Hz to 5.8 pA/√Hz when utilizing the canceller. Since the sensor sensitivity is increased with increasing modulation voltage [22] there is a tradeoff between sensitivity and modulation induced circuit noise that results in an optimum sensor noise performance for a modulation drive of 100 $mV_{PP}$. At this modulation voltage the cancellation reduces the circuit noise from 38 pA/√Hz to 10.7 pA/√Hz as shown in FIG. 31D.

VIII. Sensor and Readout Circuitry Performance

Figure 32:
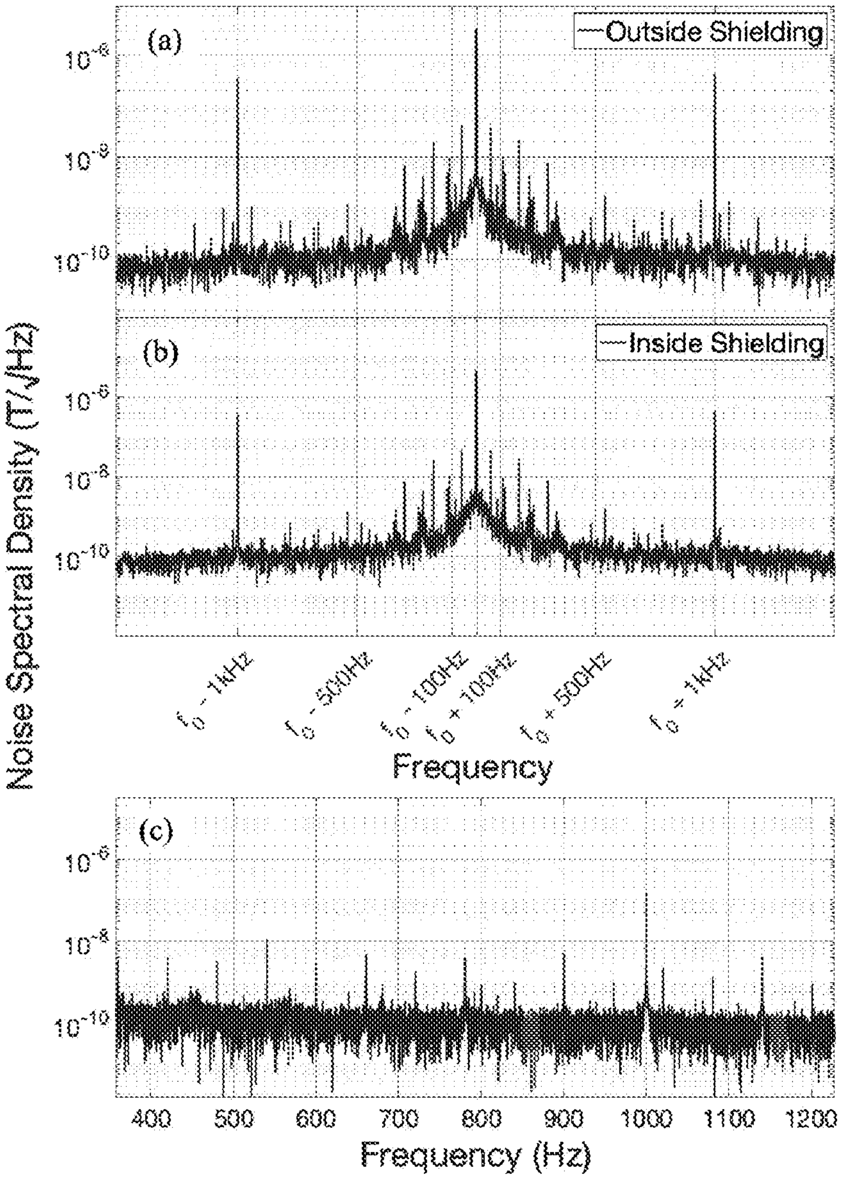
FIG. 32A: Diagram of noise spectral density for a device with flux concentrators with full amplification and cancelation circuitry without the demodulation excited by a 1 kHz 533 $nT_{RMS}$ magnetic field taken outside of the magnetic shielding chamber.
FIG. 32B: Diagram of noise spectral density for the device with flux concentrators with full amplification and cancelation circuitry without demodulation excited by a 1 kHz 533 $nT_{RMS}$ magnetic field and taken inside of the magnetic shielding chamber.
FIG. 32C: Diagram of Sensor noise floor with the same experimental setup as FIGS. 32A and 32B with the demodulation.

To obtain an absolute noise measurement of the system, the sensor and readout circuitry were placed in a three-layer MuMetal magnetic shielding chamber to reduce the effects of environmental and equipment noise [61]. The response of the device with flux concentration and the improved readout circuitry is shown in FIG. 32. The measurements in FIGS. 32A and 32B were taken before the demodulation with the modulation noise canceller for the 1 kHz excitation field of 533 $nT_{RMS}$. FIG. 32A was taken outside the magnetic shielding in an ambient environment and FIG. 32B was taken inside the magnetic shielding. The noise spectral density at 1 kHz is 59.5 pT/√Hz. With the same experimental setup, the result after the demodulation is shown in FIG. 32C, yielding a noise spectral density at 1 kHz of 98.5 pT/√Hz.

Additionally, the sensitivity at RF of the sensor alone is 0.707 A/T. When analyzed in an open circuit configuration, as is traditionally reported for multiferroic sensors, the sensor impedance of 1.3 kΩ results in a sensitivity of 919.1 V/T. Once demodulated, a total sensor system sensitivity of 7.4 MV/T is observed.

IX. Conclusion

This study describes the integration of a FeCo—Hf/AlScN based magnetometer with additional flux concentration and low-noise circuitry to achieve a bandwidth of 10 Hz-3.9 kHz and a noise spectral density at 1 kHz of 59.5 pT/√Hz before demodulation and 98.5 pT/√Hz after demodulation. The total power consumption of the sensor system is 440 mW. The addition of flux concentrators increased the sensitivity of the device by 25 times without increasing the noise floor or decreasing the bandwidth. The modulation noise cancellation circuitry decreases the noise by another 4-fold. The package volume of 0.125 $cm^3$ reflects the projected package volume with permanent magnets used to bias the FeCo—Hf material and once the circuitry is implemented as an ASIC. Table II shows the magnetometer outlined in this work compared to other sensors in terms of noise spectral density, bandwidth, volume, and power consumption. An ASIC implementation of the PCB electronics is currently being implemented with a projected power consumption of 5.9 mW for nearly identical noise performance. When realized, and with the improvements in noise reported in this work, low power on-body sensing of biopotentials (e.g. Magnetocardiography) will be possible due to the exceptional combination of noise spectral density, size, and power consumption of the reported strain modulated multiferroic sensing system. In addition to evaluating bio-magnetic signals, the performance of the sensor should be evaluated in non-stationary environments. In Table I, a clear path for lowering the limit of detection is outlined. The thickness of the magnetostrictive material scales linearly with sensitivity. Additionally, softer magnetic materials that are more sensitive to stress, such as iron gallium (FeGa) and iron gallium boron (FeGaB), promote a deeper modulation of the piezomagnetic coefficient. These changes to the magnetostrictive material used will improve the sensor system noise performance for sensing the smaller magnetic fields in magnetoencephalography, magnetoneurography, and magnetomyography applications.

References

[1] J Vrba and S E Robinson, "SQUID sensor array configurations for magnetoencephalography applications," *Supercond. Sci. Technol*., vol. 15, no. 9, p. R51, August 2002, doi: 10.1088/0953-2048/15/9/201.

[2] E. Elzenheimer, H. Laufs, T. Sander-Thammes, and G. Schmidt, "Magnetoneurograhy of an Electrically Stimulated Arm Nerve," *Usability Magnetoelectric ME Sens. Magn. Meas. Peripher. Arm Nerves*, vol. 4, no. 1, pp. 363-366, 2018, doi: 10.1515/cdbme-2018-0087.

[3] D. Cohen and E. Givler, "Magnetomyography: magnetic fields around the human body produced by skeletal muscles," *Appl. Phys. Lett*., vol. 21, no. 3, pp. 114-116, 1972, doi: 10.1063/1.1654294.

[4] S. Zuo, H. Heidari, D. Farina, and K. Nazarpour, "Miniaturized Magnetic Sensors for Implantable Magnetomyography," *Adv. Mater. Technol*., vol. 5, no. 6, May 2020, doi: 10.1002/admt.202000185.

[5] Y. Uchikawa and M. Kotani, "Measurement of Magnetic Field Produced from the Human Body," *IEEE Transl. J. Magn. Jpn*., vol. 7, no. 8, pp. 600-607, August 1992, doi: 10.1109/TJMJ.1992.4565462.

[6] E. Elzenheimer, H. Laufs, W. Schulte-Mattler, and G. Schmidt, "Magnetic Measurement of Electrically Evoked Muscle Responses With Optically Pumped Magnetometers," *IEEE Trans. Neural Syst. Rehabil. Eng*., vol. 28, no. 3, pp. 756-765, March 2020, doi: 10.1109/TNSRE.2020.2968148.

[7] M. Pannetier-Lecoeur, L. Parkkonen, N. Sergeeva-Chollet, H. Polovy, C. Fermon, and C. Fowley, "Magnetocardiography with sensors based on giant magnetoresistance," *Appl. Phys. Lett*., vol. 98, no. 15, p. 153705, April 2011, doi: 10.1063/1.3575591.

[8] U. Leder et al., "High frequency intra-QRS signals in idiopathic dilated cardiomyopathy.," *Biomed. Tech. (Berl)*, vol. 47, no. 5, pp. 117-123, May 2002, doi: 10.1515/bmte.2002.47.5.117.

[9] C. Granata, A. Vettoliere, and M. Russo, "An Ultralow Noise Current Amplifier Based on Superconducting Quantum Interference Device for High Sensitivity Applications," *Rev. Sci. Instrum*., January 2011, doi: 10.1063/1.3521657.

[10] J. Lenz and A. S. Edelstein, "Magnetic Sensors and Their Applications," *IEEE Sens*., vol. 6, no. 3, 2006, doi: 10.1109/JSEN.2006.874493.

[11] D. Murzin et al., "Ultrasensitive Magnetic Field Sensors for Biomedical Applications," *Sensors*, vol. 20, no. 6, March 2020, doi: 10.3390/s20061569.

[12] K. Sternickel and A. I. Braginski, "Biomagnetism using SQUIDs: status and perspectives," *Supercond. Sci. Technol*., vol. 19, no. 3, p. S160, February 2006, doi: 10.1088/0953-2048/19/3/024.

[13] H. B. Dang, A. C. Maloof, and M. V. Romalis, "Ultrahigh sensitivity magnetic field and magnetization measurements with an atomic magnetometer," *Appl. Phys. Lett*., vol. 97, no. 15, October 2010, doi: 10.1063/1.3491215.

[14] Y. Wang et al., "Optimized gas pressure of an Rb vapor cell in a single-beam SERF magnetometer," *Opt. Express*, vol. 30, no. 1, pp. 336-348, January 2022, doi: 10.1364/OE.447456.
[15] J. Li et al., "SERF Atomic Magnetometer-Recent Advances and Applications: A Review," *IEEE Sens. J.*, vol. 18, no. 20, pp. 8198-8207, doi: 10.1109/jsen.2018.2863707.
[16] Y. Yang et al., "A new wearable multichannel magnetocardiogram system with a SERF atomic magnetometer array," *Sci. Rep.*, vol. 11, no. 1, March 2021, doi: 10.1038/s41598-021-84971-7.
[17] "QuSpin. Inc." http://www.quspin.com
[18] S. Salzer et al., "Tuning fork for noise suppression in magnetoelectric sensors," *Sens. Actuators Phys.*, vol. 237, pp. 91-95, January 2016, doi: 10.1016/j.sna.2015.10.040.
[19] E. Elzenheimer et al., "Investigation of Converse Magnetoelectric Thin-Film Sensors for Magnetocardiography," *IEEE Sens. J.*, vol. 23, no. 6, pp. 5660-5669, March 2023, doi: 10.1109/JSEN.2023.3237910.
[20] X. Zhuang et al., "Evaluation of Applied Axial Field Modulation Technique on ME Sensor Input Equivalent Magnetic Noise Rejection," *IEEE Sens. J.*, vol. 11, no. 10, pp. 2266-2272, October 2011, doi: 10.1109/JSEN.2011.2131647.
[21] C. Sun et al., "Low-Frequency Magnetic Field Detection Using Magnetoelectric Sensor With Optimized Metglas Layers by Frequency Modulation," *IEEE Sens. J.*, vol. 22, no. 5, pp. 4028-4035, March 2022, doi: 10.1109/JSEN.2022.3143350.
[22] M. D'Agati et al., "High-Q Factor, Multiferroic Resonant Magnetic Field Sensors and Limits on Strain Modulated Sensing Performance," *J. Microelectromechanical Syst.,* 2022.
[23] P. Hayes et al., "Electrically modulated magnetoelectric sensors," *Appl. Phys. Lett.*, vol. 108, no. 18, May 2016, doi: 10.1063/1.4948470.
[24] M. Zaeimbashi et al., "Ultra-compact dual-band smart NEMS magnetoelectric antennas for simultaneous wireless energy harvesting and magnetic field sensing," *Nat. Commun.*, vol. 12, no. 1, p. 3141, May 2021, doi: 10.1038/s41467-021-23256-z.
[25] M. Crescentini, M. Bennati, M. Carminati, and M. Tartagni, "Noise Limits of CMOS Current Interfaces for Biosensors: A Review," *IEEE Trans. Biomed. Circuits Syst.*, vol. 8, no. 2, pp. 278-292, 2014, doi: 10.1109/TBCAS.2013.2262998.
[26] B. Razavi, "A 622 Mb/s 4.5 pA/spl radic/Hz CMOS transimpedance amplifier [for optical receiver front-end]," in 2000 *IEEE International Solid-State Circuits Conference. Digest of Technical Papers* (Cat. No. 00CH37056), 2000, pp. 162-163. doi: 10.1109/ISSCC.2000.839732.
[27] G. Royo, C. Sinchez-Azqueta, C. Gimeno, C. Aldea, and S. Celma, "Programmable Low-Power Low-Noise Capacitance to Voltage Converter for MEMS Accelerometers," *Sensors*, vol. 17, p. 67, 2016, doi: 10.3390/s17010067.
[28] M. Carla, L. Lanzi, E. Pallecchi, and G. Aloisi, "Development of an ultralow current amplifier for scanning tunneling microscopy," *Rev. Sci. Instrum.*, vol. 75, pp. 497-501, 2004, doi: 10.1063/1.1641159.
[29] M. Stubian, J. Bobek, M. Setvin, U. Diebold, and M. Schmid, "Fast low-noise transimpedance amplifier for scanning tunneling microscopy and beyond.," *Rev. Sci. Instrum.*, vol. 91 7, p. 74701, 2020.
[30] J. Rosenstein, V. Ray, M. Drndic, and K. L. Shepard, "Solid-state nanopores integrated with low-noise preamplifiers for high-bandwidth DNA analysis," in 2011 *IEEE/NIH Life Science Systems and Applications Workshop (LiSSA)*, 2011, pp. 59-62. doi: 10.1109/LISSA.2011.5754155.
[31] E. Culurciello, H. Montanaro, and D. Kim, "Ultralow Current Measurements With Silicon-on-Sapphire Integrator Circuits," *IEEE Electron Device Lett.*, vol. 30, no. 3, pp. 258-260, 2009, doi: 10.1109/LED.2008.2010564.
[32] B. Goldstein, D. Kim, J. Xu, T. K. Vanderlick, and E. Culurciello, "CMOS Low Current Measurement System for Biomedical Applications," *IEEE Trans. Biomed. Circuits Syst.*, vol. 6, no. 2, pp. 111-119, 2012, doi: 10.1109/TBCAS.2011.2182512.
[33] M. Bennati et al., "20.5 A Sub-pA ΔΣ Current Amplifier for Single-Molecule Nanosensors," in 2009 *IEEE International Solid-State Circuits Conference—Digest of Technical Papers,* 2009, pp. 348-349,349a. doi: 10.1109/ISSCC.2009.4977451.
[34] J. Zhang, N. Trombly, and A. Mason, "A low noise readout circuit for integrated electrochemical biosensor arrays," in *SENSORS,* 2004 *IEEE,* 2004, pp. 36-39 vol. 1. doi: 10.1109/ICSENS.2004.1426093.
[35] Z. Tang, G. Esteves, J. Zheng, and R. H. Olsson, "Vertical and Lateral Etch Survey of Ferroelectric AlN/Al1-xScxN in Aqueous KOH Solutions," *Micromachines*, vol. 13, no. 7, 2022, doi: 10.3390/mi13071066.
[36] T. Mion et al., "The Effect of Hf Doping on Piezomagnetic Properties of FeCo films for Magnetoelectric Heterostructure Devices," *Appl. Phys. Lett.*, In preparation.
[37] Magnetic Shield Corp., "MuMetal Fully Annealed Foil." [Online]. Available: www.magnetic-shield.com
[38] X. Wang, S. Sofronici, R. H. Olsson, and M. Allen, "In Preparation: Flux Concentrator Optimization for Micromachined AC Magnetic Field Sensors".
[39] Texas Instruments, "LMH32401RGTEVM Evaluation Module," 2019. https://www.ti.com/lit/ug/sbou233/sbou233.pdf?ts=1656379326394&ref_url=https%253A%252F%252Fwww.google.com%252F
[40] J. Su et al., "AlScN-based MEMS magnetoelectric sensor," *Appl. Phys. Lett.*, vol. 117, no. 13, p. 132903, 2020, doi: 10.1063/5.0022636.
[41] Texas Instruments, "LMH32401 450-MHz, Programmable Gain, Differential Output Transimpedance Amplifier," 2019. https://www.ti.com/lit/ds/sbos965b/sbos965b.pdf?ts=1656280944277
[42] STMicroelectronics, "Low voltage 4Ω SPDT switch," 2021. https://www.st.com/resource/en/datasheet/stg719.pdf
[43] Texas Instruments, "THS413x High-Speed, Low-Noise, Fully-Differential I/O Amplifiers," 2022. https://www.ti.com/lit/ds/slos318j/slos318j.pdf?ts=1656296252699
[44] Texas Instruments, "OPAx320x Precision, 20-MHz, 0.9-pA, Low-Noise, RRIO, CMOSOperational Amplifier WithShutdown." August 2010. [Online]. Available: https://www.ti.com/lit/ds/symlink/opa320.pdf?ts=1665035538189
[45] R. R. Harrison and C. Charles, "A low-power low-noise CMOS amplifier for neural recording applications," *IEEE J. Solid-State Circuits*, vol. 38, no. 6, pp. 958-965, 2003, doi: 10.1109/JSSC.2003.811979.
[46] X. Zhuang et al., "Expected Equivalent Magnetic Noise Spectral Density of Magnetoelectric Composites as Magnetic sensors: From Theory to Experiments," *Mater. Res. Soc. Symp. Proc.*, vol. 1398, January 2012, doi: 10.1557/opl.2012.767.

[47] S.-K. Lee and M. V. Romalis, "Calculation of magnetic field noise from high-permeability magnetic shields and conducting objects with simple geometry," *J. Appl. Phys.*, vol. 103, no. 8, p. 084904, April 2008, doi: 10.1063/1.2885711.

[48] J. Iivanainen, A. J. Makinen, R. Zetter, K. C. J. Zevenhoven, R. J. Ilmoniemi, and L. Parkkonen, "A general method for computing thermal magnetic noise arising from thin conducting objects," *J. Appl. Phys.*, vol. 130, no. 4, p. 043901, July 2021, doi: 10.1063/5.0050371.

[49] M. Akiyama, K. Umeda, A. Honda, and T. Nagase, "Influence of scandium concentration on power generation figure of merit of scandium aluminum nitride thin films," *Appl. Phys. Lett.*, vol. 102, no. 2, p. 021915, January 2013, doi: 10.1063/1.4788728.

[50] M. Akiyama, K. Kano, and A. Teshigahara, "Influence of growth temperature and scandium concentration on piezoelectric response of scandium aluminum nitride alloy thin films," *Appl. Phys. Lett.*, vol. 95, no. 16, p. 162107, October 2009, doi: 10.1063/1.3251072.

[51] R. H. Olsson, Z. Tang, and M. D'Agati, "Doping of Aluminum Nitride and the Impact on Thin Film Piezoelectric and Ferroelectric Device Performance," in 2020 *IEEE Custom Integrated Circuits Conference* (*CICC*), March 2020, pp. 1-6. doi: 10.1109/CICC48029.2020.9075911.

[52] P. Durdaut et al., "Fundamental Noise Limits and Sensitivity of Piezoelectrically Driven Magnetoelastic Cantilevers," *J. Microelectromechanical Syst.*, vol. 29, no. 5, pp. 1347-1361, October 2020, doi: 10.1109/JMEMS.2020.3014402.

[53] B. Spetzler et al., "Influence of the piezoelectric material on the signal and noise of magnetoelectric magnetic field sensors based on the delta-E effect," *APL Mater.*, vol. 9, no. 3, p. 031108, March 2021, doi: 10.1063/5.0042448.

[54] N. O. Urs et al., "Direct Link between Specific Magnetic Domain Activities and Magnetic Noise in Modulated Magnetoelectric Sensors," *Phys. Rev. Appl.*, vol. 13, no. 2, p. 024018, February 2020, doi: 10.1103/PhysRevApplied.13.024018.

[55] "PNI Corp." https://www.pnicorp.com/rm3100/

[56] "Allegro MicroSystems, Inc." https://www.allegromicro.com

[57] Texas Instruments, "DRV425 Fluxgate Magnetic-Field Sensor." March 2020.

[58] K. Yang, H. Chen, L. Lu, X. Kong, R. Yang, and J. Wang, "SQUID Array With Optimal Compensating Configuration for Magnetocardiography Measurement in Different Environments," *IEEE Trans. Appl. Supercond.*, vol. 29, no. 6, pp. 1-7, September 2019, doi: 10.1109/TASC.2019.2904483.

[59] J. M. Meyer et al., "Thin-Film-Based SAW Magnetic Field Sensors," *Sensors*, vol. 21, no. 24, 2021, doi: 10.3390/s21248166.

[60] S. Zabel, C. Kirchhof, E. Yarar, D. Meyners, E. Quandt, and F. Faupel, "Phase modulated magnetoelectric delta-E effect sensor for sub-nano tesla magnetic fields," *Appl. Phys. Lett.*, vol. 107, no. 15, p. 152402, October 2015, doi: 10.1063/1.4932575.

[61] Magnetic Shield Corp., "MuMetal Zero Gauss Chambers." [Online]. Available: https://www.magnetic-shield.com/mumetal-zero-gauss-chambers/

Exemplary Disclosure—C

The recording and analysis of bio-magnetic fields has widespread applications in medical research and diagnostics. Wearable magnetic field sensors offer a non-contact and portable method for sensing bio-potentials. This paper presents a readout circuit in 180 nm CMOS for strain modulated multiferroic vector magnetic field sensors. By utilizing a demodulator first architecture, the circuit bandwidth and dynamic range requirements are greatly reduced allowing for a low power consumption of 5.9 mW. The circuit bandwidth is from 76 mHz to 2.2 kHz, allowing for measurement across the range of interest for bio-magnetic signals. Utilizing a modulation noise cancellation technique, the noise performance of the sensor system is significantly improved, and the sensor modulation amplitude can be increased, resulting in improved sensor sensitivity. Measurements for the sensor-readout system demonstrate a 144 pT/√Hz magnetic noise floor at 1 kHz. The noise and power consumption are significantly lower than alternative magnetic sensor systems of similar volume.

I. Introduction

Bio-signals in living objects are the signals that carry physiological information from one part of the body to another. Studying bio-signals can extract data that maps health status or bodily activities for medical purposes. The classes of bio-signals include electrical, magnetic, thermal, and chemical [1]. Bioelectrical signals arise from ions flowing across the membrane of excitable cells, such as neurons and muscle cells. This ionic current produces a magnetic field, which can be recorded to monitor the patient's wellbeing [2]. Wearable devices for measuring bio-signals are desired for the diagnosis and treatment of medical diseases and for prosthetic/robotic control [2]. Bio-magnetic sensing is non-contact and has high spatial resolution, making it an ideal candidate for non-invasive bio-signal recording. Magnetocardiography, magnetoneurography, magnetoencephalography, and magnetomyography are magnetic-sensing techniques which measure magnetic field produced by the heart, nerves, brain, and muscles. A low power and small size bio-magnetic sensing system with high sensitivity and resolution can be utilized for the long-term health monitoring such as during pregnancy or for medical diagnosis and rehabilitation [2].

Low noise, in the level of pT/√Hz or fT/√Hz, and large bandwidth, at least 1 kHz, are desired to sense bio-magnetic signals [3]. Superconducting quantum interference devices (SQUIDs) are utilized to study the neuron magnetic activity in the brain. SQUIDs have extremely low noise floors on order of fT/√Hz. However, SQUIDs require cryogenic cooling which implies large size and high power consumption [4]. Spin exchange relaxation free (SERF) atomic magnetometers have a low noise spectral density of 10 fT/√Hz. However, the device bandwidth is limited to 100 Hz and requires large power consumption [5]. The flux gate sensor from Texas Instruments has large bandwidth, small volume, and low power consumption, but the noise is on order of nT/√Hz [6]

Previously, research on magnetoelectric (ME) sensors have shown the performance required for some bio-magnetic recording applications [7]-[11]. Non-modulated ME sensors have demonstrated noise performance of 250 fT/√Hz, but with a low bandwidth of 4 Hz [7]. Magnetically modulated ME sensors have sufficient bandwidth, but the sensor volume is much larger compared to other technologies [8].

Piezo-modulated ME sensors have demonstrated magnetic noise floors of 20 pA/√Hz at 10 Hz with 6.2 kHz bandwidth [9]. These prior piezo and magnetic modulated sensors use rack mounted electronics for signal acquisition. Recently, high quality factor (Q), strain modulated multiferroic magnetometers, as the structure shown in FIG. 33, with printed circuit board (PCB)-based readout were reported with resolution and bandwidth performance appropriate for some bio-magnetic sensing applications [10], [11]. In a strain modulated multiferroic magnetometer, with equivalent circuit model depicted in FIG. 34, a sinusoidal modulation drive voltage ($V_{MOD}$) is applied to a piezoelectric material at the device resonant frequency, $f_0$. Because the magnetostrictive layer strain response (or sensitivity) to magnetic fields is altered by the sinusoidal stress, low frequency magnetic fields at $f_s$ are amplitude modulated around the modulation carrier. This enhances the sensitivity from the sensed magnetic field to the output electrical signal by the device quality factor, Q. While the sensor converts magnetic signals into electrical signals, in a sensor system, low noise and low power analog front-end circuitry for amplification and demodulation (DEMOD) are required. The readout should handle the large modulation current at $f_0$ generated by $V_{MOD}$ while also linearly amplifying the significantly smaller current sidebands at $f_0 \pm f_s$ produced by the bio-magnetic signals, as shown in the sensor output current spectrum of FIG. 35.

Figure 36:
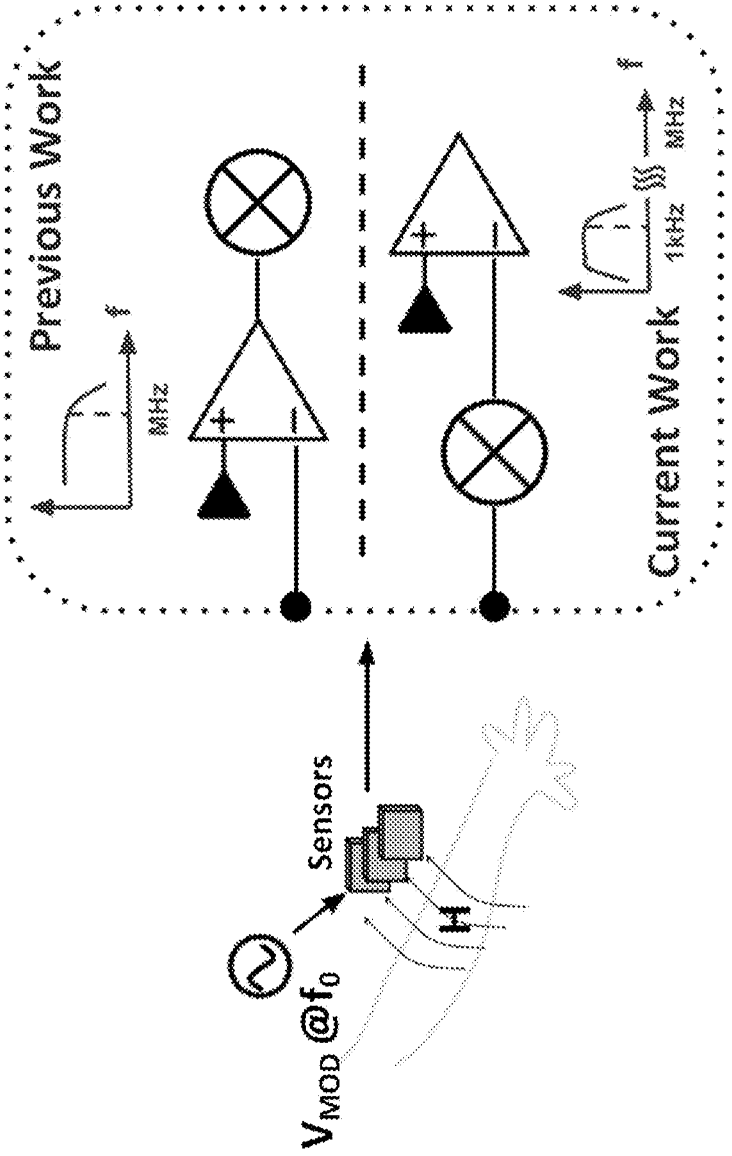
FIG. 36: Previous and current research of the readout architecture for strain modulated multiferroic magnetic field sensors.

The PCB readout circuit for strain modulated multiferroic sensors was previously implemented as shown in FIG. 36, with the demodulation placed after the amplification [11]. In this configuration, the amplifier must operate at the sensor resonance frequency, ~10 MHz, and must linearly amplify both the side-bands and the large current due to the modulation drive voltage. These bandwidth and linearity requirements necessitate a high power consumption of 440 mW, too large for compact wearable devices. Here we report an Application Specific Integrated Circuit (ASIC) utilizing a demodulator first circuit architecture (FIG. 36) in conjunction with modulation noise cancelling that reduces the power consumption and dynamic range requirements without degrading the circuit or sensor system noise performance. This is similar to the problem of sensing the current in discrete time. Among the discrete-time current sensing techniques, some researchers utilize a configuration where the switch is in the feedback path [12]-[15]. However, in this case, the amplifier needs to have high bandwidth equivalent to the switching speed. In this work, we place the switching in front of the amplifier such that the strong carrier peak at $f_0$ produced by the modulation is demodulated to DC, where it is high-pass filtered prior to amplification. Thus, the circuit only amplifies the demodulated side-bands, which are orders of magnitude smaller in amplitude. Demodulation before amplification also reduces the required amplifier bandwidth from ~10 MHz to 1 kHz, as well as allowing a larger modulation drive voltage compared to the previous PCB implementation. However, the amplifier also requires an ultra-low frequency high-pass filter (HPF) below 1 Hz to filter the demodulated DC components while the low frequency magnetic field is still within the passband [2], [16]-[20]. Both the lower required bandwidth and dynamic range enable a nearly 70-fold reduction in circuit power consumption.

Including the canceller, which removes the large noise arising from the modulator phase noise, the reported ASIC has an overall power consumption of 5.9 mW with an input-referred noise of 9.9 pA/√Hz at 1 kHz. The circuit has large dynamic range which allows AC magnetic input signals as large as 9.6 $\mu T_{pp}$ and a 260 $mV_{pp}$ modulation drive voltage amplitude when interfacing with a sensor motional impedance of 3.5 kΩ. This dynamic range far exceeds the requirements for bio-magnetic sensing applications. With this sensor device, the reported biomagnetic sensor integrated system has a magnetic noise floor of 144 pT/√Hz at 1 kHz.

Section II introduces the sensor device structure, the circuit, noise model, and the noise analysis of the sensor-readout integrated system. Section III details the ASIC readout implementation. The performance of the readout circuit and integrated sensor system are presented in Section IV and Section V, respectively.

II. Sensor and Sensor System Overview

A. Device Structure

Figure 33:
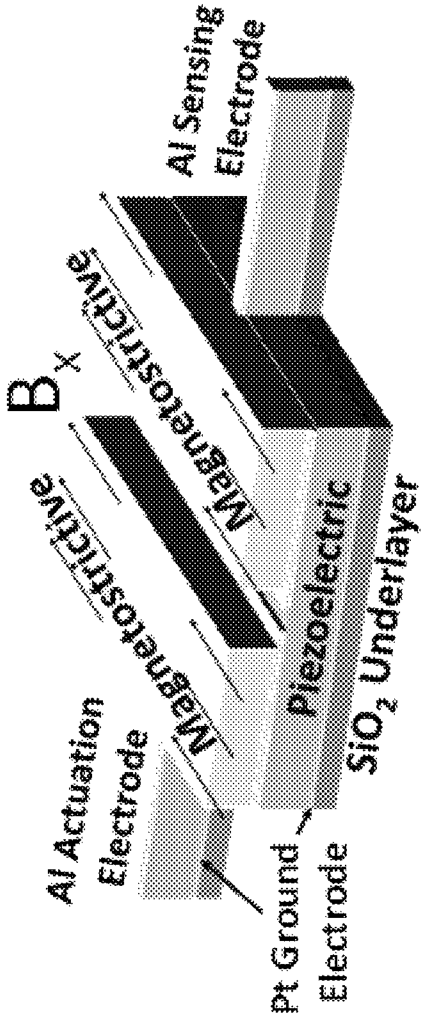
FIG. 33: 3D model of the multiferroic magnetometer.

As shown in FIG. 33, two layers of material are used to realize a multiferroic magnetometer [10]. The magnetostrictive layer senses the magnetic field and converts it to mechanical strain. The piezoelectric material converts this strain to electrical charge. A sinusoidal drive voltage $V_{MOD}$ can be applied across the piezoelectric layer at the device resonant frequency, $f_0$. This induces a time varying mechanical strain in the magnetostrictive layer that modulates the device sensitivity to magnetic fields and mixes (AM modulation) low frequency bio-magnetic potentials (<1000 Hz) into the mechanical resonance band of the sensor, where its output in response to magnetic field is enhanced by the mechanical device Q, which is typically >1000. This amplitude modulation is enabled by a nonlinear property of magnetostrictive materials [10].

B. Sensor Equivalent Circuit and Noise Model

Figure 34B:
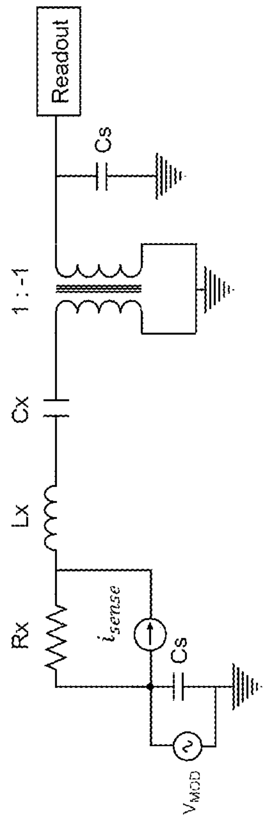
FIG. 34B: Circuit model of the sensor integrated system in which the sensor is represented by a current source.
Figure 34A:
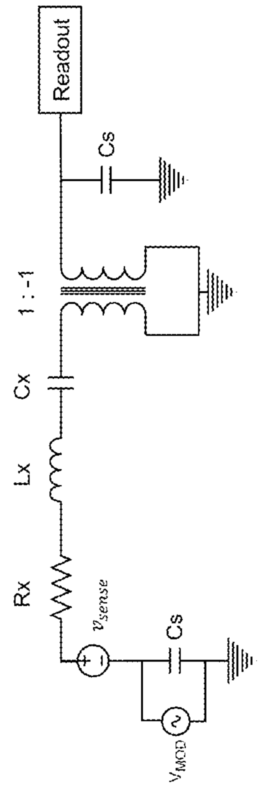
FIG. 34A: Circuit model of the sensor integrated system in which the sensor is represented by a voltage source.

The magnetoelectric sensor can be modeled as a voltage source or current source as shown in FIG. 34 [11]. The motional resistor, inductor, and capacitor are denoted as $R_X$, $L_X$, and $C_X$. $L_X$, and $C_X$ are resonated out when the sensor modulation is driven at $f_0$. The transformer represents the phase shift and the gain between the input and output of the device. The input and the output capacitors are represented as $C_S$, approximately 1 pF [10].

The theoretical value of the sensitivity (S) in A/T and the motional impedance $R_X$, which is usually around 1 kΩ~5 kΩ, of a stress modulated multiferroic sensor device with a small flux concentrator is given in [111]. The equivalent noise source associated with the sensor device is:

$$\overline{i^2_{n-source}} = 4\,\mathrm{kT}/R_X \tag{1}$$

which represents the sensor thermal or Brownian noise. Then the magnetic self-noise of the sensor is given by:

$$B_{n-sensor} = \sqrt{4\,\mathrm{kT}/R_X}\,/S \tag{2}$$

C. Sensor System Noise

Figure 37A:
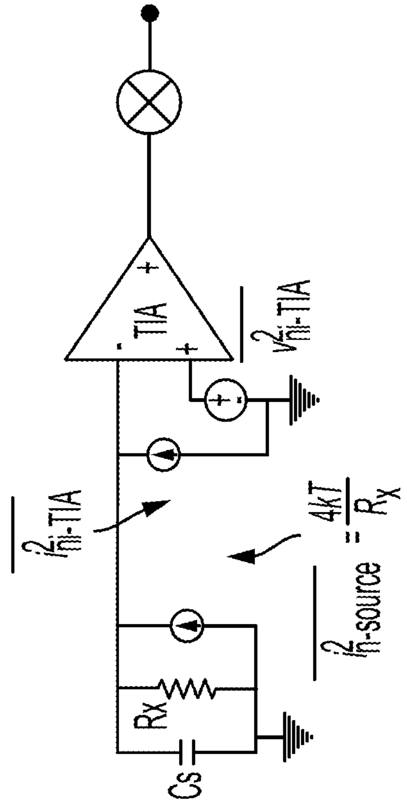
FIG. 37A: A noise model at the interface of the sensor and the electronics as previously known.
Figure 37B:
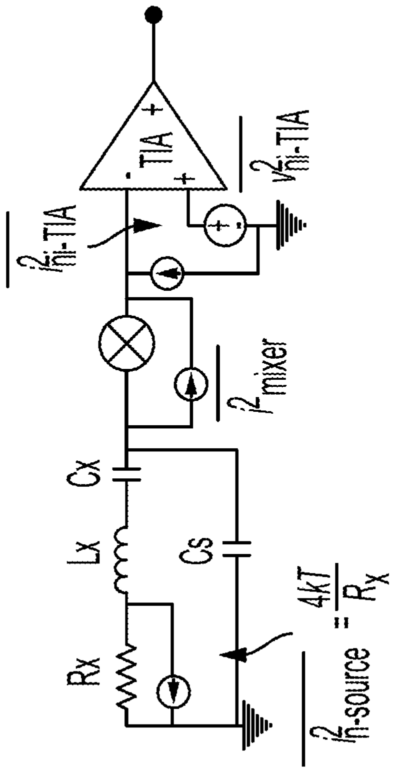
FIG. 37B: A noise model at the interface of the sensor and the electronics in the presented implementation with the demodulation between the sensor and the TIA.

The previous PCB based readout circuit schematically depicted in FIG. 36 has the noise model shown in FIG. 37 [11]. The sensor and linear TIA amplifier operate at the device resonance, thus, only the motional impedance is included in FIG. 37. The magnetic noise of the sensor system in T/√Hz is given by:

$$B_{n-sensor} = \frac{\sqrt{\overline{i_{n-total}^2}}}{S} = \frac{\sqrt{\frac{4kT}{R_X} + \overline{i_{ni-TIA}^2} + \overline{v_{ni-TIA}^2} / R_X^2}}{S} \quad (3)$$

where $$\overline{i_{ni-TIA}^2}$$

and $$\overline{v_{ni-TIA}^2}$$

are the current noise and the voltage noise of the TIA at the modulation frequency (~10 MHz), respectively.

$$\overline{i_{n-total}^2}$$

is the equivalent total current noise at the sensor-readout interface. For CMOS processes, the voltage noise requires more attention during the design when compared to the current noise. With lower $R_X$, a higher magnetic noise is induced by the amplifier input-referred voltage noise.

The demodulator first circuit reported here has the noise model at the interface of the sensor device shown in FIG. 37. The sensor RLC model is included, as the working frequency is different for the device and the TIA. The sensor device has low impedance only at the resonance frequency, while at low frequency, such as the magnetic field frequency, the impedance is large. We can expect that for higher sensor Q, the narrower the bandwidth of the resonator. FIG. 37 includes the noise introduced by the mixer, $$\overline{i_{mixer}^2},$$

as the mixer precedes any amplification. A detailed noise analysis of passive mixers, where the noise originating from the switch on resistance can be combined with the source impedance is given in [21]. This combined impedance has narrow bandwidth when the source impedance is a high-Q resonator. Therefore, for higher Q, less aliased noise from the switch on resistance is induced by the mixing. As the switch on resistance should be small compared to the source resistance, $R_X$, $$\overline{i_{mixer}^2}$$

is negligible compared to other noise sources.

The range of frequencies over which the input impedance is low becomes narrower with increasing Q. Thus, intuitively, $$\overline{v_{ni-TIA}^2}$$

has less impact on the total input-referred current noise for high-Q sensors. In the CMOS process, $$\overline{v_{ni-TIA}^2}$$

is large, so the following analysis is performed. We start by analyzing the noise incorporating only the resistor, $R_X$. Half of the time, the TIA is connected to this low impedance $R_X$, so the output noise due to $$\overline{v_{ni-TIA}^2}$$

and $R_X$ is half when compared to when the demodulation is placed after the amplification. Assuming Rx<<1/ωCs, the noise under this simplifying assumption is:

$$\frac{\sqrt{\overline{i_{ni\_eq}^2}}}{\sqrt{\overline{v_{ni-TIA}^2}}} = \frac{1}{R_X} \quad (4)$$

(When no *DEMOD*, FIG. 5(*a*))

$$\frac{\sqrt{\overline{i_{ni\_eq}^2}}}{\sqrt{\overline{v_{ni-TIA}^2}}} = \frac{\sqrt{\frac{A_{TIA}^2}{4R_X^2}}}{A_{DEMOD}} = \frac{\frac{A_{TIA}}{2R_X}}{A_{DEMOD}} \quad (5)$$

(When *DEMOD* is on, only $R_X$, no $L_X$, or $C_X$, FIG. 5(*b*))

where $A_{TIA}$ is the transimpedance gain of the TIA and $A_{DEMOD}$ is the total transimpedance gain of the mixer and the TIA. The difference is determined by the mixer gain.

$$\overline{i_{ni\_eq}^2}$$

is the equivalent input-referred current noise at the position of the RLC tank due to $$\overline{v_{ni-TIA}^2}.$$

Figure 38:
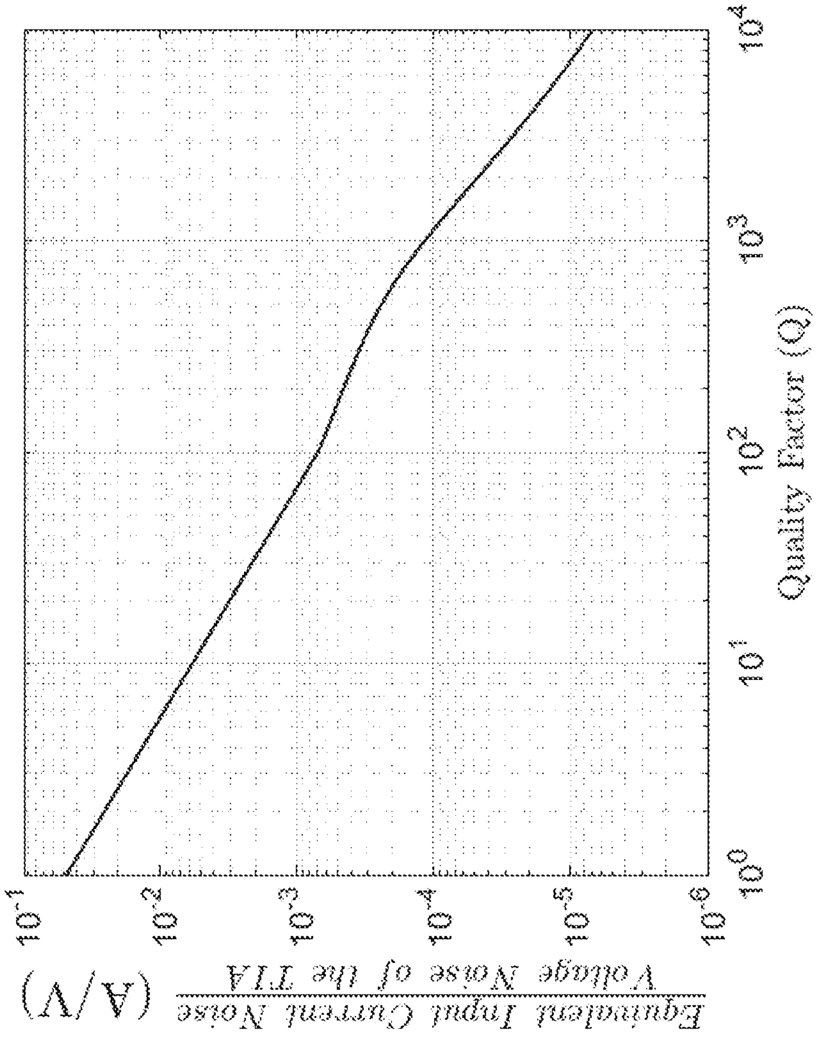
FIG. 38: The transfer function between the input voltage noise of the TIA and the equivalent input-referred current noise at the position of the RLC tank in the structure of FIG. 37B vs. the RLC equivalent circuit tank quality factor, Q.

When incorporating the high-Q resonant behavior utilizing $L_X$ and $C_X$, Periodic AC Analysis (PAC) in Cadence is utilized to demonstrate the relationship between the equivalent input current noise and the TIA input-referred voltage when the mixer gain is 1/π[11], as shown in FIG. 38. The y-axis is the transfer function from $$\sqrt{\overline{v_{ni-TIA}^2}}$$

to $$\sqrt{\overline{i_{ni\_eq}^2}}$$

at 1 kHz. For example, when the TIA voltage noise is designed as 9 nV/√Hz, the input-referred current noise, $$\sqrt{\overline{i_{ni\_eq}^2}},$$

is reduced from 427 pA/√Hz with a sensor Q=1 to 1.02 pA/√Hz when the sensor Q is 1000 [10], [11]. Thus, the demodulator-first circuit architecture is particularly well suited to interface with high-Q sensors.

III. Readout Circuit Design

A. Architecture

Figure 35:
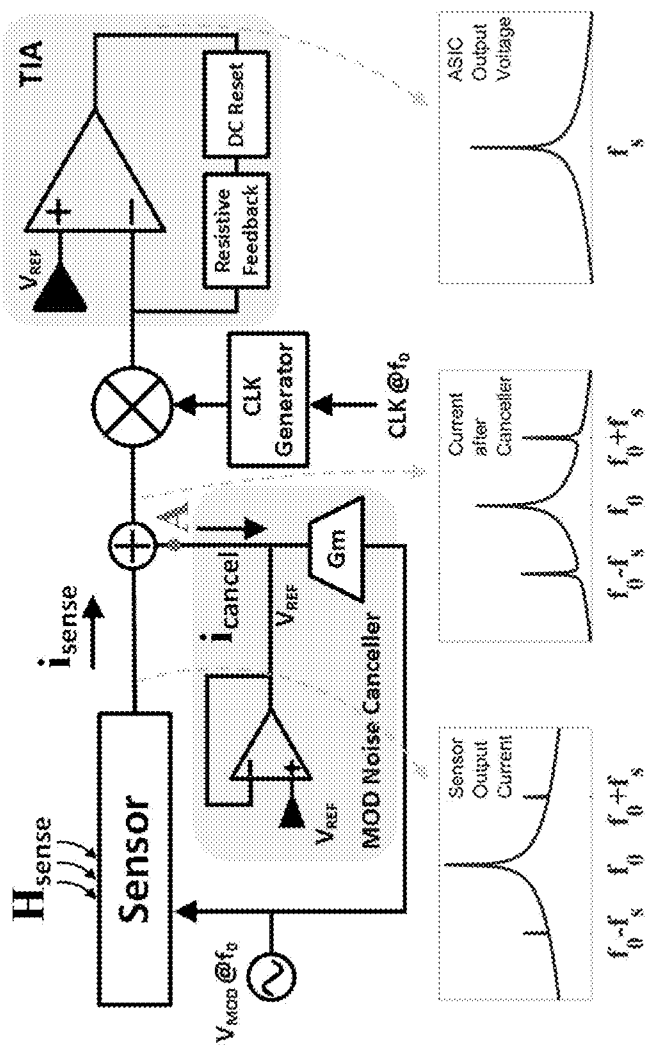
FIG. 35: Block architecture of the sensor system with signal spectrum at key nodes.

The overall circuit block diagram is shown in FIG. 35. The sensor's output current has one main peak at $f_0$ due to the modulation drive voltage with the amplitude of $$\frac{V_{MOD}}{R_X},$$

and two side-bands at $f_0 \pm f_s$ due to the magnetic field. A modulation noise canceller is introduced prior to demodulation to cancel the noise introduced by the modulation drive voltage, as well as most of the modulation current to improve the linearity of the later amplification. As shown in FIG. 35, after the cancellation the Signal-to-Noise ratio (SNR) is improved, and the modulation peak is attenuated by a large amount. After demodulation using a clock frequency of $f_0$, a TIA is implemented with a high-pass filter which has a near DC corner frequency, resulting in a bandwidth covering the frequency range of bio-magnetic fields. The total power consumption of this ASIC is 5.9 mW.

B. Demodulation and Amplification

Figure 39:
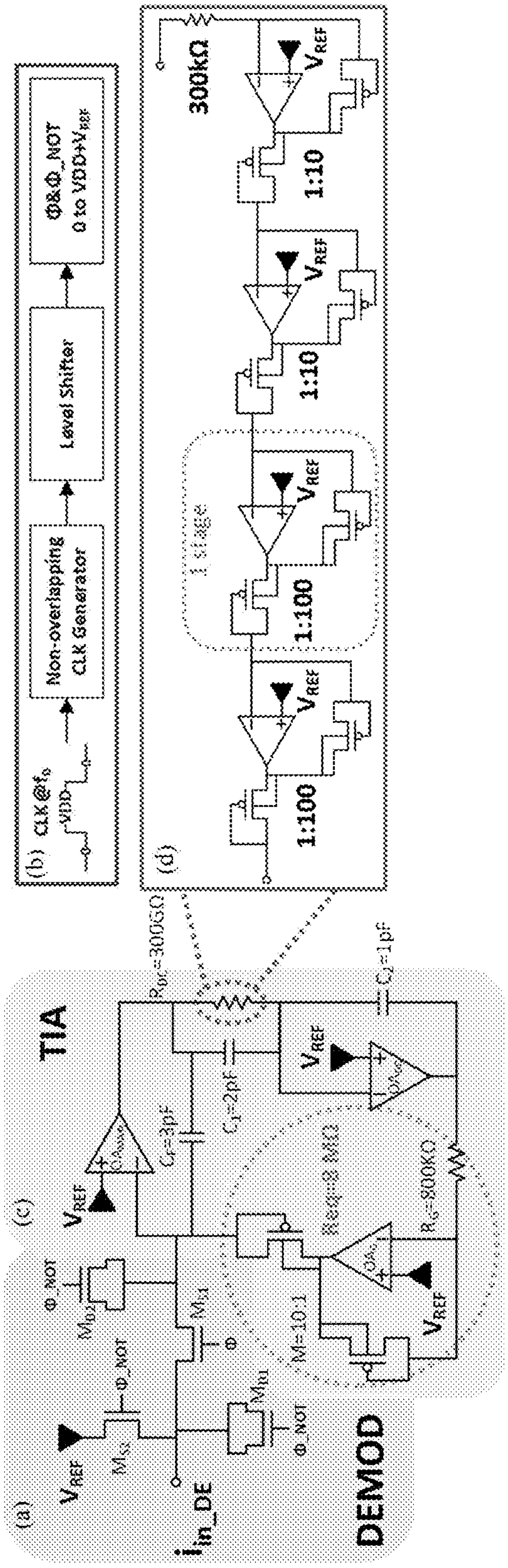
FIG. 39: Diagram of demodulation and TIA implementation. (a) Demodulation switches; (b) Clock generator for the demodulation; (c) TIA; (d) Implementation of the 300 GΩ high-pass filter resistor $R_{DC}$.

FIG. 39 shows the circuit implementation of the demodulator and the TIA. FIG. 39 (*a*) describes the implementation of the down-conversion mixer. Two switches are used for the demodulation. Switch MS1 in series is sized to reduce the on resistance to be much less than the sensor's motional impedance to avoid signal attenuation. The input node of the switch is set to the reference voltage (V_REF) periodically utilizing MS2. This switch should have small size in order to minimize charge injection. In addition, the switch on resistance is further reduced by introducing a level shifter after the non-overlapping clock generator in FIG. 39 (*b*) to assure high transimpedance gain when the switch is on. Charge injection during the switching introduces a DC offset at the output of the TIA, which may cause saturation. Therefore, two dummy transistors, MD1 and MD2, are utilized to reduce the overall charge injection. During the switching, the input current is mixed with a square wave, so the mixer gain is 1/π [11]. The clock to control the demodulation should have a proper phase relationship with the modulation drive voltage in order to get the correct down-conversion.

The TIA structure as shown in FIG. 39 (*c*) is adapted from the integrator in [22]. The integrator has a very large gain at low frequency and very narrow bandwidth. The lowest bio-magnetic frequency of interest for our work is below 1 Hz and the bandwidth should be at least 1 kHz [2], [3], [16]-[20]. Therefore, the transimpedance gain should be reduced to avoid saturation at low frequency, as well as to enlarge the bandwidth, compared to the integrator designed in [22]. In this work, the transimpedance gain is implemented as 4 MΩ. Careful selection of $C_1$, $C_2$, $R_{DC}$, and $OA_{DC}$ result in a high gain transfer function at low frequency and low gain at other frequencies [22]. This network also sets the DC biasing point in the feedback of the TIA and forms the HPF corner as a differentiator. For ultra-low frequency HPF implementation, $R_{DC}$ should be large by utilizing the current reducer technique in [22]. As shown in FIG. 39 (*d*), a four-stage current reducer is utilized to realize a 300 GΩ equivalent resistor on chip utilizing a 300 kΩ on-chip physical resistor. In each stage, the two transistors have the same $V_{gs}$ but a different aspect ratio. Therefore, the drain current of the transistor connected at the output of the operational amplifier is reduced by this ratio compared to the drain current of the transistor placed in feedback. Using the aspect ratios of the transistors shown in FIG. 39 (*d*) realizes a $10^6$ amplification of the resistance. The same current reducing technique is implemented in the feedback of the amplifier $OA_G$ in FIG. 39 (*c*) to determine the overall transimpedance gain. The equivalent resistance $R_{eq}=M\times R_G=8$ MΩ is realized by amplifying the physical resistor $R_G$. In the midband, the network formed by $C_1$, $C_2$, $R_{DC}$, and $OA_{DC}$ is a voltage amplifier with a gain of $C_1/C_2$. Hence, the implemented TIA in (c) has a transimpedance gain of $$\frac{MR_G}{c_1/c_2} = 4\,\mathrm{M}\Omega,$$

Figure 40:
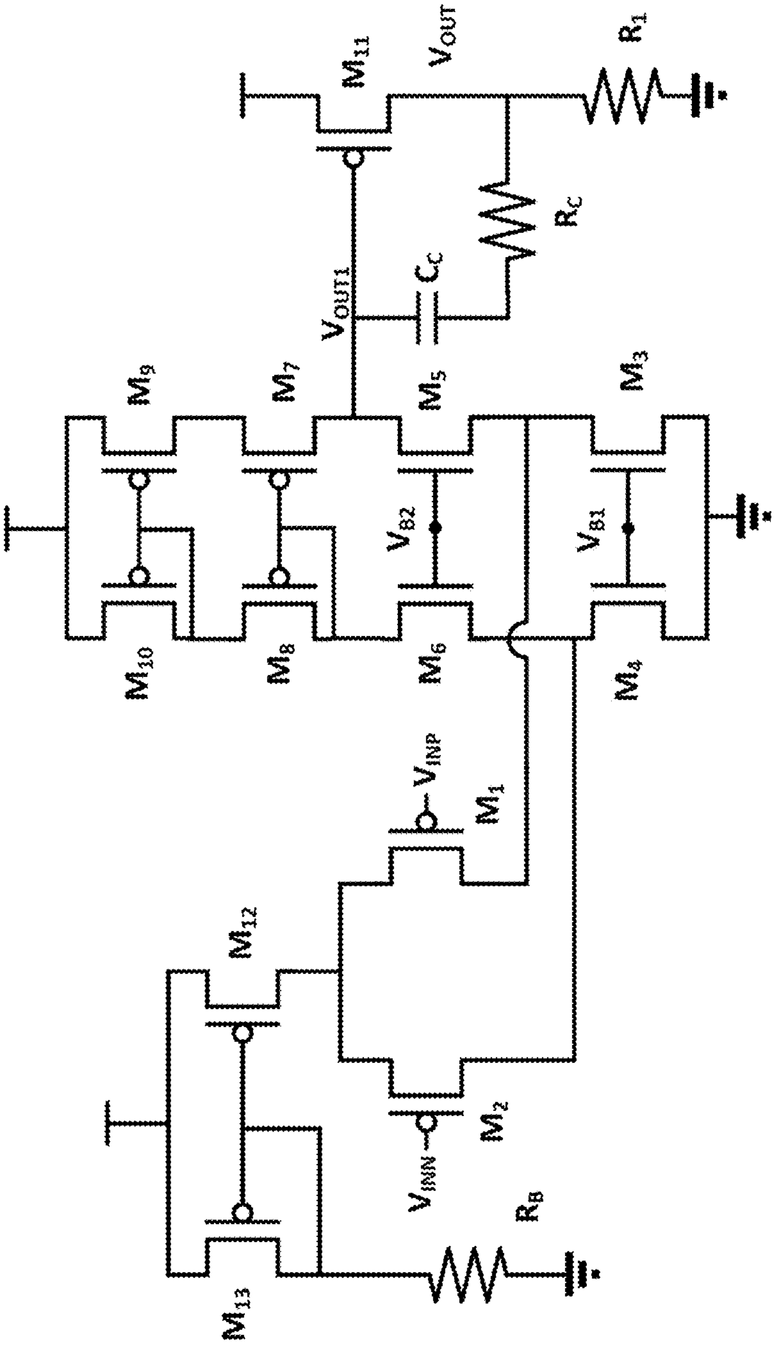
FIG. 40: The implementation of the main operational amplifier $OA_{MAIN}$ with dimensions of transistors.

The main operational amplifier $OA_{MAIN}$ is implemented by the folded cascode structure followed by a common source, as shown in FIG. 40. The common source stage with small output impedance is used to drive the 300 kΩ resistor at the output of $OA_{MAIN}$, in order not to drop the large open-loop gain of the folded cascade. The input impedance of the closed-loop amplifier is equal to the feedback resistance divided by the open-loop gain. Moreover, this common source stage has large voltage swing and a certain gain to reduce the dynamic range requirement of the folded cascade stage. The open-loop gain can be calculated as:

$$A_{o1} = g_{m1}\left(g_{m5}r_{o5}\left(r_{o1}//r_{o3}\right)\right)//(g_{m7}r_{o7}r_{o9})g_{m11}R_1 \quad (6)$$

where $g_{m1}$, $g_{m5}$, $g_{m7}$ and $g_{m11}$ are the transconductance of $M_1$, $M_5$, $M_7$ and $M_{11}$, $r_{o5}$, $r_{o1}$, $r_{o3}$, $r_{o7}$ and $r_{o9}$ are the small signal output resistance of $M_5$, $M_1$, $M_3$, $M_7$ and $M_9$. The achieved open-loop gain is 121 dBV.

MOSFETs have ultra-low current noise but high voltage noise. $OA_{MAIN}$ in FIG. 39 (*c*) dominates the voltage noise of the readout electronics. The dimensions of the transistors are sized to reduce the flicker noise at low frequencies. The dimensions of the transistors are shown in FIG. 40. The input pairs have large aspect ratio to have large $g_m$ in order to reduce the thermal noise, as well as reducing the flicker noise introduced by $M_3$ and $M_4$ when referred to the input. In addition, in FIG. 39, the input node of the TIA has large capacitance such that at the demodulation frequency, the input impedance of the TIA is low, which ensures the current coming from the sensor flows into the demodulator in the phase when $M_{S1}$ is on. Compared to the conventional resistive feedback transimpedance amplifier, the circuit implemented in FIG. 39 has reduced current noise at the input introduced by the feedback resistor as the noise of $R_G$ is attenuated by the ratio M=10 in FIG. 39 (*c*) [22].

C. Modulation Noise Cancelling

The modulation drive voltage introduces additional noise at the input of the readout along with a large modulation current. A modulation noise canceller is implemented to create a replica copy of the modulation current and noise for the later subtraction when connected with the same modulation drive voltage. The canceller requires a large output impedance within the bandwidth of the TIA to maintain overall high gain and low noise. A resistor which matches the motional impedance of the sensor can create a replica copy of the modulation current and modulation noise for the subtraction. However, this low impedance introduces greatly increased current noise due to the voltage noise of the TIA, based on (5) in Section II C. The common-gate amplifier $M_N$ in FIG. 41 has the large output impedance required for low noise, while the drain current can be expressed as:

$$i_d = g_{mN} \times v_{gsN} = g_{mN} \times (-V_{MOD}) \tag{7}$$

where $g_{mN}$ is the transconductance of $M_N$. The modulation current coming from the sensor due to the 180 degree phase shift between the output to the input is:

$$i_{MOD} = \frac{1}{R_X} \times (-V_{MOD}) \tag{8}$$

Therefore, the sensor's $R_X$ should be matched by $1/g_m$ of the common-gate transistor, which can be tuned by the gate bias voltage allowing it to interface with different sensor implementations.

The reference voltage generator connected in the feedback configuration sets the large signal drain voltage of the common-gate to $V_{REF}$. The output impedance should be low at DC to accurately set the drain bias of $M_N$, but large at RF such that the sensor current flows into the demodulator, $I_{in\_DE}$, for high transimpedance gain and low noise. In addition, the output impedance of the canceller within the bandwidth of the TIA should be large enough to ensure the attenuation of $$\overline{v_{ni-TIA}^2}$$

shown in FIG. 38 is maintained at large sensor Q. Therefore, the closed-loop bandwidth of the reference generator should be ultra-small, which is smaller than the HPF cut-off frequency of the TIA. The challenge is the closed-loop output impedance is equal to the open-loop output impedance attenuated by the open-loop gain. The closed-loop bandwidth of the unity gain configuration is equal to the open-loop gain-bandwidth product. Therefore, the open-loop transfer function should have ultra-low gain-bandwidth product. Diode-connected back-to-back transistors are utilized as a large pseudo-resistor [23] in conjunction with a Miller capacitor structure to provide a narrow open-loop bandwidth as low as 28 μHz. Therefore, it has a large output impedance for frequencies larger than the open-loop gain-bandwidth product. While performing demodulation utilizing a square wave, the DC component of the square wave causes the low frequency noise of the canceller to bypass the switch and flow directly into the band of the TIA. A HPF after the canceller, formed by $R_{HP}$ and $C_{HP}$, is used to filter the flicker noise of the canceller. $R_{HP}$ is 100 kΩ which is implemented on-chip, and $C_{HP}$ is realized using a 100 pF off-chip capacitor, which results in a HPF corner at 16 kHz. At high frequency, in the resonance band of the sensor, the dominant noise comes from $M_N$ and $M_P$. The thermal noise of $M_N$ is fixed as a certain $g_m$ is required to match the $R_X$ of the sensor device. The flicker noise in the drain current of $M_N$ is:

$$\overline{i_{dN\_flicker}^2} = \frac{K g_{mN}^2}{W_N L_N C_{ox} f} \tag{9}$$

where K is a constant that is related to the process, $C_{ox}$ is the transistor oxide capacitance per unit area, W and L are the width and length of the transistor respectively, $g_m$ is the transconductance of the transistor, f is the frequency. However, the aspect ratio of $M_N$ and $M_P$ should not be too small in order to match a sensor with low motional impedance. For $M_P$, $$\overline{i_{dP\_flicker}^2} = \frac{K g_{mP}^2}{W_P L_P C_{ox} f} = \frac{K(2 \times I_D \mu_P C_{ox} W_P / L_P)}{W_P L_P C_{ox} f} = \frac{2 K I_D \mu_P}{L_P^2 f} \tag{10}$$

$\mu_p$ is the mobility of the hole. $I_D$ is the drain current. After the optimization, we choose $W_P$=18 μm, $L_P$=5 μm and $W_N$=16 μm, $L_N$=10 μm, which gives 3 pA/√Hz of noise near 10 MHz in the case of $$\frac{1}{g_{mN}} = 3\ \text{k}\Omega.$$

IV. ASIC Measurement Results

Figure 42:
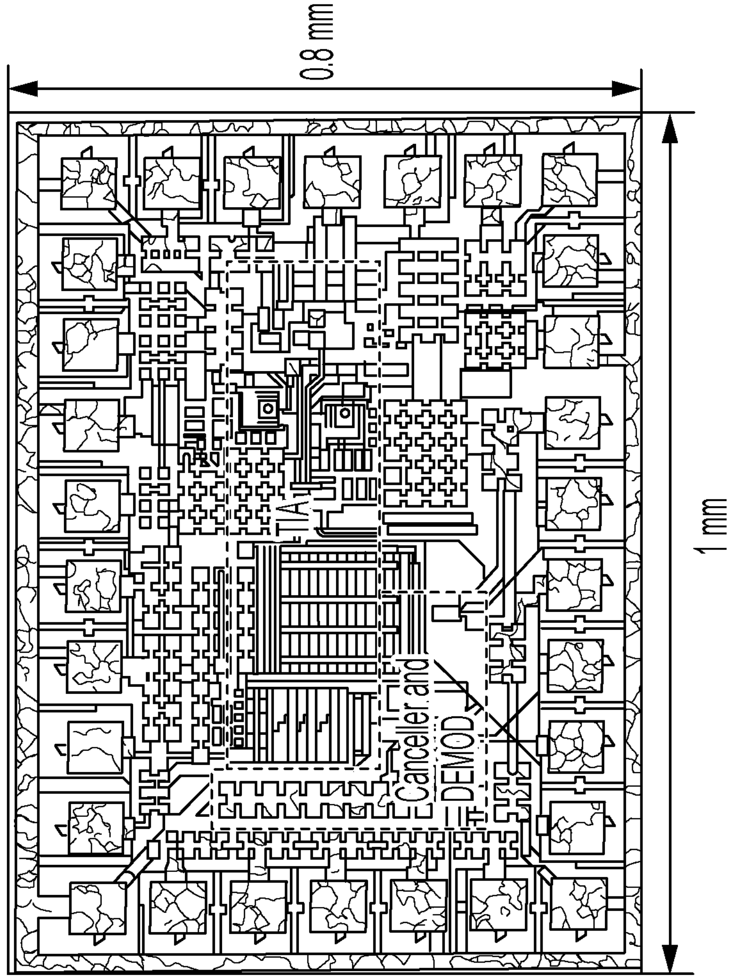
FIG. 42: Schematic of the readout die micrograph.
Figure 43:
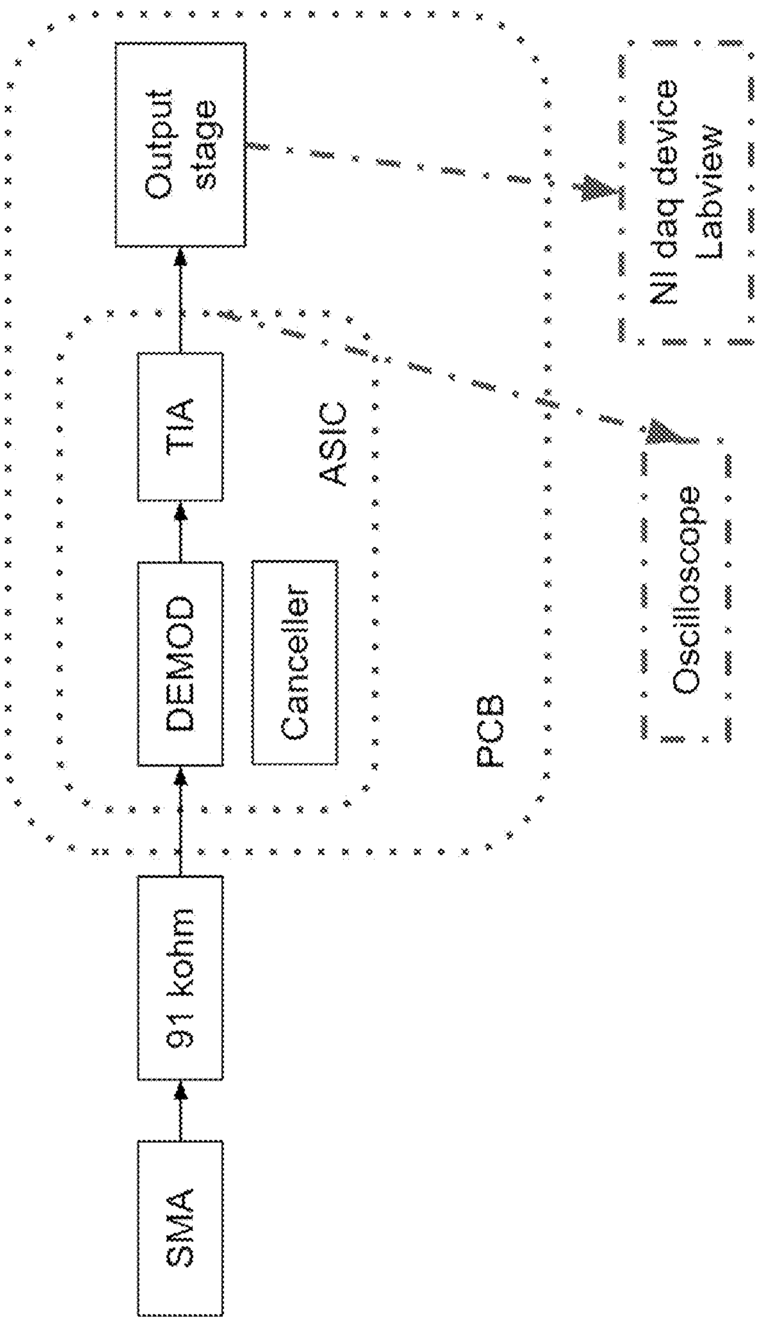
FIG. 43: Experiment setup to measure the ASIC without the sensor device.

The readout ASIC is implemented in the TSMC 180 nm CMOS process (FIG. 42). The chip dimensions are 0.8 mm×1 mm. The chip is measured with a 3.3 V supply. To mimic the sensor, a 91 kΩ input resistor is soldered at the input. This large resistor is chosen for studying the ASIC noise exclusively. A Keysight oscilloscope and a National Instruments acquisition device 9252 (NI DAQ) are used to acquire the demodulated output. FIG. 43 shows the experimental setup to measure the readout ASIC.

A. Amplification and Demodulation Performance

The noise and gain are measured including with the canceller and with the canceller disconnected, as shown by disconnecting at node A in FIG. 35. The demodulator switch is driven at 4 MHz and an input current at 4.001 MHz is applied through the 91 kΩ resistor using a 2 mVpp signal.

Figure 44:
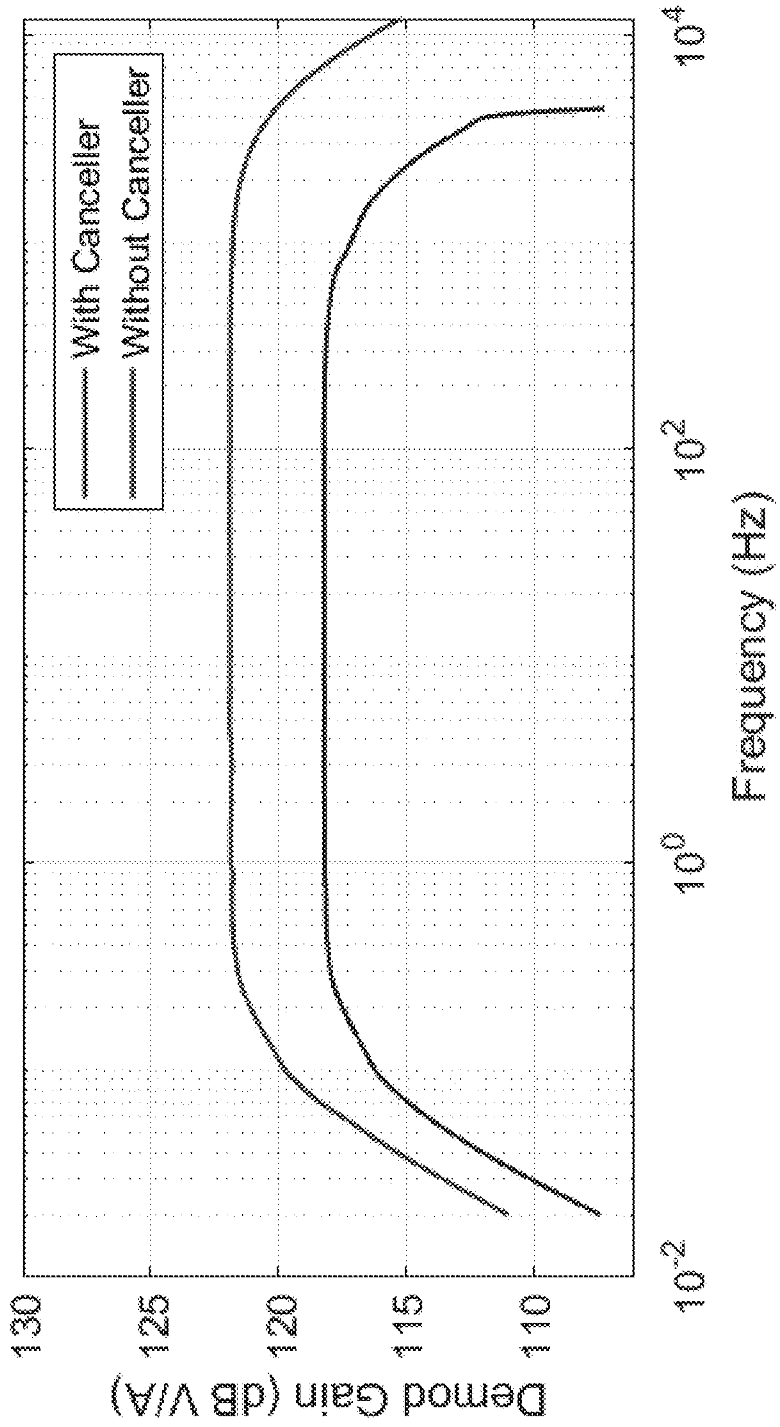
FIG. 44: Demodulation gain with canceller and with the canceller disconnected when the demodulation frequency is at 4 MHz.

The measured transfer function including demodulation is shown in FIG. 44. The bandwidth without the canceller is 80 mHz-6.2 kHz. The bandwidth with the canceller connected is 76 mHz-2.2 kHz, as the canceller introduces a slightly increased capacitance at the input node. The mid-band transimpedance gain is 121.9 dBΩ and 118.2 dBΩ, respectively, without and with the canceller.

Figure 45A:
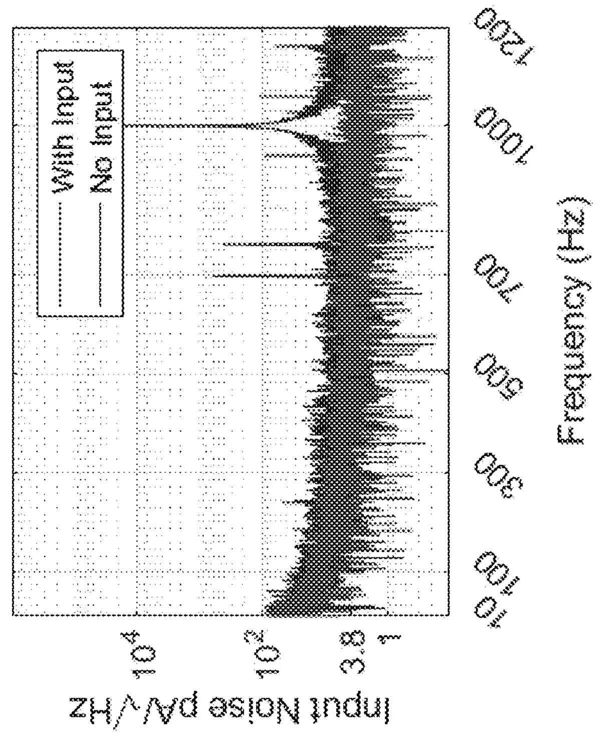
FIG. 45A: Diagram of demodulation noise referred to the input when the demodulation frequency is at 4 MHz and the canceller is disconnected.
Figure 45B:
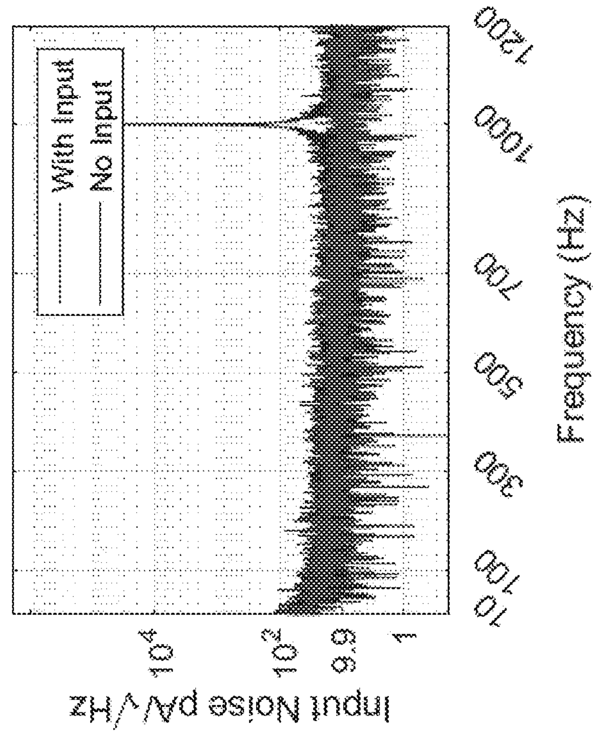
FIG. 45B: Diagram of demodulation noise referred to the input when the demodulation frequency is at 4 MHz and using the canceller.

The measured input-referred current noise, as shown in FIG. 45, is 3.8 pA/√Hz and 9.9 pA/√Hz at 1 kHz without and with the canceller, respectively. The canceller introduces additional noise arising from the remnant of its flicker noise after the HPF and also reduces the gain before the TIA.

B. Modulation Noise Cancelling

Figure 41:
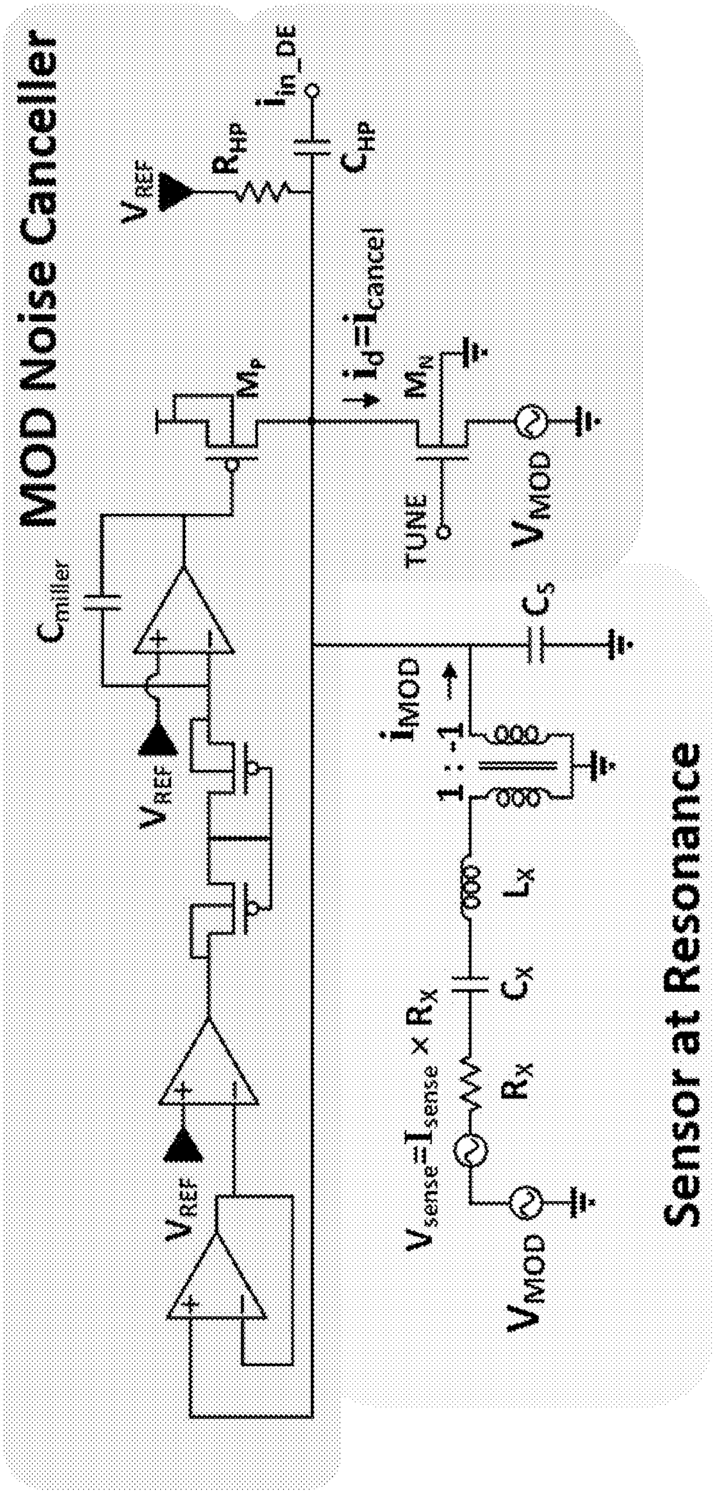
FIG. 41: The implementation of the modulation noise canceller with sensor's circuit model. The same modulation voltage $V_{MOD}$ is connected to the sensor and the canceller. $i_{cancel}$ is generated by the canceller to match the current $i_{MOD}$.
Figure 46:
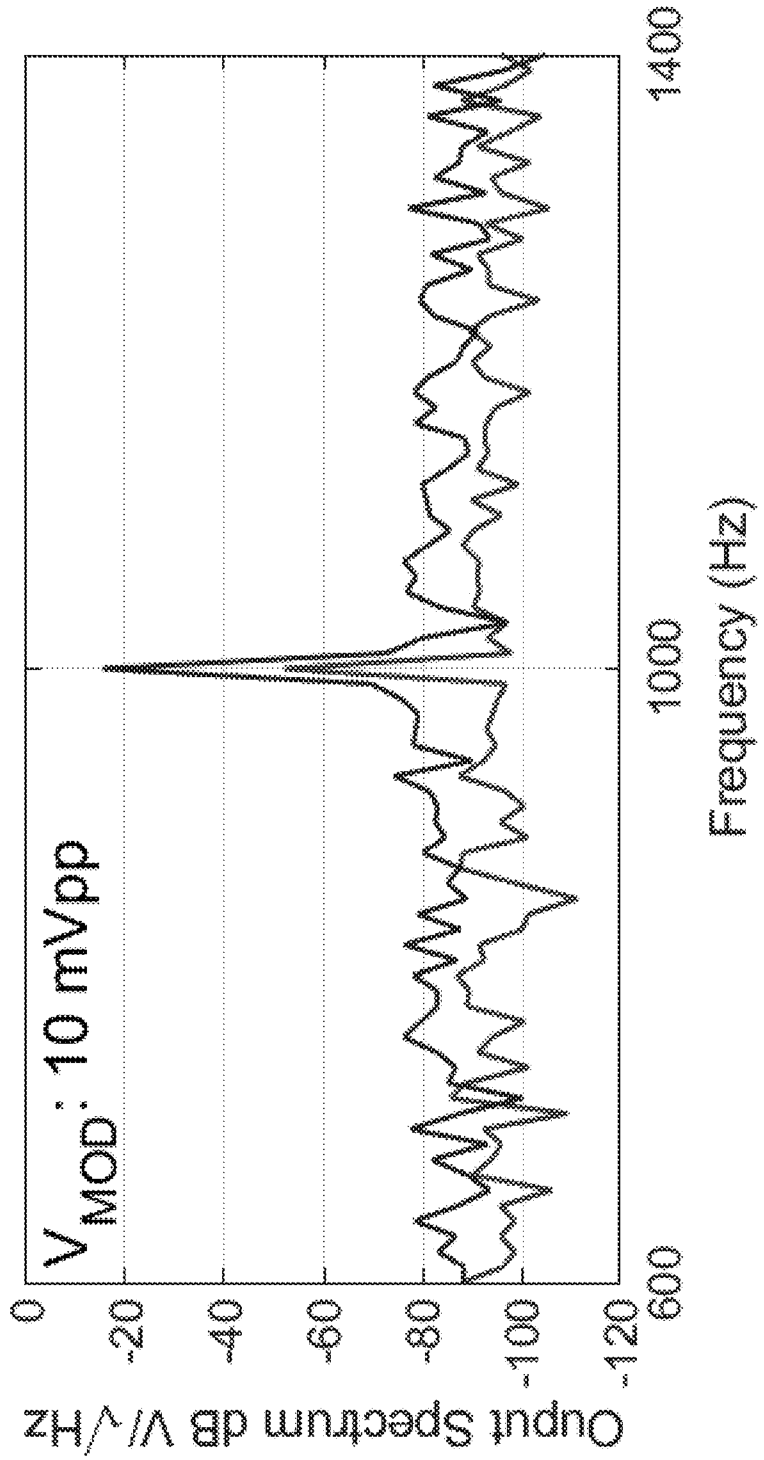
FIG. 46: The rejection of the canceller when a sensor is driven electrically with 10 mVpp at $f_0$ and connected to the ASIC. The demodulation switch is driven at 1 kHz offset to $f_0$.

To measure the rejection of the canceller, a sensor with a resonant frequency $f_0$ of 9.4 MHz and motional impedance $R_X$ of 5.5 kΩ is driven electrically with 10 mVpp at $f_0$ and connected to the ASIC. The demodulation switch is driven at 1 kHz offset to $f_0$. As shown in FIG. 46, the blue curve represents the demodulated output at 1 kHz and the noise floor including the electronics noise and the noise from the function generator Keysight 33600 used to drive the modulator. The gate voltage of the common gate in FIG. 41 is set to ground so the canceller is disabled. The red curve represents the response under maximum cancellation by tuning the gate voltage of the common gate to match $R_X$ to $1/g_m$. The canceller achieves an attenuation of 37 dB for the modulation signal. Referring the output noise floor to the input, the noise is reduced by 10-20 dB depending on the frequency offset from the carrier such that the noise floor is closer to that of the demodulator and TIA. While using large drive voltage to modulate the sensor, usually between 100 $mV_{pp}$ to 200 $mV_{pp}$, the dominant noise comes from the modulation [11]. As a result, a lower noise floor for the sensor system is achieved when utilizing the canceller when compared to the case without the canceller enabled, even though the canceller introduces additional electronic noise.

V. Sensor Integrated System Performance

Figure 47:
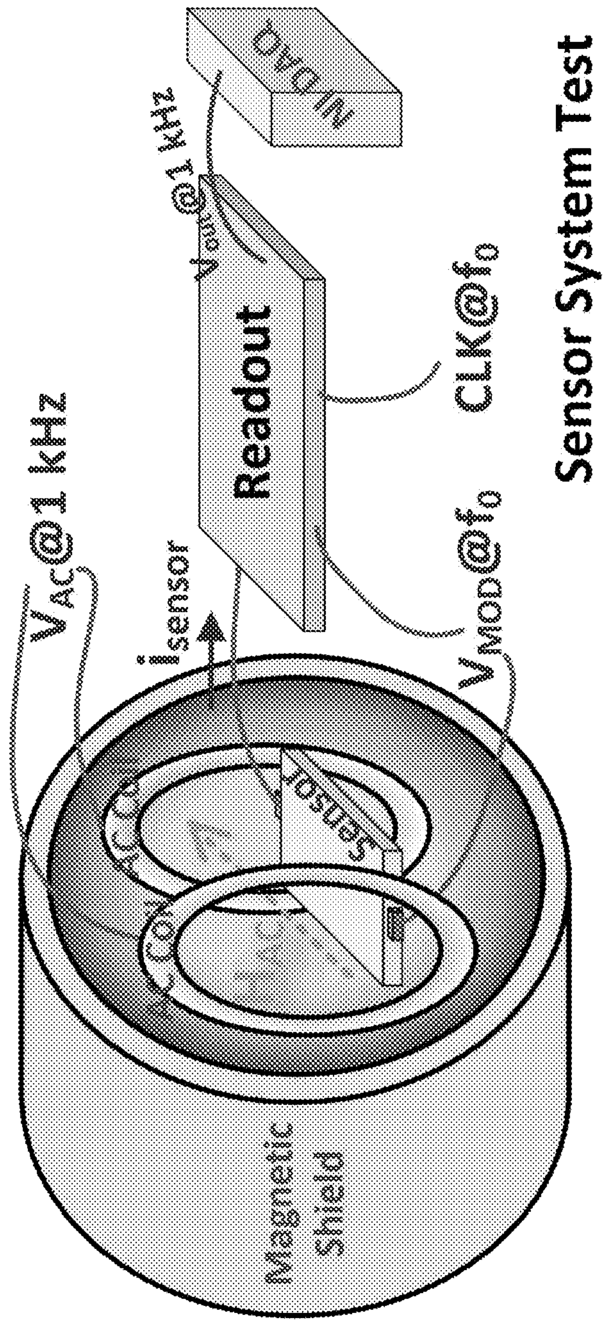
FIG. 47: In lab testing setup of the sensor-readout system.
Figure 48:
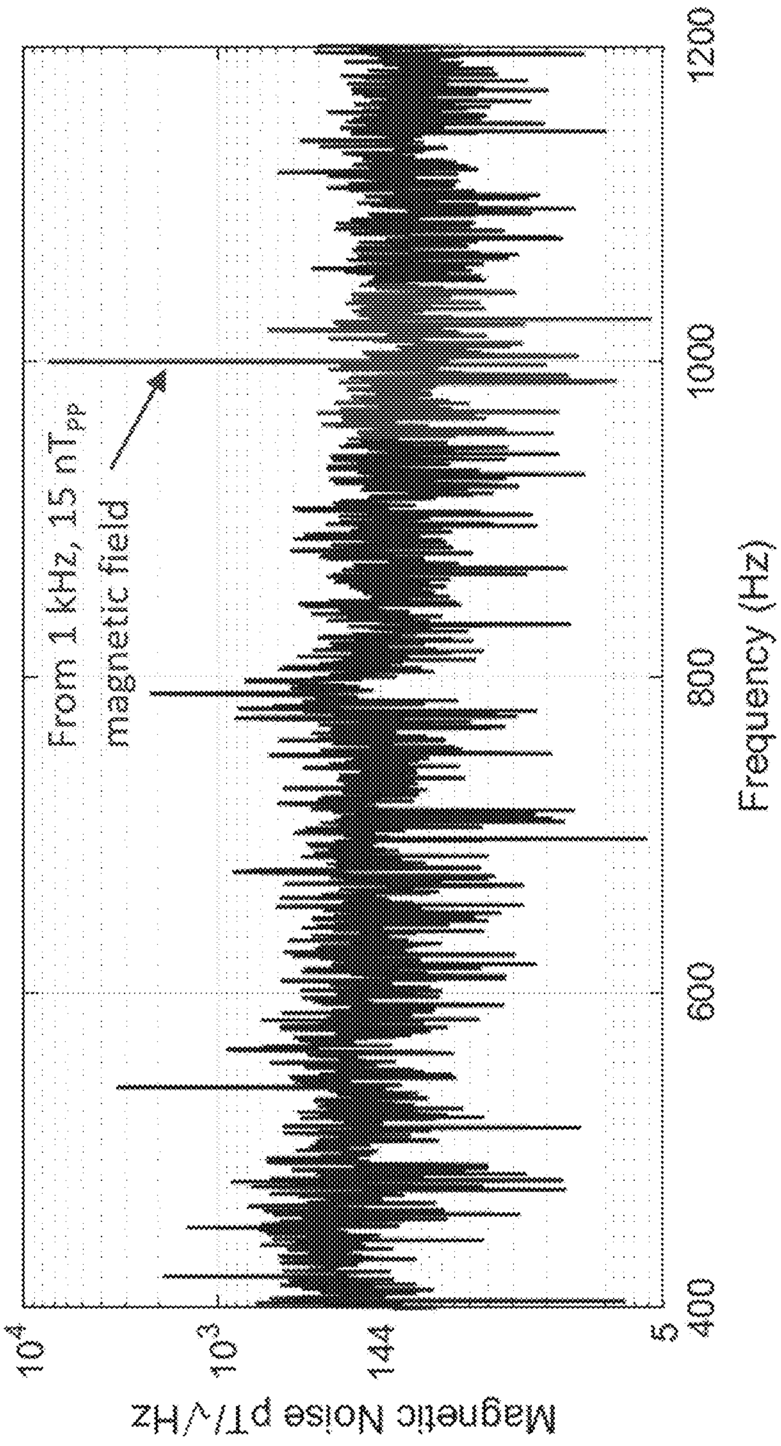
FIG. 48: Sensor system's noise performance measurement result referred at input.

FIG. 47 schematically depicts the sensor system measurement setup. A sensor with $f_0$ of 7.4 MHz and $R_X$ of 3.5 kΩ is chosen. A small flux concentrator is utilized to enhance the sensitivity [11]. The sensor is put in a three-layer MuMetal magnetic shield to reduce the environmental noise. An AC coil provides a magnetic field at 1 kHz of 15 $nT_{pp}$. There is a phase shift due to parasitic capacitance and $V_{MOD}$ is not always precisely at the resonant frequency of the sensor where the phase shift through the resonator is exactly 180°. Thus, the phase between the demodulation clock and $V_{MOD}$ is manually tuned to maximize the demodulation gain. The sensor and the ASIC are connected with SMA headers and an SMA cable. The output of the readout circuit is connected to the NI DAQ. By optimizing the gate voltage of the canceller, with a modulation amplitude of 220 $mV_{pp}$, the sensor system achieves a resolution of 144 pT/√Hz at 1 kHz as shown in FIG. 48 and a sensitivity of $2.1\times10^5$ V/T.

VI. Conclusion

This paper presents the integration of a strain modulated multiferroic bio-magnetic sensor with a low-power ASIC with the demodulator first architecture to achieve a noise spectral density of 144 pT/√Hz at 1 kHz, a bandwidth of 2.2 kHz and a power consumption of 5.9 mW. The accessible magnetic field bandwidth reaches as low as 76 mHz. The ASIC realizes the demodulation and the amplification of the current produced by the sensor device. A modulation noise canceller is implemented to reduce the noise from the modulation drive voltage and improve the magnetic noise spectral density. With the ASIC readout implementation, the projected package volume is 0.125 $cm^3$ including the permanent magnets to produce the DC magnetic field for the sensor device and the flux concentrator to improve the sensitivity of the sensor device. A comparison of the sensor in this work with other magnetic sensors in terms of noise spectral density, bandwidth, sensor volume and the power consumption is listed in Table I. The presented sensor-readout system has small volume, low power consumption, and adequate bandwidth and resolution. Future improvements to the flicker noise of the ASIC, a feedback network to automatically set the phase between the modulation and the demodulation, the sensor materials, device structure and flux concentrators are predicted to further reduce the magnetic noise spectral density which outlines an excellent solution for the low-power, low-noise, wearable, on-body sensing application.

TABLE I

COMPARISON OF MAGNETIC FIELD SENSORS

| | Noise Spectral Density (pT/√Hz) | Bandwidth (kHz) | Sensor Volume ($cm^3$) | Power (mW) |
|---|---|---|---|---|
| Commercially available sensors: | | | | |
| Magneto-inductive [24] | 1200 | 0.8 | 0.03 | >0.210 |
| Hall [25] | 130,000 | 17 | 0.01 | 34 |
| SERF [5] | $1\times10^{-2}$ at 3-100 Hz | 0.1 | 5 | 5000 |
| Flux Gate [6] | 1500 | 47 | 0.16 | 19.8 |
| State-of-the-art research sensors: | | | | |
| Non-modulated ME [7] | 0.25 at 958 Hz | 0.004 | 0.18 | Not reported |
| | 4000 at 0.1 Hz | 1.0 | 4 | Not reported |
| Magnetically modulated ME [8] | 200 at 100 Hz | | | |
| Delta-E effect sensor [26] | 140 at 20 Hz | 0.03 | 0.03 | Not reported |
| Piezo-modulated ME [27] | 5000 at 2 Hz | 0.1 | 0.02 | Not reported |
| Piezo-modulated ME [9] | 20 at 10 Hz | 6.2 | 0.61 | Not reported |
| Piezo-modulated ME (PCB) [11] | 98.5 at 1 kHz | 3.4 | 0.125[a] | 440 |
| This work (ASIC) | 144 at 1 kHz | 2.2 | 0.125[a] | 5.9 |

[a]Sensor with integrated DC magnetic bias circuitry

REFERENCES

[1] A. S. and M. W. S. and N. N. G. Dey Nilanjan and Ashour, "Biomedical Signals," in *Acoustic Sensors for Biomedical Applications*, Cham: Springer International Publishing, 2019, pp. 7-20. doi: 10.1007/978-3-319-92225-6_2.

[2] S. Zuo, H. Heidari, D. Farina, and K. Nazarpour, "Miniaturized Magnetic Sensors for Implantable Magnetomyography," *Adv Mater Technol*, vol. 5, no. 6, p. 2000185, 2020, doi: https://doi.org/10.1002/admt.202000185.

[3] E. Elzenheimer, H. Laufs, T. Sander-Thammes, and G. Schmidt, "Usability of Magnetoelectric (ME) Sensors for Magnetic Measurements of Peripheral Arm Nerves," *Current Directions in Biomedical Engineering*, vol. 4, no. 1, pp. 363-366, 2018, doi: doi:10.1515/cdbme-2018-0087.

[4] K. Sternickel and A. I. Braginski, "Biomagnetism using SQUIDs: status and perspectives," *Supercond Sci Technol*, vol. 19, no. 3, p. S160, February 2006, doi: 10.1088/0953-2048/19/3/024.
[5] "QuSpin. Inc.," http://www.quspin.com.
[6] Texas Instruments, "DRV425 Fluxgate Magnetic-Field Sensor." Dallas, TX, USA, March 2020.
[7] S. Salzer et al., "Tuning fork for noise suppression in magnetoelectric sensors," *Sens Actuators A Phys*, vol. 237, pp. 91-95, 2016, doi: https://doi.org/10.1016/j.sna.2015.10.040.
[8] X. Zhuang et al., "Evaluation of Applied Axial Field Modulation Technique on ME Sensor Input Equivalent Magnetic Noise Rejection," *IEEE Sens J*, vol. 11, no. 10, pp. 2266-2272, 2011, doi: 10.1109/JSEN.2011.2131647.
[9] E. Elzenheimer et al., "Investigation of Converse Magnetoelectric Thin-Film Sensors for Magnetocardiography," *IEEE Sens J*, vol. 23, no. 6, pp. 5660-5669, 2023, doi: 10.1109/JSEN.2023.3237910.
[10] M. D'Agati et al., "High-Q Factor, Multiferroic Resonant Magnetic Field Sensors and Limits on Strain Modulated Sensing Performance," *Journal of Microelectromechanical Systems,* 2022.
[11] Y. Huo et al., "Low Noise, Strain Modulated, Multiferroic Magnetic Field Sensor Systems," *IEEE Sens J*, p. 1, 2023, doi: 10.1109/JSEN.2023.3279229.
[12] E. Culurciello, H. Montanaro, and D. Kim, "Ultralow Current Measurements With Silicon-on-Sapphire Integrator Circuits," *IEEE Electron Device Letters*, vol. 30, no. 3, pp. 258-260, 2009, doi: 10.1109/LED.2008.2010564.
[13] B. Goldstein, D. Kim, J. Xu, T. K. Vanderlick, and E. Culurciello, "CMOS Low Current Measurement System for Biomedical Applications," *IEEE Trans Biomed Circuits Syst*, vol. 6, no. 2, pp. 111-119, 2012, doi: 10.1109/TBCAS.2011.2182512.
[14] M. Bennati et al., "20.5 A Sub-pA ΔΣ Current Amplifier for Single-Molecule Nanosensors," in 2009 *IEEE International Solid-State Circuits Conference—Digest of Technical Papers,* 2009, pp. 348-349, 349a. doi: 10.1109/ISSCC.2009.4977451.
[15] J. Zhang, N. Trombly, and A. Mason, "A low noise readout circuit for integrated electrochemical biosensor arrays," in *SENSORS,* 2004 *IEEE,* 2004, pp. 36-39 vol. 1. doi: 10.1109/ICSENS.2004.1426093.
[16] J Vrba and S E Robinson, "SQUID sensor array configurations for magnetoencephalography applications," *Supercond Sci Technol*, vol. 15, no. 9, p. R51, 2002, doi: 10.1088/0953-2048/15/9/201.
[17] D. Cohen and E. Givler, "Magnetomyography: magnetic fields around the human body produced by skeletal muscles," *Appl Phys Lett*, vol. 21, no. 3, pp. 114-116, October 2003, doi: 10.1063/1.1654294.
[18] Y. Uchikawa and M. Kotani, "Measurement of Magnetic Field Produced from the Human Body," *IEEE Translation Journal on Magnetics in Japan*, vol. 7, no. 8, pp. 600-607, 1992, doi: 10.1109/TJMJ.1992.4565462.
[19] E. Elzenheimer, H. Laufs, W. Schulte-Mattler, and G. Schmidt, "Magnetic Measurement of Electrically Evoked Muscle Responses With Optically Pumped Magnetometers," *IEEE Transactions on Neural Systems and Rehabilitation Engineering*, vol. 28, no. 3, pp. 756-765, 2020, doi: 10.1109/TNSRE.2020.2968148.
[20] M. Pannetier-Lecoeur, L. Parkkonen, N. Sergeeva-Chollet, H. Polovy, C. Fermon, and C. Fowley, "Magnetocardiography with sensors based on giant magnetoresistance," *Appl Phys Lett*, vol. 98, no. 15, p. 153705, April 2011, doi: 10.1063/1.3575591.
[21] C. Andrews and A. C. Molnar, "Implications of Passive Mixer Transparency for Impedance Matching and Noise Figure in Passive Mixer-First Receivers," *IEEE Transactions on Circuits and Systems I: Regular Papers*, vol. 57, no. 12, pp. 3092-3103, 2010, doi: 10.1109/TCSI.2010.2052513.
[22] G. Ferrari, F. Gozzini, A. Molari, and M. Sampietro, "Transimpedance Amplifier for High Sensitivity Current Measurements on Nanodevices," *IEEE J Solid-State Circuits*, vol. 44, no. 5, pp. 1609-1616, 2009, doi: 10.1109/JSSC.2009.2016998.
[23] R. H. Olsson, D. L. Buhl, A. M. Sirota, G. Buzsaki, and K. D. Wise, "Band-tunable and multiplexed integrated circuits for simultaneous recording and stimulation with microelectrode arrays," *IEEE Trans Biomed Eng*, vol. 52, no. 7, pp. 1303-1311, 2005, doi: 10.1109/TBME.2005.847540.
[24] "PNI Corp.," https://www.pnicorp.com/rm3100/.
[25] "Allegro MicroSystems, Inc.," https://www.allegromicro.com.
[26] S. Zabel, C. Kirchhof, E. Yarar, D. Meyners, E. Quandt, and F. Faupel, "Phase modulated magnetoelectric delta-E effect sensor for sub-nano tesla magnetic fields," *Appl Phys Lett*, vol. 107, no. 15, p. 152402, October 2015, doi: 10.1063/1.4932575.
[27] P. Hayes et al., "Electrically modulated magnetoelectric sensors," *Appl Phys Lett*, vol. 108, no. 18, p. 182902, May 2016, doi: 10.1063/1.4948470.

ASPECTS

The following Aspects are illustrative only and do not limit the scope of the present disclosure or the appended claims. Any part or parts of any one or more Aspects can be combined with any part or parts of any one or more other Aspects.

Aspect 1. A magnetic field sensor component, comprising: a piezoelectric portion; a plate portion comprising (i) a drive electrode superposed over the piezoelectric portion and in mechanical communication with the piezoelectric portion, the drive electrode comprising a magnetostrictive material and (ii) a sense electrode superposed over the piezoelectric portion and in mechanical communication with the piezoelectric portion, the sense electrode comprising a magnetostrictive material; and a tether portion extending from the plate portion, and the magnetostrictive drive electrode being configured to be electrically driven so as to effect a strain modulation of the magnetostrictive drive electrode that upconverts a received magnetic field to a resonance band of the magnetostrictive material of the drive electrode such that a strain of the magnetostrictive material of the drive electrode is converted to a detectable voltage by the piezoelectric portion.

An example embodiment is shown in FIG. 1*a*-1*b* and in FIG. 3, which depict an example component according to the present disclosure. As shown, the magnetostrictive material can have a thickness in the range of, e.g., from about 500 to 1500 nm (e.g., 1000 nm or 1 μm). The magnetostrictive material can overlie an electrically conductive material, e.g., aluminum, which can have a thickness in the range of tens of micrometers or even hundreds of micrometers. A piezoelectric material (AlN, in FIG. 3) can have a thickness in the range of from, e.g., about 500 to about 1500 nm (e.g., 1000 nm or 1 μm). A ground electrode and an underlayer (e.g., FIG. 1*b*) can be present.

Without being bound to any particular theory, the received magnetic field can effect a strain in the magnetostrictive material of the drive electrode. The piezoelectric material (coupled to the piezoelectric material) can in turn convert that strain to a voltage, which voltage can be proportional to the received magnetic field. The voltage can then be detected and related to the strength of the received magnetic field.

The electrodes (Al, in FIG. 3) can be separated by nanometers, tens of nanometers, hundreds of nanometers, or even microns or tens of microns. Likewise, the portions of magnetostrictive material (FeCo, in FIG. 3) can be separated by nanometers, tens of nanometers, hundreds of nanometers, or even microns or tens of microns. As shown, the portions of magnetostrictive material can be present as parallel rectangles, as shown in FIG. 1. Actuating and sensing electrodes (as shown in FIG. 1) can extend outwardly (and perpendicular or at another angle) from the portions of magnetostrictive material.

Aspect 2. The magnetic field sensor component of Aspect 1, wherein the piezoelectric portion comprises AlN. Additional material (e.g., Ti, $SiO_2$) can further underlie the other described layers.

Aspect 3. The magnetic field sensor component of any one of Aspects 1-2, wherein the magnetorestrictive material comprises FeCo.

Aspect 4. The magnetic field sensor component of any one of Aspects 1-3, wherein the magnetic field sensor component defines a Q factor of from about 500 to about 2000.

Aspect 5. The magnetic field sensor component of any one of Aspects 1-4, further comprising a function generator configured to electrically drive the magnetostrictive drive electrode at a within a resonance band of the magnetostrictive drive electrode.

Aspect 6. The magnetic field sensor component of any one of Aspects 1-5, wherein the drive electrode and the sense electrode define rectangular portions of magnetostrictive material.

Aspect 7. The magnetic field sensor component of any one of Aspects 1-6, wherein the plate portion has a non-zero length-to-width aspect ratio.

Aspect 8. The magnetic field sensor component of Aspect 7, wherein the plate portion has a length-to-width aspect ratio of from about 4:1 to about 2:1.

Aspect 9. The magnetic field sensor component of any one of Aspects 1-8, wherein the tether portion has a length of about 100 to about 200 μm.

Aspect 10. The magnetic field sensor component of any one of Aspects 1-9, wherein the plate portion has a length of about λ/2 (i.e., wavelength/2, wherein velocity=wavelength×frequency), wherein the plate portion has a tether portion of about λ/4, or both. An example tether portion is shown in FIG. 1. Without being bound to any particular theory or embodiment, in piezoelectric films, the maximum charge is generated at the point of maximum stress. For the geometry shown in FIG. 1, maximum stress can be designed to be placed at the center of the plate where the tether anchors are present.

Aspect 11. The magnetic field sensor component of any one of Aspects 1-10, wherein the component has a die size of less than about 2.5 $mm^2$.

Aspect 12. The magnetic field sensor component of Aspect 1, further comprising a flux concentrator coupled to a sensor, the sensor comprising the magnetic field sensor component, wherein a first portion of the flux concentrator is located proximate to a first end of the magnetic field sensor component and a second portion of the flux concentrator is located proximate to a second end of the magnetic field sensor component. The flux concentrator can be, e.g., according to the flux concentrators described herein, including the flux concentrators in the attached appendices.

Aspect 13. The flux concentrator of Aspect 12, wherein the flux concentrator is positioned transversely to a direction of voltage flow associated with the drive electrode.

Aspect 14. The magnetic field sensor component of Aspect 1, further comprising a readout circuit configured to determine an electrical signal associated with the received magnetic field, the readout circuit further comprising a modulation noise canceler positioned prior to a trans-impedance amplifier. A component can include a circuit according to the circuits described herein, including the circuits in the attached appendices.

Aspect 15. A method, comprising operating a magnetic field sensor component according to any one of Aspects 1-14.

Aspect. 16. The method of Aspect 15, wherein operating comprises driving the magnetostrictive drive electrode at a resonance of the magnetostrictive drive electrode.

Aspect. 17. The method of any one of Aspects 15-16, wherein the component is operated to detect a received magnetic field having a frequency of less than about 1 kHz, an amplitude of less than about 700 pT, or both.

Aspect 18. The method of Aspect 17, wherein the received magnetic field is a biomagnetic field.

What is claimed:

1. A magnetic field sensor component, comprising:

a piezoelectric portion;

a plate portion comprising (i) a drive electrode superposed over the piezoelectric portion and in mechanical communication with the piezoelectric portion, the drive electrode comprising a magnetostrictive material and (ii) a sense electrode superposed over the piezoelectric portion and in mechanical communication with the piezoelectric portion, the sense electrode comprising a magnetostrictive material; and a tether portion extending from the plate portion, and the drive electrode being configured to be electrically driven so as to effect a strain modulation that upconverts a received magnetic field to a resonance band of the drive electrode.

2. The magnetic field sensor component of claim 1, wherein the piezoelectric portion comprises AlN.

3. The magnetic field sensor component of claim 1, wherein the magnetostrictive material comprises FeCo.

4. The magnetic field sensor component of claim 1, wherein the magnetic field sensor component has a Q factor of from about 500 to about 2000.

5. The magnetic field sensor component of claim 1, further comprising a function generator configured to electrically drive the drive electrode at a within a resonance band of the drive electrode.

6. The magnetic field sensor component of claim 1, wherein the drive electrode and the sense electrode define rectangular portions of magnetostrictive material.

7. The magnetic field sensor component of claim 1, wherein the plate portion has a non-zero length-to-width aspect ratio.

8. The magnetic field sensor component of claim 7, wherein the plate portion has a length-to-width aspect ratio of from about 4:1 to about 2:1.

9. The magnetic field sensor component of claim 1, wherein the tether portion has a length of about 100 to about 200 μm.

10. The magnetic field sensor component of claim 1, wherein the plate portion has a length of about λ/2, wherein the tether has a length of about λ/4, or both.

11. The magnetic field sensor component of claim 1, wherein the component has a die size of less than about 2.5 $mm^2$.

12. The magnetic field sensor component of claim 1, further comprising a flux concentrator, wherein a first portion of the flux concentrator is located proximate to a first end of the magnetic field sensor component and a second portion of the flux concentrator is located proximate to a second end of the magnetic field sensor component.

13. The magnetic field sensor component of claim 12, wherein the flux concentrator is positioned transversely to a direction of voltage flow associated with the drive electrode.

14. The magnetic field sensor component of claim 1, further comprising a readout circuit configured to determine an electrical signal associated with the received magnetic field, the readout circuit further comprising a modulation noise canceler positioned prior to a trans-impedance amplifier.

15. A method, comprising:

applying a sinusoidal drive voltage across a piezoelectric portion of a magnetic field sensor component at a resonant frequency of a magnetostrictive material in the magnetic field sensor component, wherein the magnetic field sensor component comprises:

the piezoelectric portion;

a plate portion comprising (i) a drive electrode superposed over the piezoelectric portion and in mechanical communication with the piezoelectric portion, the drive electrode comprising a magnetostrictive material and (ii) a sense electrode superposed over the piezoelectric portion and in mechanical communication with the piezoelectric portion, the sense electrode comprising a magnetostrictive material; and a tether portion extending from the plate portion;

inducing, via the applied sinusoidal drive voltage, a time-varying mechanical strain in the magnetostrictive material that upconverts a received magnetic field to a resonance band of the drive electrode; and converting the upconverted received magnetic field into an electric signal.

16. The method of claim 15, further comprising driving the drive electrode at a resonance of the drive electrode.

17. The method of claim 15, wherein the magnetic field sensor component is operated to detect a received magnetic field having a frequency of less than about 1 kHz, an amplitude of less than about 700 pT, or both.

18. The method of claim 17, wherein the received magnetic field is a biomagnetic field.

* * * * *